United States Patent
Nakano et al.

(10) Patent No.: US 12,148,798 B2
(45) Date of Patent: Nov. 19, 2024

(54) SIC SEMICONDUCTOR DEVICE

(71) Applicant: ROHM CO., LTD., Kyoto (JP)

(72) Inventors: Yuki Nakano, Kyoto (JP); Kenji Yamamoto, Kyoto (JP); Seigo Mori, Kyoto (JP)

(73) Assignee: ROHM CO., LTD., Kyoto (JP)

(*) Notice: Subject to any disclaimer, the term of this patent is extended or adjusted under 35 U.S.C. 154(b) by 718 days.

(21) Appl. No.: 17/418,651

(22) PCT Filed: May 21, 2020

(86) PCT No.: PCT/JP2020/020097
§ 371 (c)(1),
(2) Date: Jun. 25, 2021

(87) PCT Pub. No.: WO2020/235629
PCT Pub. Date: Nov. 26, 2020

(65) Prior Publication Data
US 2022/0069088 A1 Mar. 3, 2022

(30) Foreign Application Priority Data
May 22, 2019 (JP) .................................. 2019-096289

(51) Int. Cl.
*H01L 29/16* (2006.01)
*H01L 29/06* (2006.01)
(Continued)

(52) U.S. Cl.
CPC ...... *H01L 29/1608* (2013.01); *H01L 29/1095* (2013.01); *H01L 29/41766* (2013.01); *H01L 29/42368* (2013.01)

(58) Field of Classification Search
CPC ............. H01L 29/1608; H01L 29/1095; H01L 29/41766; H01L 29/42368; H01L 29/66068
See application file for complete search history.

(56) References Cited

U.S. PATENT DOCUMENTS

2007/0114567 A1* 5/2007 Matocha ............. H01L 29/7788
257/192
2013/0306983 A1* 11/2013 Nakano ................. H01L 27/088
438/270
(Continued)

FOREIGN PATENT DOCUMENTS

CN 108475677 A 8/2018
JP 2014038988 2/2014
(Continued)

OTHER PUBLICATIONS

International Preliminary Report on Patentability issued for International Patent Application No. PCT/JP2020/020097, Date of mailing: Dec. 2, 2021, 16 pages including English translation.
(Continued)

*Primary Examiner* — Mohsen Ahmadi
(74) *Attorney, Agent, or Firm* — XSENSUS LLP

(57) ABSTRACT

An SiC semiconductor device includes an SiC semiconductor layer of a first conductivity type having a main surface, a source trench formed in the main surface and having a side wall and a bottom wall, a source electrode embedded in the source trench and having a side wall contact portion in contact with a region of the side wall of the source trench at an opening side of the source trench, a body region of a second conductivity type formed in a region of a surface layer portion of the main surface along the source trench, and a source region of the first conductivity type electrically connected to the side wall contact portion of the source electrode in a surface layer portion of the body region.

21 Claims, 40 Drawing Sheets

(51) Int. Cl.
  *H01L 29/08* (2006.01)
  *H01L 29/10* (2006.01)
  *H01L 29/40* (2006.01)
  *H01L 29/417* (2006.01)
  *H01L 29/423* (2006.01)

(56) References Cited

U.S. PATENT DOCUMENTS

| | | | |
|---|---|---|---|
| 2014/0252374 A1* | 9/2014 | Wada | H01L 29/7813 257/77 |
| 2015/0060937 A1 | 3/2015 | Hikasa | |
| 2015/0214355 A1* | 7/2015 | Nakano | H01L 29/7806 257/330 |
| 2015/0349057 A1* | 12/2015 | Nakano | H01L 29/7813 |
| 2016/0020289 A1 | 1/2016 | Nakano et al. | |
| 2017/0040423 A1 | 2/2017 | Inoue et al. | |
| 2018/0114857 A1 | 4/2018 | Okada et al. | |
| 2018/0277667 A1 | 9/2018 | Sekiguchi et al. | |
| 2018/0286971 A1 | 10/2018 | Philippou et al. | |
| 2018/0308975 A1* | 10/2018 | Ohse | H01L 29/1608 |
| 2019/0355828 A1* | 11/2019 | Yamamoto | H01L 29/4236 |
| 2020/0083368 A1* | 3/2020 | Kobayashi | H01L 29/7806 |
| 2020/0098910 A1 | 3/2020 | Nakagawa et al. | |

FOREIGN PATENT DOCUMENTS

| | | |
|---|---|---|
| JP | 2014175314 | 9/2014 |
| JP | 2017010975 | 1/2017 |
| JP | 2018160594 | 10/2018 |
| JP | 2018182313 | 11/2018 |
| JP | 2019050412 | 3/2019 |
| WO | 2011/048800 A1 | 4/2011 |
| WO | 2016006263 | 1/2016 |
| WO | 2016006696 | 1/2016 |
| WO | 2016175152 | 11/2016 |
| WO | 2017126472 | 7/2017 |

OTHER PUBLICATIONS

Notice of Reasons for Refusal issued for Japanese Patent Application No. 2021-520842, Dispatch Date: Jun. 9, 2022, 11 pages including English translation.

Office Action issued for Chinese Patent Application No. 202080021447.0, dated May 23, 2023, 10 pages including partial English machine translation.

International Search Report and Written Opinion issued for International Patent Application No. PCT/JP2020/020097, Date of mailing: Jul. 28, 2020, 13 pages including English translation of Search Report.

Office Action issued on Dec. 7, 2023, in corresponding Japanese patent Application No. 2022-165006, 11 pages.

* cited by examiner

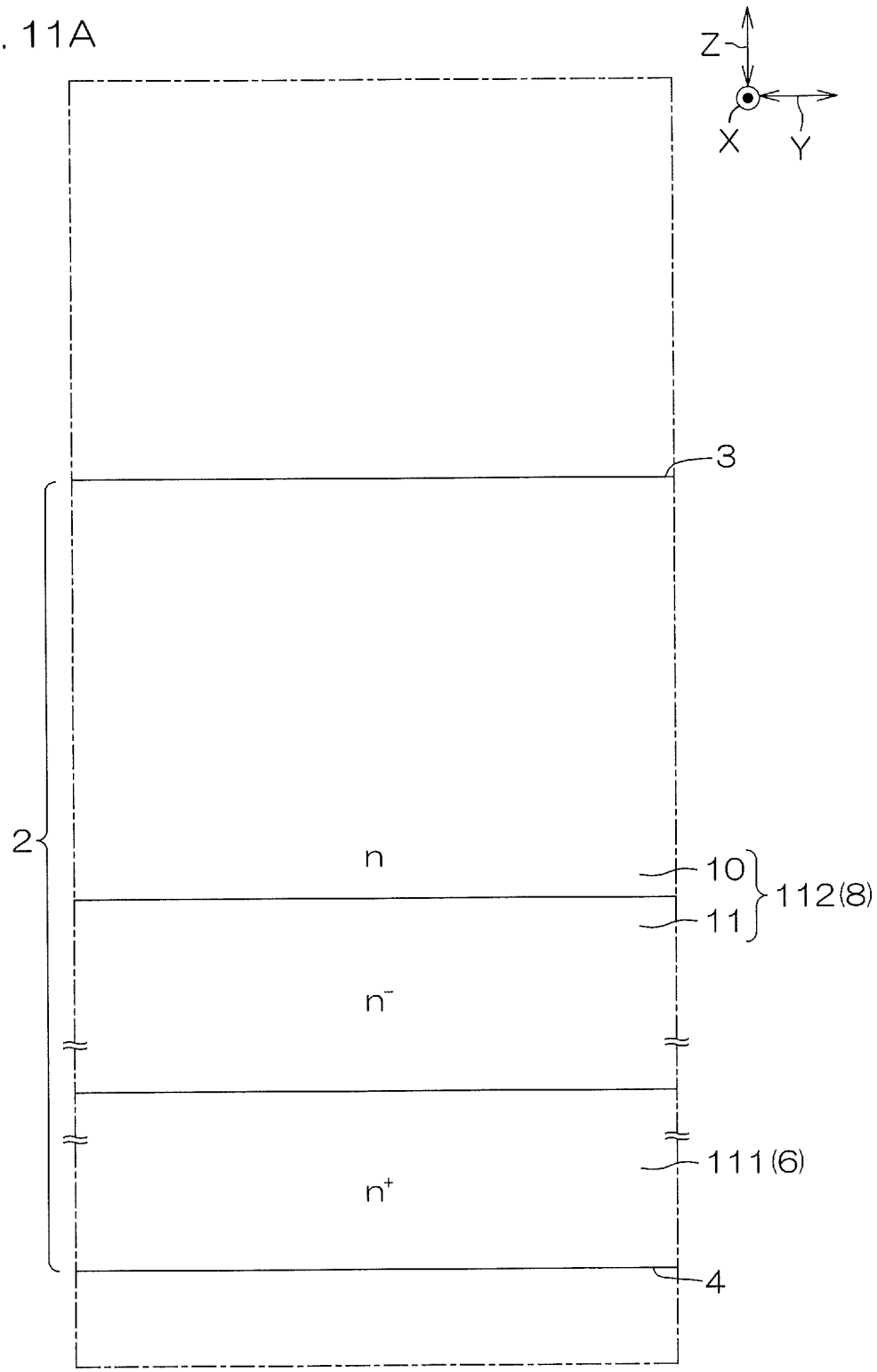

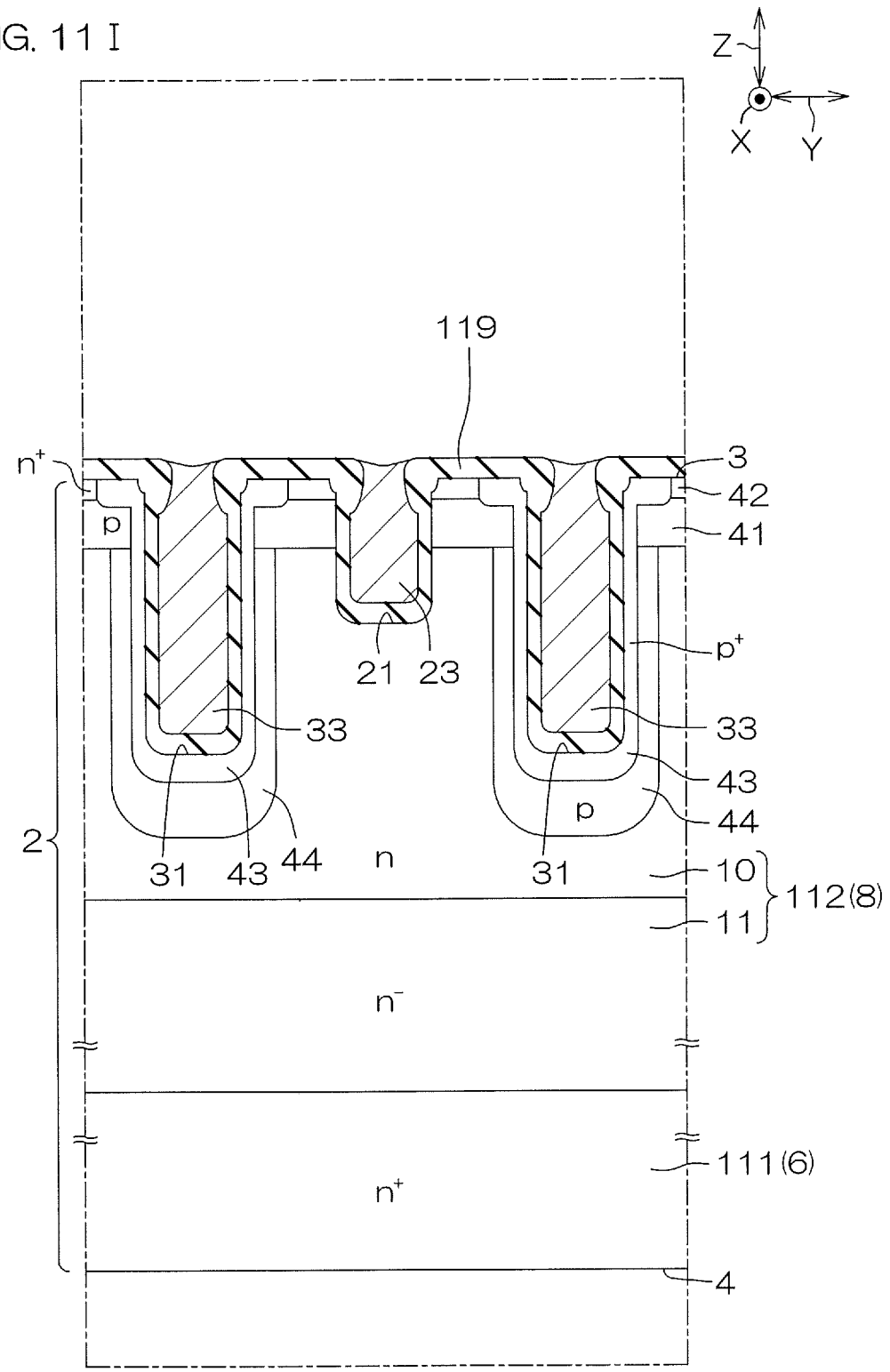

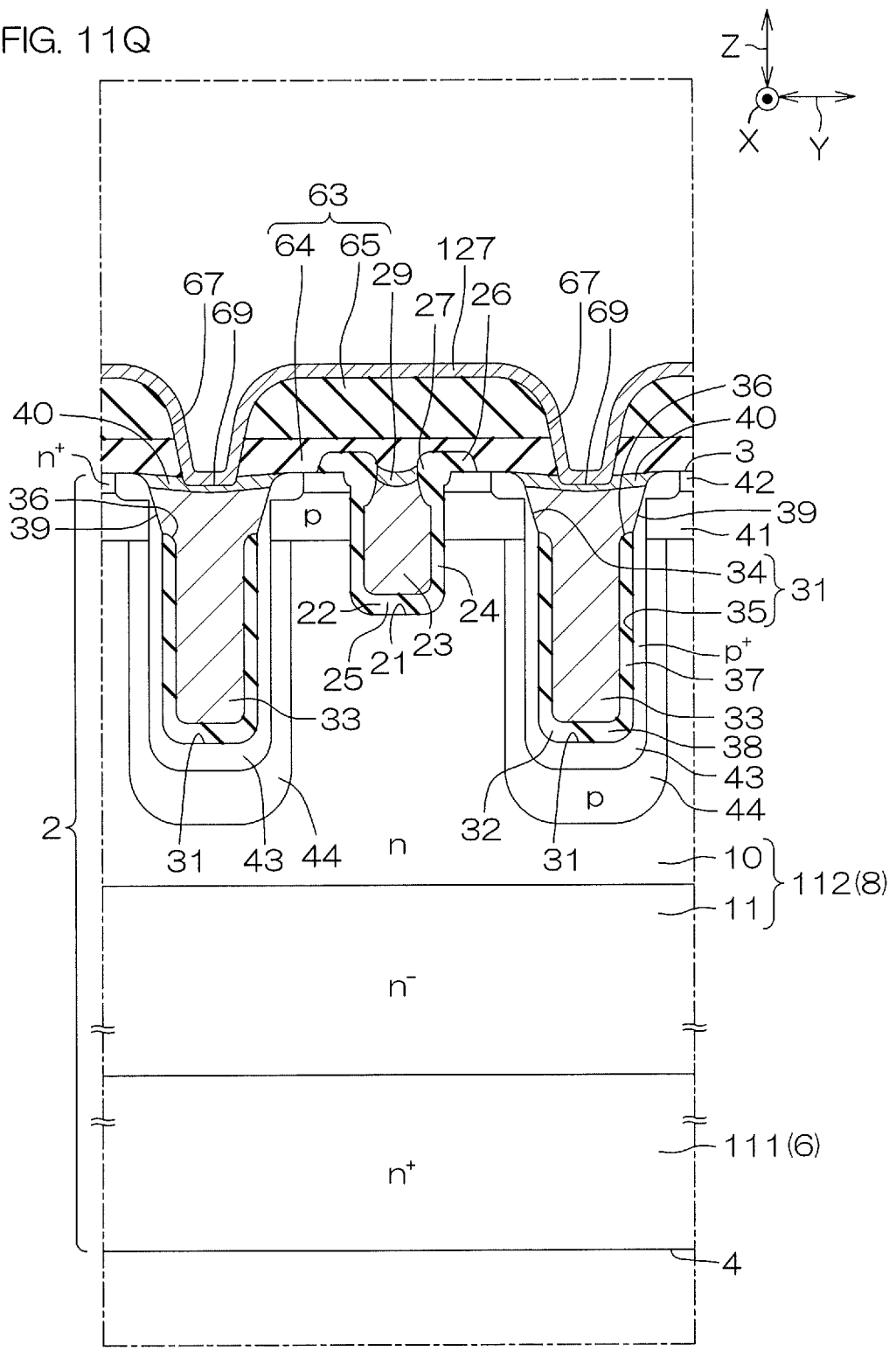

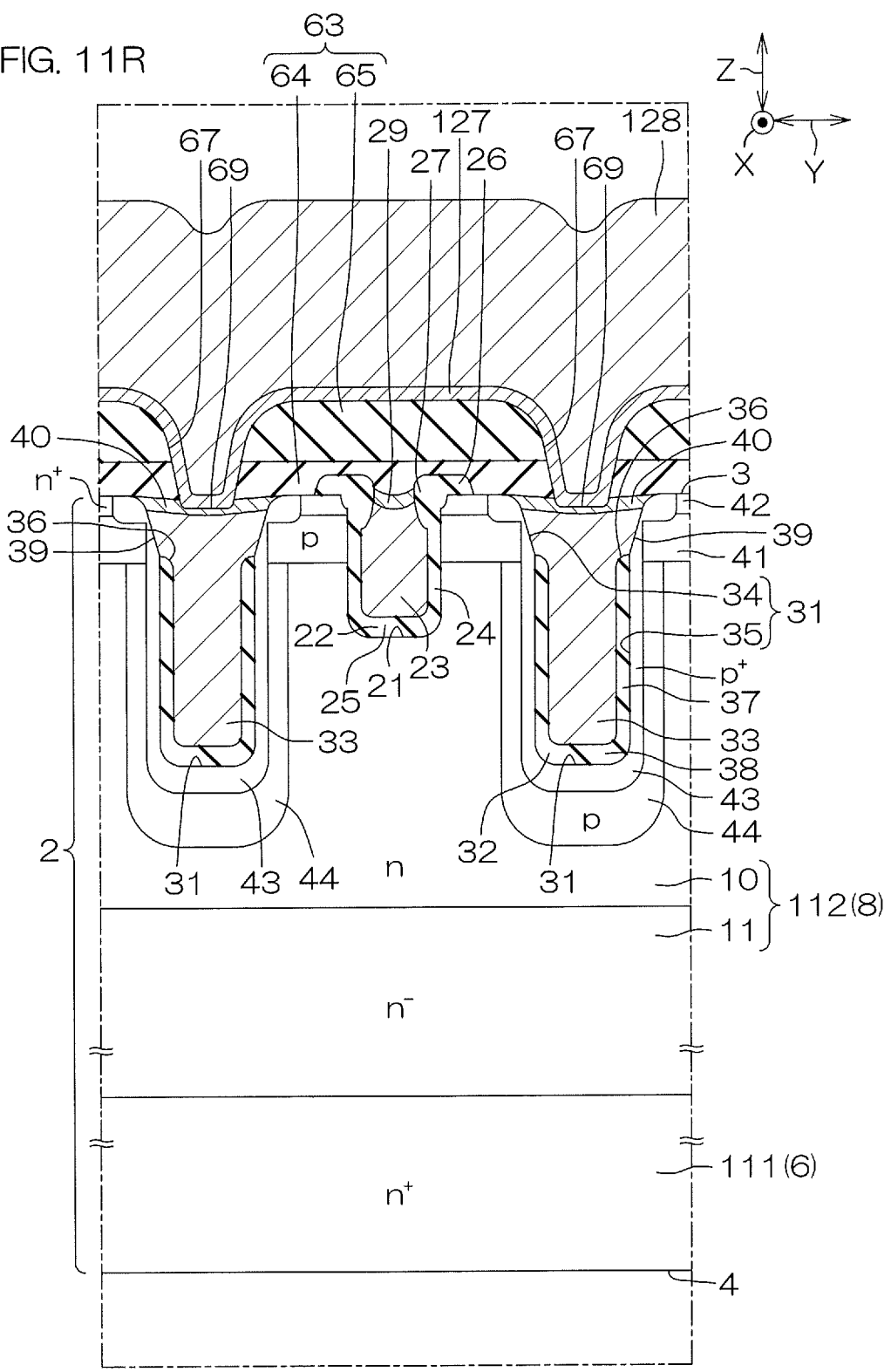

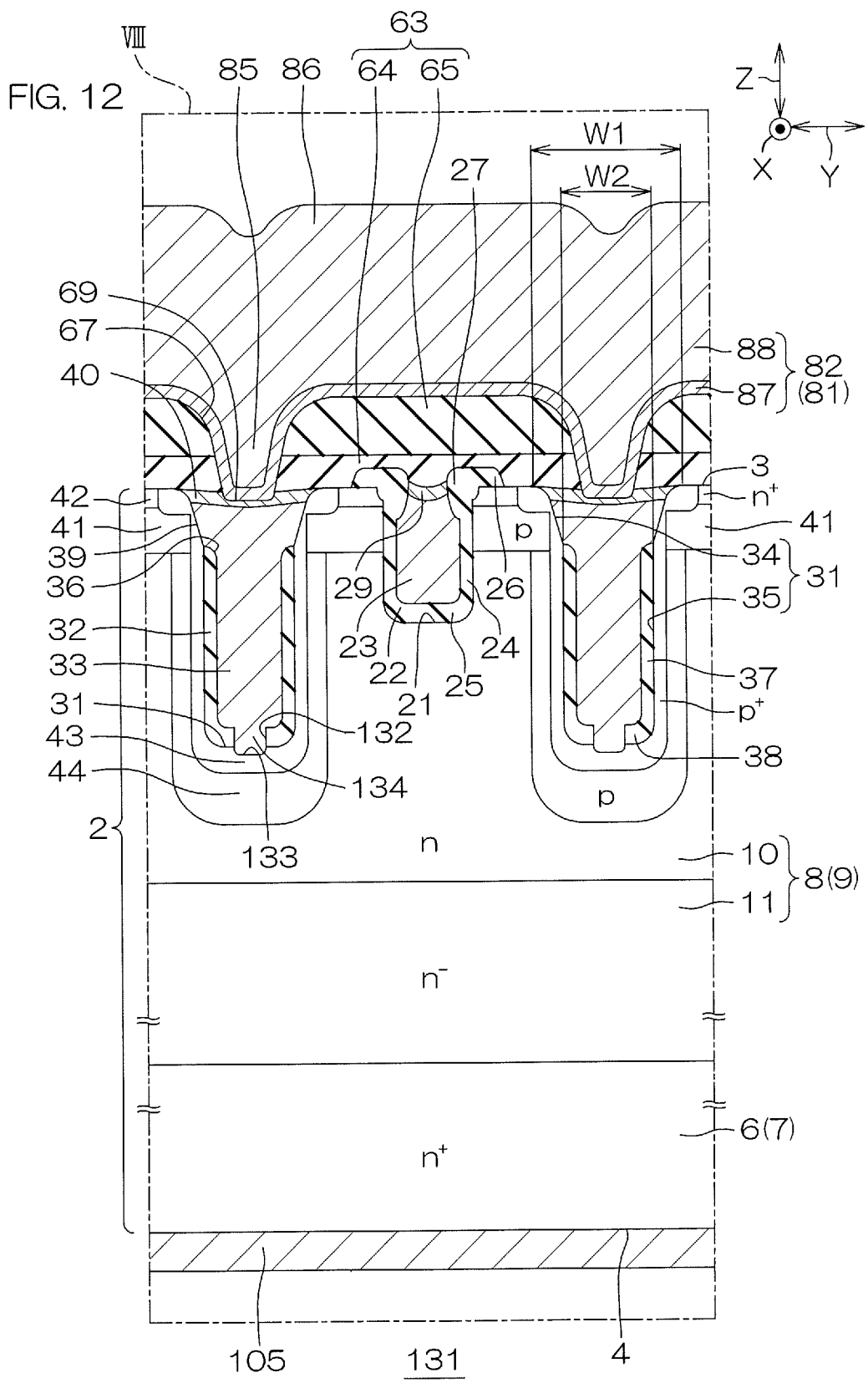

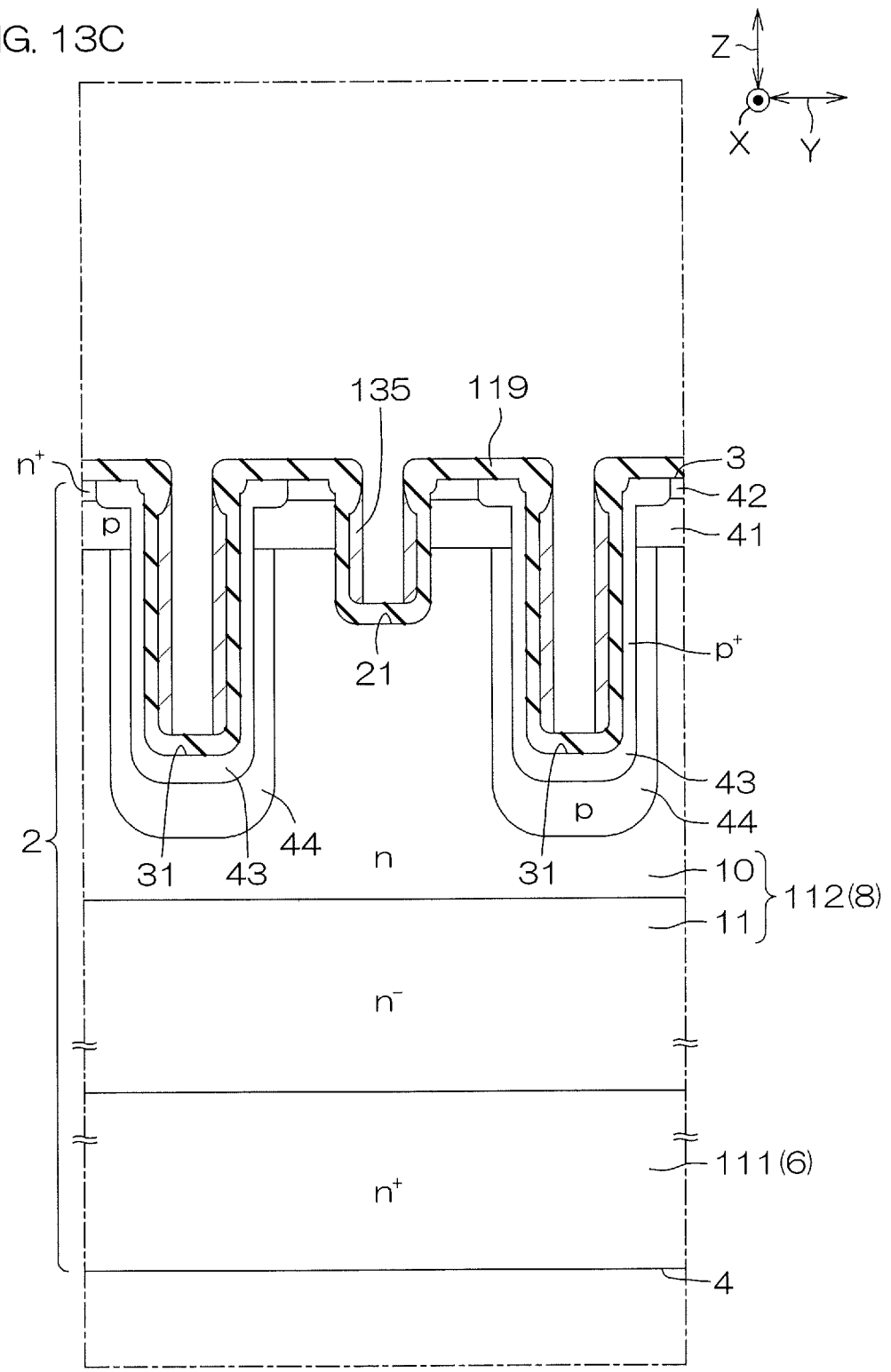

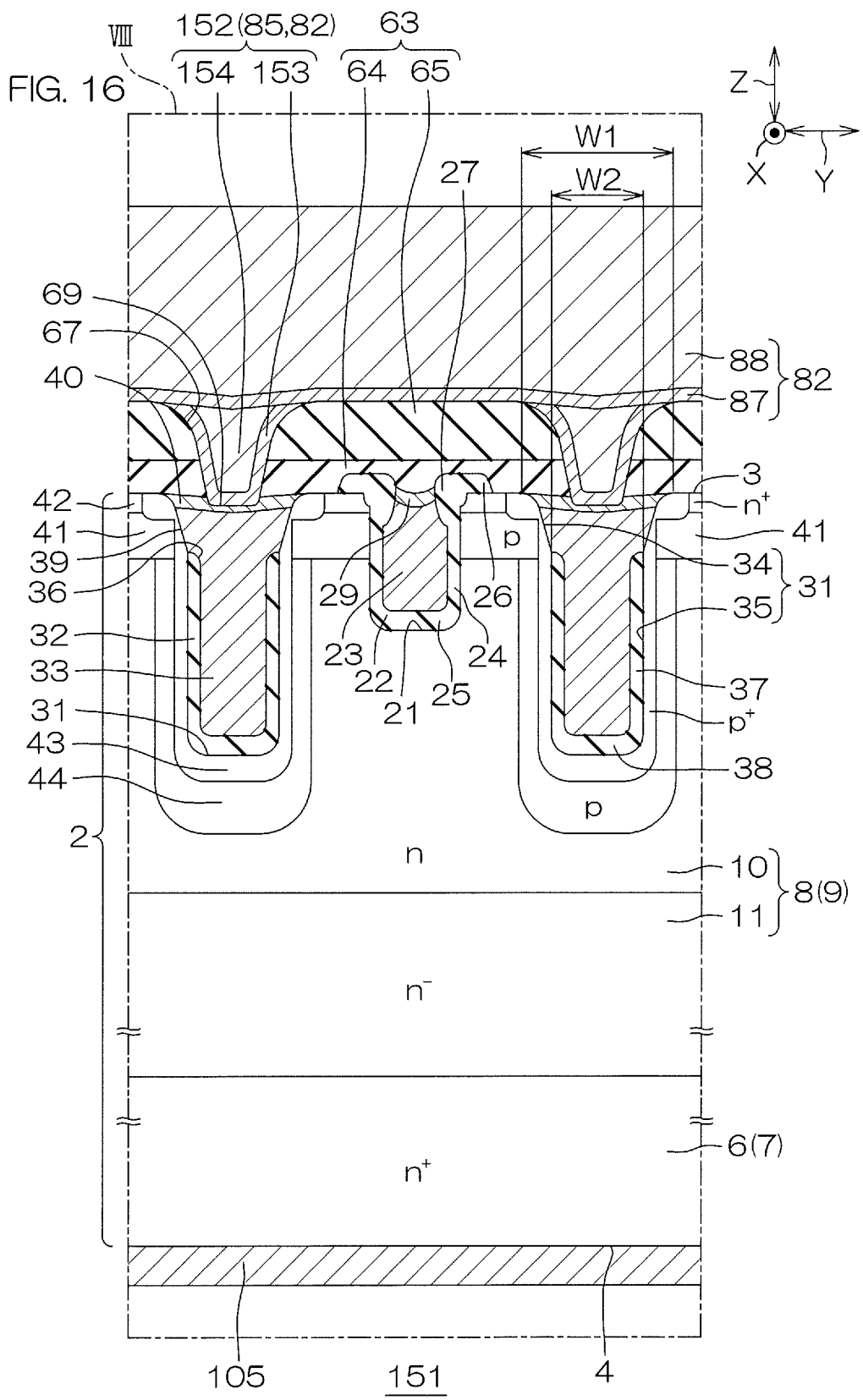

SIC SEMICONDUCTOR DEVICE

TECHNICAL FIELD

The present invention relates to an SiC semiconductor device that includes a source trench.

BACKGROUND ART

Patent Literature 1 discloses an SiC semiconductor device including an SiC semiconductor substrate, a source trench, a source insulating layer, a source electrode, a body region, and a source region. The source trench is formed in a main surface of the SiC semiconductor substrate. The source insulating layer is formed on an inner wall of the source trench. The source electrode is embedded in the source trench across the source insulating layer. The body region opposes the source electrode across the source insulating layer in a surface layer portion of the main surface of the SiC semiconductor substrate. The source region opposes the source electrode across the source insulating layer in a surface layer portion of the body region.

CITATION LIST

Patent Literature

Patent Literature 1: WO 2016/006696 A1

SUMMARY OF INVENTION

Technical Problem

A preferred embodiment of the present invention provides an SiC semiconductor device with which a source region can be source-grounded appropriately in a structure that includes a source trench.

Solution to Problem

A preferred embodiment of the present invention provides an SiC semiconductor device including an SiC semiconductor layer of a first conductivity type having a main surface, a source trench formed in the main surface and having a side wall and a bottom wall, a source electrode embedded in the source trench and having a side wall contact portion in contact with a region of the side wall of the source trench at an opening side of the source trench, a body region of a second conductivity type formed in a region of a surface layer portion of the main surface along the source trench, and a source region of the first conductivity type electrically connected to the side wall contact portion of the source electrode in a surface layer portion of the body region.

According to this SiC semiconductor device, the source region is electrically connected to source electrode exposed from the side wall of the source trench. The SiC semiconductor device with which the source region can be source-grounded appropriately can thereby be provided.

The aforementioned as well as yet other objects, features, and effects of the present invention will be made clear by the following description of the preferred embodiments, with reference to the accompanying drawings.

BRIEF DESCRIPTION OF DRAWINGS

FIG. 11A is an enlarged sectional view of an example of a method for manufacturing the SiC semiconductor device shown in FIG. 1.

FIG. 11I is an enlarged sectional view of a step after FIG. 11H.

FIG. 11Q is an enlarged sectional view of a step after FIG. 11P.

FIG. 11R is an enlarged sectional view of a step after FIG. 11Q.

FIG. 12 is an enlarged view of a region corresponding to FIG. 8 and is a diagram partially showing an SiC semiconductor device according to a second preferred embodiment of the present invention.

FIG. 13C is an enlarged sectional view of a step after FIG. 13B.

FIG. 16 is an enlarged view of a region corresponding to FIG. 8 and is a diagram partially showing an SiC semiconductor device according to a fourth preferred embodiment of the present invention.

DESCRIPTION OF EMBODIMENTS

Figure 1:
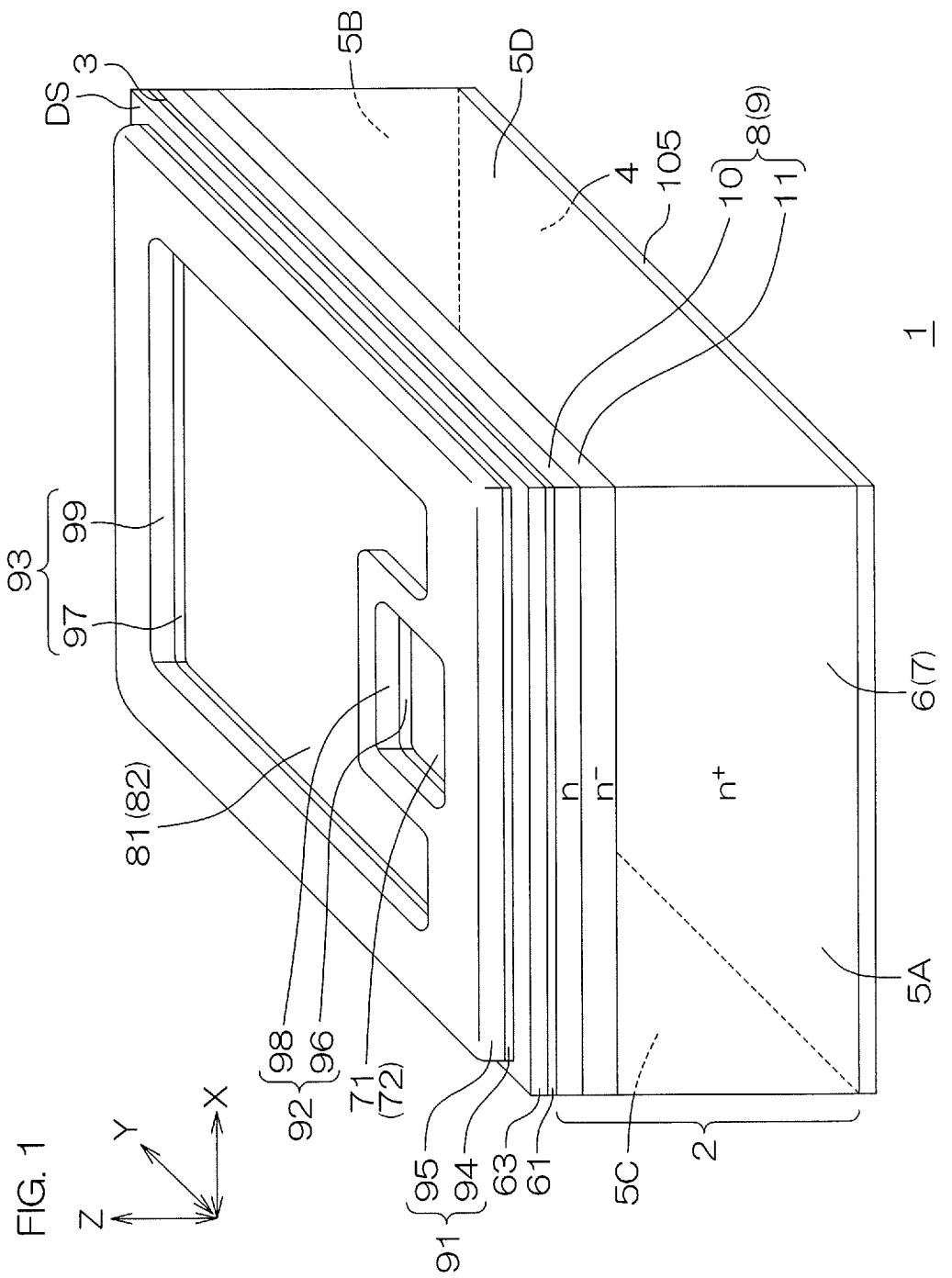
FIG. 1 is a perspective view of an SiC semiconductor device according to a first preferred embodiment of the present invention.
Figure 2:
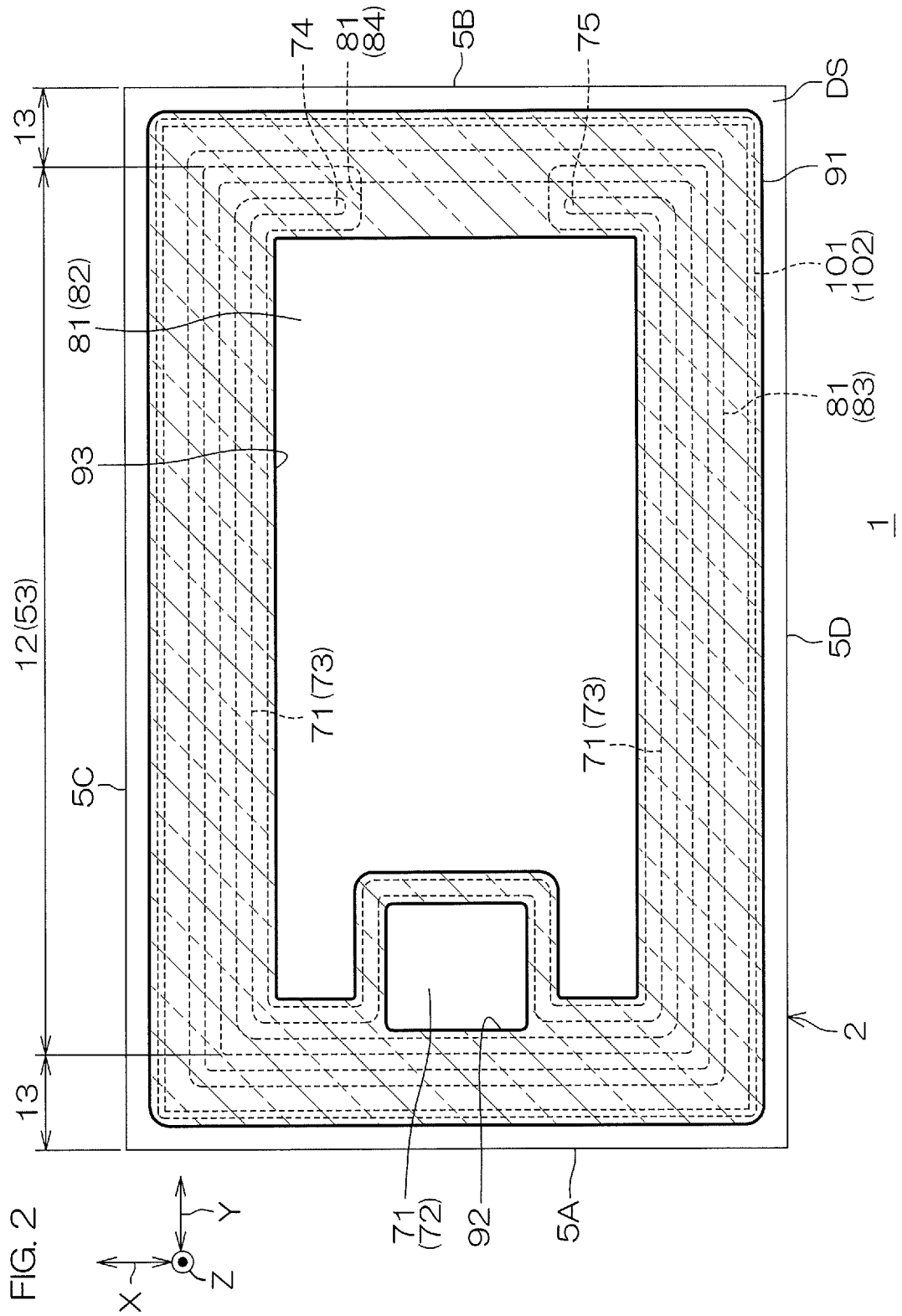
FIG. 2 is a plan view of the SiC semiconductor device shown in FIG. 1.
Figure 3:
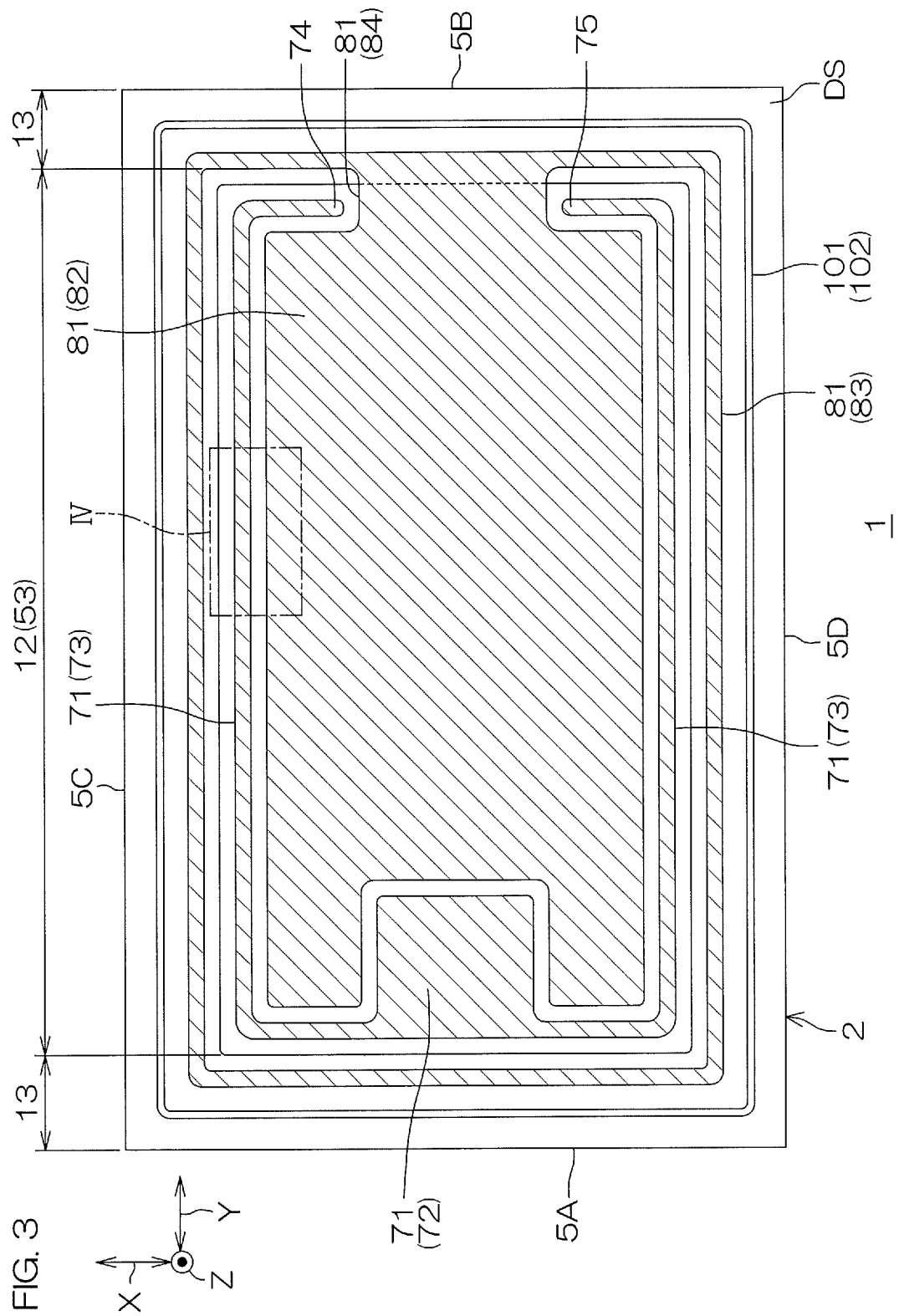
FIG. 3 is a plan view with which structures above first main surface electrodes have been removed from the structure shown in FIG. 2.
Figure 4:
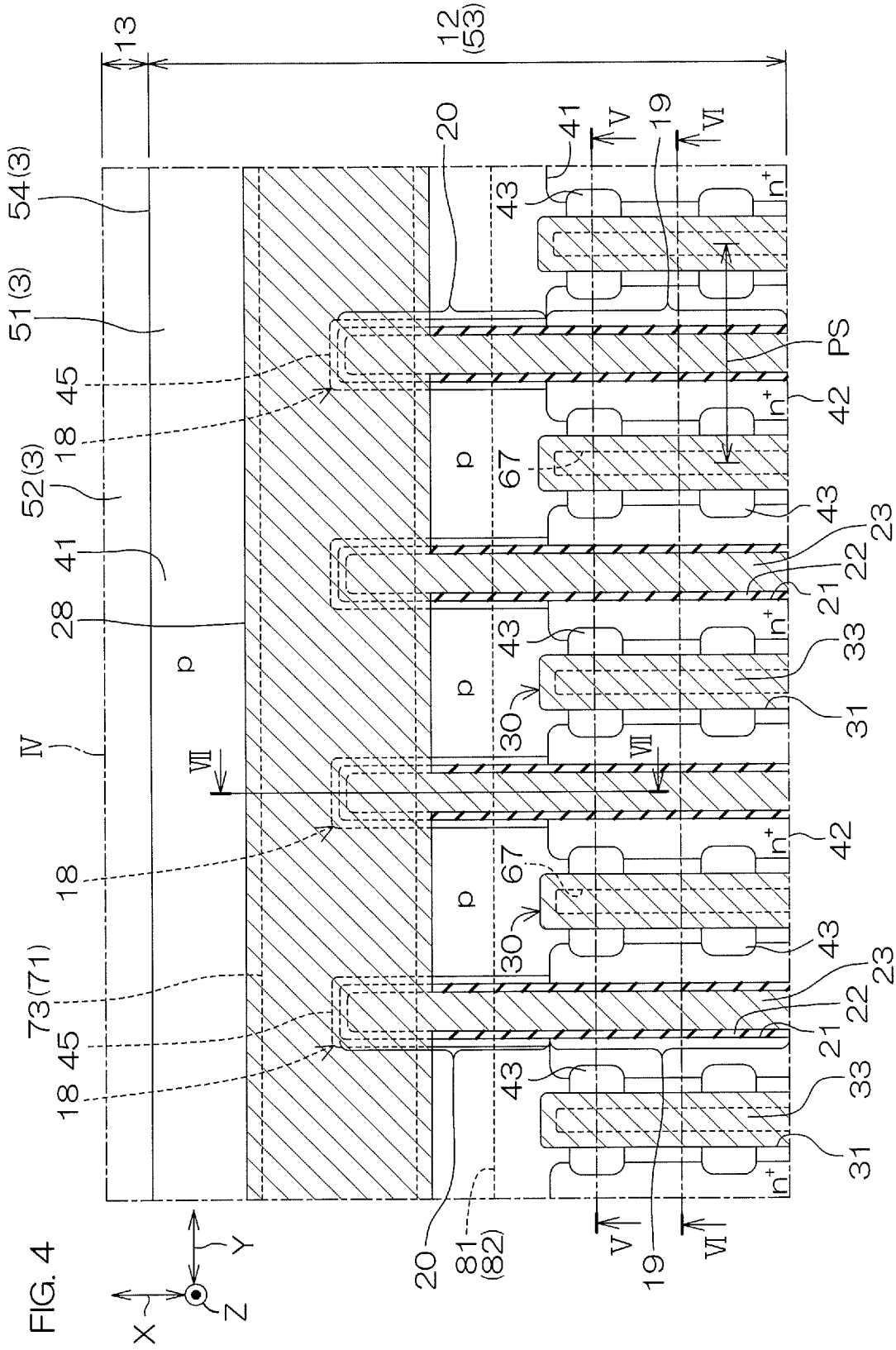
FIG. 4 is an enlarged plan view of an internal structure of a region IV shown in FIG. 3.
Figure 5:
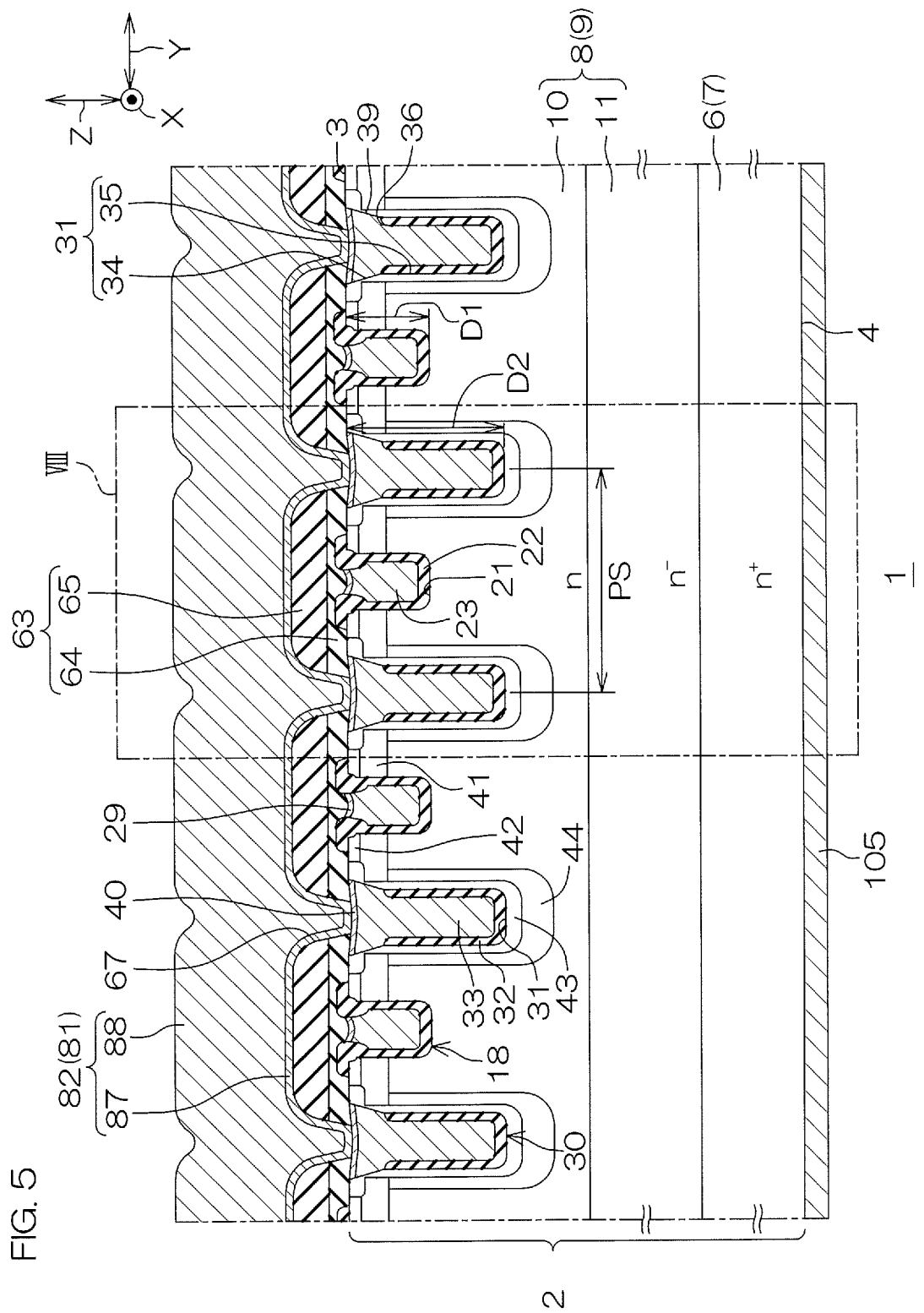
FIG. 5 is a sectional view taken along line V-V shown in FIG. 4.
Figure 6:
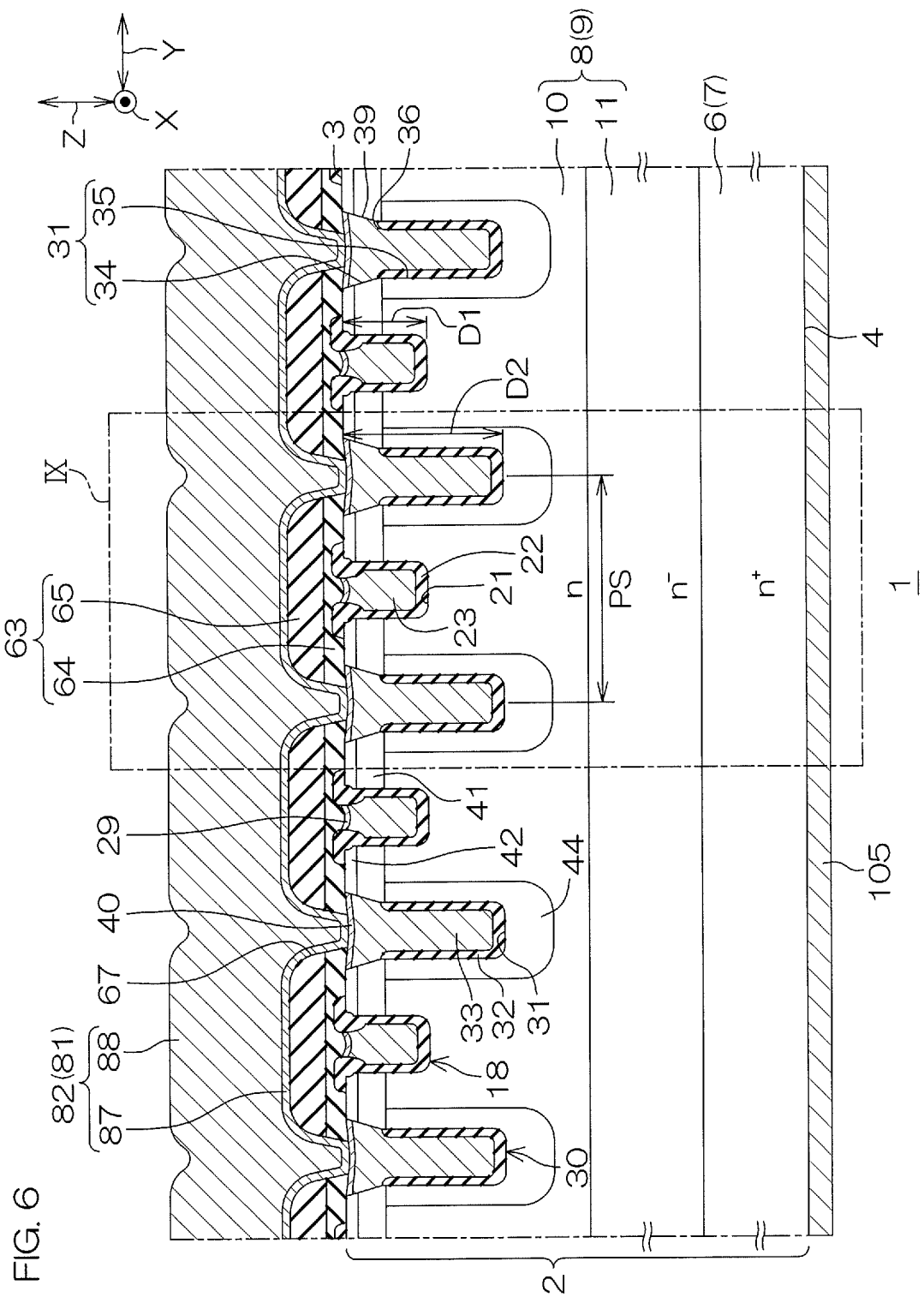
FIG. 6 is a sectional view taken along line VI-VI shown in FIG. 4.
Figure 7:
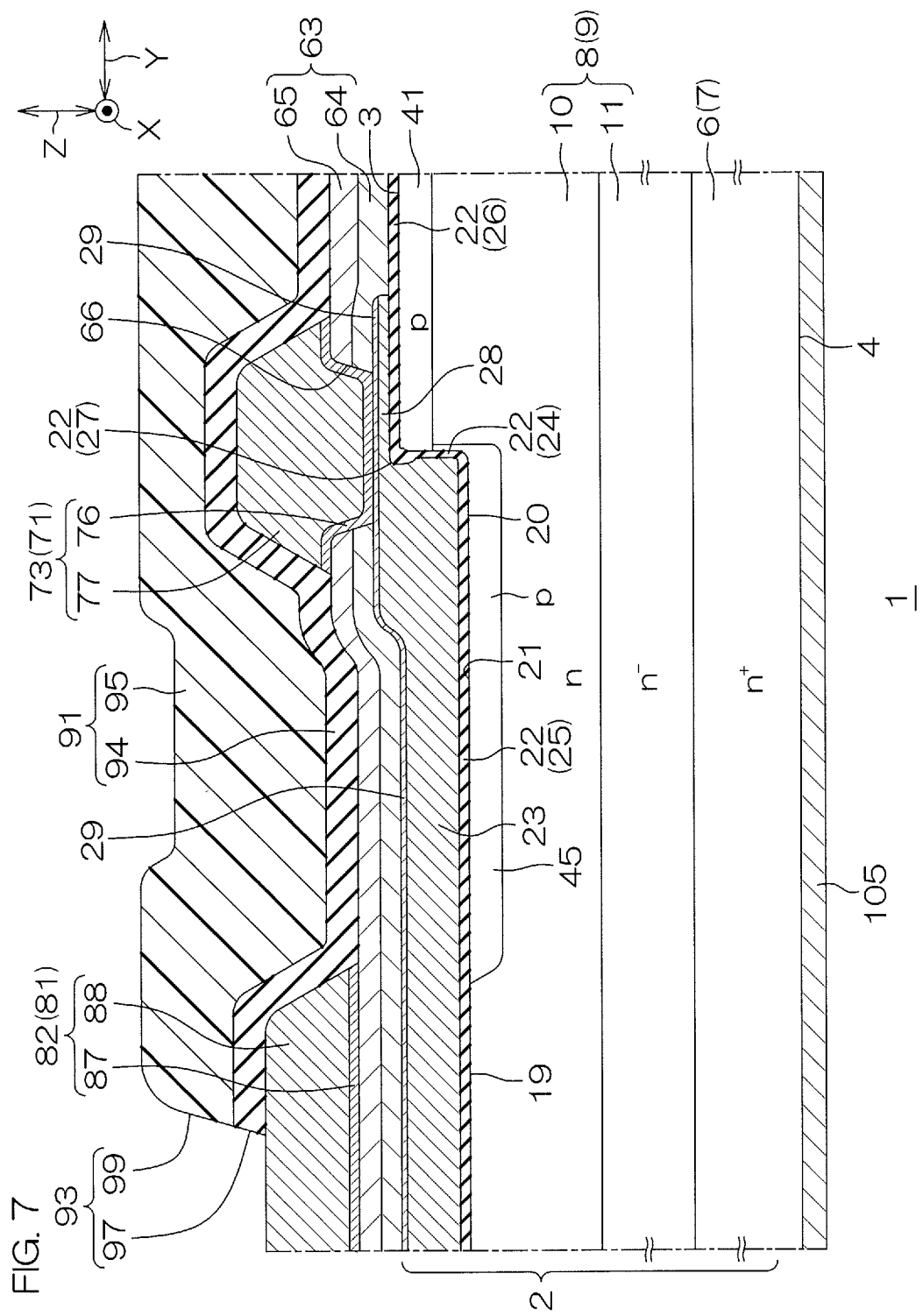
FIG. 7 is a sectional view taken along line VII-VII shown in FIG. 4.
Figure 8:
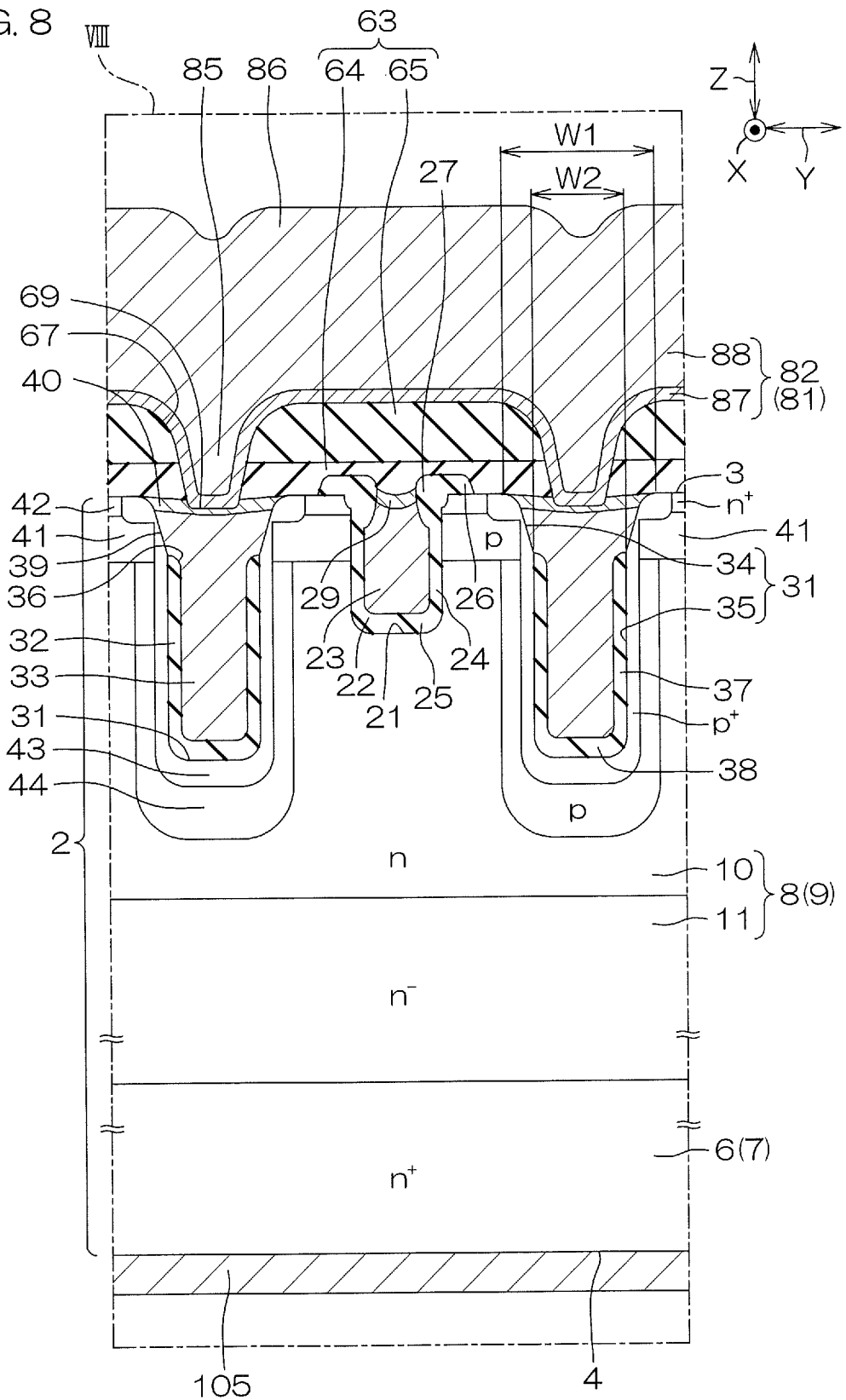
FIG. 8 is an enlarged view of a region VIII shown in FIG. 5.
Figure 9:
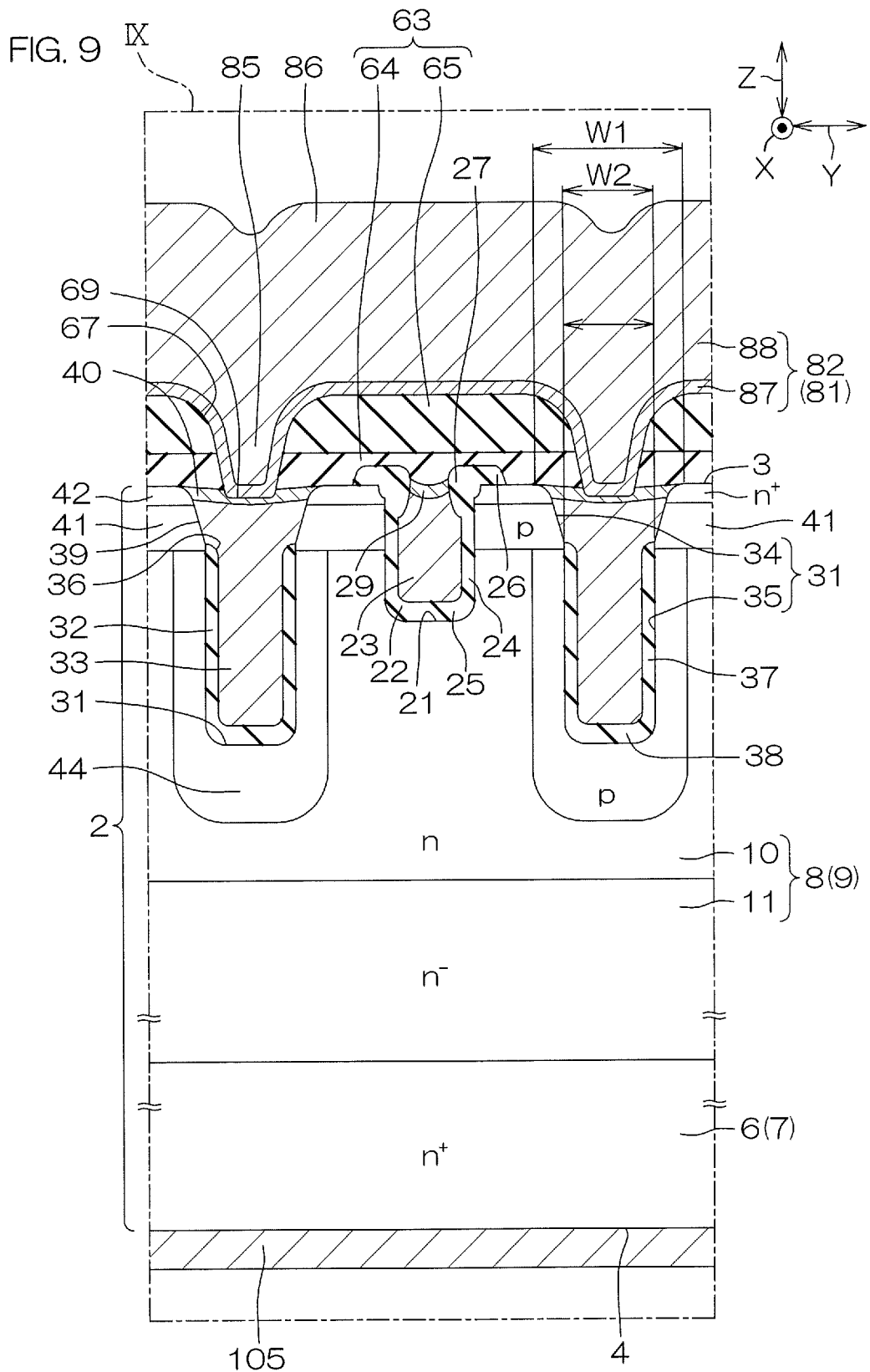
FIG. 9 is an enlarged view of a region IX shown in FIG. 6.
Figure 10:
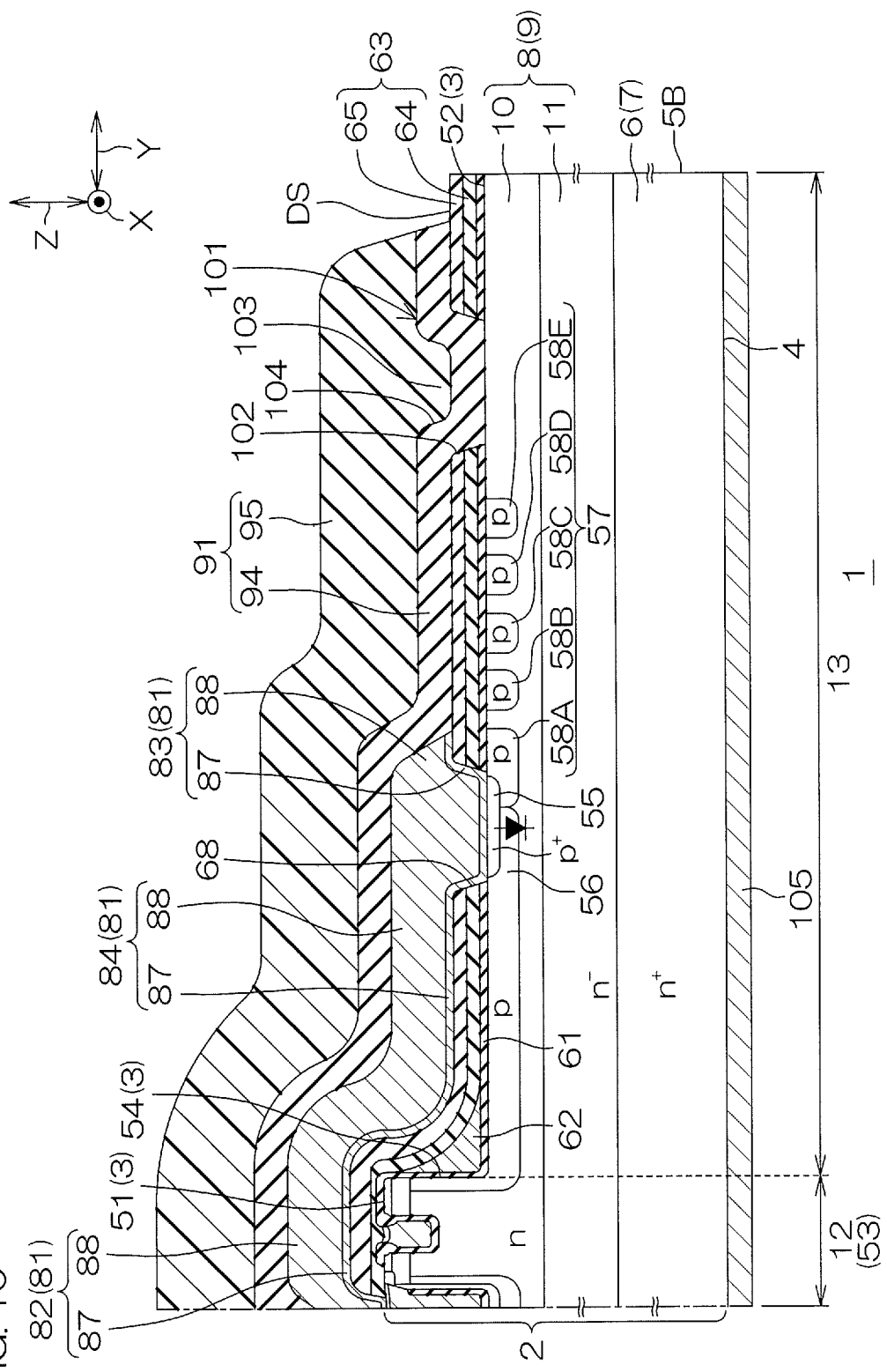
FIG. 10 is a sectional view taken along line X-X shown in FIG. 2.

FIG. 1 is a perspective view of an SiC semiconductor device 1 according to a first preferred embodiment of the present invention. FIG. 2 is a plan view of the SiC semiconductor device 1 shown in FIG. 1. FIG. 3 is a plan view with which structures above a gate main surface electrode 71 and a source main surface electrode 81 (first main surface electrodes) have been removed from the structure shown in FIG. 2. FIG. 4 is an enlarged plan view of an internal structure of a region IV shown in FIG. 3. FIG. 5 is a sectional view taken along line V-V shown in FIG. 4. FIG. 6 is a sectional view taken along line VI-VI shown in FIG. 4. FIG. 7 is a sectional view taken along line VII-VII shown in FIG. 4. FIG. 8 is an enlarged view of a region VIII shown in FIG. 5. FIG. 9 is an enlarged view of a region IX shown in FIG. 6. FIG. 10 is a sectional view taken along line X-X shown in FIG. 2.

Referring to FIG. 1 to FIG. 10, the SiC semiconductor device 1 includes an SiC semiconductor layer 2. The SiC semiconductor layer 2 includes an SiC monocrystal constituted of a hexagonal crystal. The SiC monocrystal constituted of the hexagonal crystal has a plurality of polytypes including a 2H (hexagonal)-SiC monocrystal, a 4H—SiC monocrystal, a 6H—SiC monocrystal, etc., in accordance with cycle of atomic arrangement. Although, with this embodiment, the SiC semiconductor layer 2 is constituted of a 4H—SiC monocrystal, this does not exclude other polytypes.

A thickness of the SiC semiconductor layer 2 may be not less than 40 μm and not more than 300 μm. The thickness of the SiC semiconductor layer 2 may be not less than 40 μm and not more than 100 μm, not less than 100 μm and not more than 150 μm, not less than 150 μm and not more than 200 μm, not less than 200 μm and not more than 250 μm, or not less than 250 μm and not more than 300 μm. The thickness of the SiC semiconductor layer 2 is preferably not less than 60 μm and not more than 150 μm.

The SiC semiconductor layer 2 has a first main surface 3 at one side, a second main surface 4 at another side, and side surfaces 5A, 5B, 5C, and 5D connecting the first main surface 3 and the second main surface 4. The side surfaces 5A to 5D include the first side surface 5A, the second side surface 5B, the third side surface 5C, and the fourth side surface 5D. The first main surface 3 and the second main surface 4 are formed to quadrilateral shapes (rectangular shapes in this embodiment) in a plan view as viewed from a normal direction Z thereto (hereinafter referred to simply as "plan view").

In this embodiment, the first main surface 3 and the second main surface 4 are arranged along c-planes of the SiC monocrystal. The first main surface 3 is arranged along a silicon plane ((0001) plane) of the SiC monocrystal. The first main surface 3 is a non-mounting surface. The second main surface 4 is arranged along a carbon plane ((000-1) plane) of the SiC monocrystal. The first main surface 3 and the second main surface 4 may have an off angle inclined at a predetermined angle in an off direction with respect to the c-planes. The off direction is preferably an a-axis direction ([11-20] direction) of the SiC monocrystal. If there is an off angle, a c-axis ([0001] direction) of the SiC monocrystal is inclined by the off angle with respect to the normal direction Z.

The off angle may exceed 0° and be not more than 10°. The off angle may be not less than 0° and not more than 6°. The off angle may be not less than 0° and not more than 2°, not less than 2° and not more than 4°, or not less than 4° and not more than 6°. Preferably, the off angle exceeds 0° and is not more than 4.5°. The off angle may be not less than 3° and not more than 4.5°. In this case, the off angle is preferably not less than 3° and not more than 3.5° or not less than 3.5° and not more than 4°. The off angle may be not less than 1.5° and not more than 3°. In this case, the off angle is preferably not less than 1.5° and not more than 2° or not less than 2° and not more than 2.5°.

The second main surface 4 may be constituted of a rough surface having either or both of grinding marks and annealing marks (specifically, laser irradiation marks). The annealing marks may include amorphized SiC and/or a metal and silicided (alloyed) SiC (specifically Si). The second main surface 4 is preferably constituted of an ohmic surface having at least annealing marks.

The first side surface 5A and the second side surface 5B extend along a first direction X and oppose each other in a second direction Y intersecting (specifically, orthogonal to) the first direction X. The first side surface 5A and the second side surface 5B form short sides of the SiC semiconductor layer 2 in plan view. The third side surface 5C and the fourth side surface 5D extend along the second direction Y and oppose each other in the first direction X. The third side surface 5C and the fourth side surface 5D form long sides of the SiC semiconductor layer 2 in plan view.

In this embodiment, the first direction X is an m-axis direction ([1-100] direction) of the SiC monocrystal. The second direction Y is the a-axis direction ([11-20] direction) of the SiC monocrystal. That is, the first side surface 5A and the second side surface 5B are formed by a-planes of the SiC monocrystal and oppose each other in the a-axis direction of the SiC monocrystal. The third side surface 5C and the fourth side surface 5D are formed by m-planes of the SiC monocrystal and oppose each other in the m-axis direction of the SiC monocrystal. Lengths of the respective side surfaces 5A to 5D may be not less than 0.1 mm and not more than 10 mm. Preferably, the lengths of the respective side surfaces 5A to 5D are not less than 0.5 mm and not more than 2.5 mm.

The side surfaces 5A to 5D may be constituted of cleavage surfaces or ground surfaces. In this embodiment, the side surfaces 5A to 5D are constituted of cleavage surface. The first side surface 5A and the second side surface 5B may form inclined surfaces that, when the normal direction Z is taken as a basis, are inclined toward the c-axis direction ([0001] direction) of the SiC monocrystal with respect to the normal direction Z.

The first side surface 5A and the second side surface 5B may be inclined at an angle in accordance with the off angle with respect to the normal direction Z when the normal direction Z is set to 0°. The angle in accordance with the off angle may be equal to the off angle or may be an angle that exceeds 0° and is less than the off angle. On the other hand, the third side surface 5C and the fourth side surface 5D extend as planes along the second direction Y (a-axis direction) and the normal direction Z. Specifically, the third side surface 5C and the fourth side surface 5D are formed substantially perpendicular to the first main surface 3 and the second main surface 4.

The SiC semiconductor layer 2 includes an n$^+$-type drain region 6. An n-type impurity concentration of the drain region 6 may be not less than $1 \times 10^{18}$ cm$^{-3}$ and not more than $1 \times 10^{20}$ cm$^{-3}$. The drain region 6 is formed in a surface layer portion of the second main surface 4 and forms the second main surface 4. In this embodiment, the drain region 6 is constituted of an n$^+$-type SiC semiconductor substrate 7.

A thickness of the drain region 6 may be not less than 40 μm and not more than 250 μm. The thickness of the drain region 6 may be not less than 40 μm and not more than 100 μm, not less than 100 μm and not more than 150 μm, not less than 150 μm and not more than 200 μm, or not less than 200 μm and not more than 250 μm. The thickness of the drain region 6 is preferably not less than 40 μm and not more than 150 μm. By thinning the drain region 6, a resistance value of the drain region 6 can be reduced.

The SiC semiconductor layer 2 includes an n-type drift region 8. The drift region 8 has an n-type impurity concentration that is less than the n-type impurity concentration of the drain region 6. The n-type impurity concentration of the drift region 8 may be not less than $1.0 \times 10^{15}$ cm$^{-3}$ and not more than $1.0 \times 10^{18}$ cm$^{-3}$. The drift region 8 is formed in a surface layer portion of the first main surface 3 and forms the first main surface 3. The drift region 8 is electrically connected to the drain region 6. A boundary between the drain region 6 and the drift region 8 extends in parallel to the first main surface 3. In this embodiment, the drift region 8 is constituted of an n-type SiC epitaxial layer 9 formed on the SiC semiconductor substrate 7.

A thickness of the drift region 8 may be not less than 1 μm and not more than 50 μm. The thickness of the drift region 8 may be not less than 1 μm and not more than 5 μm, not less than 5 μm and not more than 10 μm, not less than 10 μm and not more than 15 μm, not less than 15 μm and not more than 20 μm, not less than 20 μm and not more than 30 μm, not less than 30 μm and not more than 40 μm, or not less than 40 μm and not more than 50 μm. The thickness of the drift region 8 is preferably not less than 5 μm and not more than 15 μm.

In this embodiment, the drift region 8 has a plurality of regions having different n-type impurity concentrations along the normal direction Z. Specifically, the drift region 8 includes a high concentration region 10 and a low concentration region 11. The high concentration region 10 has a comparatively high n-type impurity concentration and is formed in a region at the first main surface 3 side. The low concentration region 11 has an n-type impurity concentration less than the n-type impurity concentration of the high concentration region 10 and is formed in a region at the second main surface 4 side with respect to the high concentration region 10.

A peak value of the n-type impurity concentration of the high concentration region 10 may be not less than $1.0 \times 10^{16}$ cm$^{-3}$ and not more than $1.0 \times 10^{13}$ cm$^{-3}$. A peak value of the n-type impurity concentration of the low concentration region 11 may be not less than $1.0 \times 10^{15}$ cm$^{-3}$ and not more than $1.0 \times 10^{16}$ cm$^{-3}$. A thickness of the low concentration region 11 exceeds a thickness of the high concentration region 10. That is, the thickness of the high concentration region 10 is less than the thickness of the low concentration region 11 and is less than one-half the total thickness of the drift region 8. Obviously, the drift region 8 having a uniform n-type impurity concentration may be formed.

The SiC semiconductor layer 2 includes an active region 12 and an outer region 13. The active region 12 is a region in which a MISFET (metal insulator semiconductor field effect transistor) is formed. In plan view, the active region 12 is formed in a central portion of the SiC semiconductor layer 2 at intervals inward from the side surfaces 5A to 5D. In this embodiment, the active region 12 is formed to a quadrilateral shape (rectangular shape in this embodiment) having four sides parallel to the side surfaces 5A to 5D in plan view. The outer region 13 is a region at an outer side of the active region 12. The outer region 13 is formed in a region between the side surfaces 5A to 5D and peripheral edges of the active region 12. The outer region 13 is formed to an annular shape (more specifically, an endless shape) surrounding the active region 12 in plan view.

The SiC semiconductor device 1 includes a plurality of trench gate structures 18 formed in the first main surface 3 in the active region 12. The plurality of trench gate structures 18 are respectively formed as bands extending along the first direction X and are formed at intervals in the second direction Y. The plurality of trench gate structures 18 are formed in stripes as a whole in plan view.

In this embodiment, the plurality of trench gate structures 18 extend as bands from a peripheral edge portion at one side (the third side surface 5C side) toward a peripheral edge portion at another side (the fourth side surface 5D side) of the active region 12. The plurality of trench gate structures 18 cross an intermediate portion of the active region 12 between the peripheral edge portion at one side and the peripheral edge portion at the other side.

A length of each trench gate structure 18 may be not less than 1 mm and not more than 10 mm. The length of each trench gate structure 18 may be not less than 1 mm and not more than 2 mm, not less than 2 mm and not more than 4 mm, not less than 4 mm and not more than 6 mm, not less than 6 mm and not more than 8 mm, or not less than 8 mm and not more than 10 mm. The length of each trench gate structure 18 is preferably not less than 2 mm and not more than 6 mm. A total extension per unit area of a single trench gate structure 18 may be not less than 0.5 μm/μm$^2$ and not more than 0.75 μm/μm$^2$.

Each trench gate structure 18 includes an active trench portion 19 and a contact trench portion 20. The active trench portion 19 is a portion oriented along a channel of the MISFET. The contact trench portion 20 is a portion outside the channel of the MISFET. The contact trench portion 20 is an end portion of the trench gate structure 18 and a main purpose thereof is external connection.

Each trench gate structure 18 includes a gate trench 21, a gate insulating layer 22, and a gate electrode 23. In FIG. 4, the gate insulating layers 22 and the gate electrodes 23 are shown with hatching.

Each gate trench 21 is formed in the drift region 8. The gate trench 21 includes side walls and a bottom wall. The side walls that form long sides of the gate trench 21 are formed by a-planes of the SiC monocrystal. The side walls that form short sides of the gate trench 21 are formed by m-planes of the SiC monocrystal.

The side walls of the gate trench 21 may extend along the normal direction Z. In this case, the side walls of the gate trench 21 may be formed substantially perpendicular to the first main surface 3. Angles that the side walls of the gate trench 21 form with respect to the first main surface 3 within the SiC semiconductor layer 2 may be not less than 90° and not more than 95° (for example, not less than 91° and not more than 93°). That is, the gate trench 21 may be formed to a tapered shape with which an opening width narrows from the first main surface 3 toward the bottom wall.

The bottom wall of the gate trench 21 is positioned in the high concentration region 10. The bottom wall of the gate trench 21 is arranged along a c-plane of the SiC monocrystal. The bottom wall of the gate trench 21 has an off angle inclined in the [11-20] direction with respect to a (0001) plane of the SiC monocrystal. The bottom wall of the gate trench 21 may be formed parallel to the first main surface 3. The bottom wall of the gate trench 21 may be formed to a shape curved toward the second main surface 4.

A width along the second direction Y of the gate trench 21 may be not less than 0.1 μm and not more than 2 μm. The width of the gate trench 21 may be not less than 0.1 μm and not more than 0.5 μm, not less than 0.5 μm and not more than 1.0 μm, not less than 1.0 μm and not more than 1.5 μm, or not less than 1.5 μm and not more than 2 μm.

The gate trench 21 has a first depth D1. The first depth D1 may be not less than 0.5 μm and not more than 3.0 μm. The first depth D1 may be not less than 0.5 μm and not more than 1.0 μm, not less than 1.0 μm and not more than 1.5 μm, not less than 1.5 μm and not more than 2.0 μm, not less than 2.0 μm and not more than 2.5 μm, or not less than 2.5 μm and not more than 3.0 μm.

An opening edge portion of the gate trench 21 includes an inclined portion that is inclined downwardly from the first main surface 3 toward an inner side of the gate trench 21. The opening edge portion of the gate trench 21 is a portion connecting the first main surface 3 and the side walls of the gate trench 21. The inclined portion of the gate trench 21 is formed to a shape curved toward an inner side of the SiC semiconductor layer 2. The inclined portion of the gate trench 21 may be formed to a shape curved toward the inner side of the gate trench 21. The inclined portion of the gate trench 21 relaxes concentration of electric field with respect to the opening edge portion of the gate trench 21.

The gate insulating layer 22 includes at least one type of material among silicon oxide, silicon nitride, aluminum oxide, zirconium oxide, and tantalum oxide. The gate insulating layer 22 may have a laminated structure in which a silicon oxide layer and a silicon nitride layer are laminated in any order. The gate insulating layer 22 may have a single layer structure constituted of a silicon oxide layer or a silicon nitride layer. In this embodiment, the gate insulating layer 22 has a single layer structure constituted of a silicon oxide layer.

The gate insulating layer 22 is formed as a film along the inner walls of each gate trench 21 and demarcates a recess space within the gate trench 21. The gate insulating layer 22 includes a first region 24, a second region 25, and a third region 26. The first region 24 is formed along the side walls of the gate trench 21. The second region 25 is formed along the bottom wall of the gate trench 21. The third region 26 is formed along the first main surface 3.

A thickness of the first region 24 is less than a thickness of the second region 25 and a thickness of the third region 26. The thickness of the first region 24 may be not less than 0.01 μm and not more than 0.2 μm. The thickness of the second region 25 may be not less than 0.05 μm and not more than 0.5 μm. The thickness of the third region 26 may be not less than 0.05 μm and not more than 0.5 μm.

The gate insulating layer 22 includes a bulging portion 27 bulging toward an interior of the gate trench 21 at the opening edge portion. The bulging portion 27 is formed at a connection portion of the first region 24 and the third region 26 of the gate insulating layer 22. The bulging portion 27 is formed to a shape curved toward the inner side of the gate trench 21. The bulging portion 27 narrows an opening of the gate trench 21 at the opening edge portion. A gate insulating layer 22 not having the bulging portion 27 may be formed. A gate insulating layer 22 having a uniform thickness may be formed.

Each gate electrode 23 is embedded across the gate insulating layer 22 in the corresponding gate trench 21. Specifically, the gate electrode 23 is embedded in the recess space demarcated by the gate insulating layer 22 within the gate trench 21. The gate electrode 23 has an electrode surface exposed from the opening of the gate trench 21. The electrode surface of the gate electrode 23 is formed to a curved shape recessed toward the bottom wall of the gate trench 21. The electrode surface of the gate electrode 23 is narrowed by the bulging portion 27 of the gate insulating layer 22.

The gate electrode 23 is constituted of a conductive material other than a metal material. The gate electrode 23 is preferably constituted of a conductive polysilicon. In this embodiment, the gate electrode 23 includes a p-type polysilicon doped with a p-type impurity. The p-type impurity concentration of the gate electrode 23 may be not less than $1 \times 10^{18}$ cm$^{-3}$ and not more than $1 \times 10^{22}$ cm$^{-3}$. The p-type impurity of the gate electrode 23 may include at least one type of material among boron, aluminum, indium, and gallium. A sheet resistance of the gate electrode 23 may be not less than 10Ω/□ and not more than 500Ω/□ (approximately 200Ω/□ in this embodiment). A thickness of the gate electrode 23 may be not less than 0.5 μm and not more than 3 μm.

The SiC semiconductor device 1 includes a gate wiring 28 formed on the first main surface 3 in the active region 12. In FIG. 4, the gate wiring 28 is shown with hatching. Specifically, the gate wiring 28 is formed on the third regions 26 of the gate insulating layers 22. The gate wiring 28 is formed along the first side surface 5A, the third side surface 5C, and the fourth side surface 5D in the active region 12 and demarcates, from three directions, a region in which the plurality of trench gate structures 18 are formed.

The gate wiring 28 is connected to the gate electrode 23 exposed from the contact trench portion 20 of each trench gate structure 18. In this embodiment, the gate wiring 28 is formed by lead-out portions of the gate electrodes 23 that are led out from the respective gate trenches 21 onto the first main surface 3. An electrode surface of the gate wiring 28 is connected to the electrode surfaces of the gate electrodes 23.

The SiC semiconductor device 1 includes a first low resistance layer 29 that covers the gate electrodes 23. The first low resistance layer 29 includes a conductive material having a sheet resistance less than the sheet resistance of the gate electrodes 23. The sheet resistance of the first low resistance layer 29 may be not less than 0.01Ω/□ and not more than 10Ω/□. A thickness in the normal direction Z of the first low resistance layer 29 is preferably less than the thickness of the gate electrodes 23. The thickness of the first low resistance layer 29 may be not less than 0.01 μm and not more than 3 μm.

The first low resistance layer 29 covers the gate electrodes 23 within the gate trenches 21. The first low resistance layer 29 forms a portion of each trench gate structure 18. The first low resistance layer 29 also covers the gate wiring 28. A portion of the first low resistance layer 29 that covers the gate wiring 28 is formed integral to portions of the first low resistance layer 29 covering the gate electrodes 23. The first low resistance layer 29 thereby covers entire areas of the gate electrodes 23 and an entire area of the gate wiring 28.

Specifically, the first low resistance layer 29 includes a polycide layer. The polycide layer is constituted of a layer with which surface layer portions of the gate electrodes 23 and a surface layer portion of the gate wiring 28 are silicided by a metal material. That is, the polycide layer is constituted of a p-type polycide layer that includes the p-type impurity doped in the gate electrodes 23 (p-type polysilicon) and the gate wiring 28 (p-type polysilicon). Also, the electrode surfaces of the gate electrodes 23 and the electrode surface of the gate wiring 28 are formed by the first low resistance layer 29. The polycide layer preferably has a specific resistance of not less than 10 μΩ·cm and not more than 110 μΩ·cm.

A sheet resistance inside the gate trenches 21 embedded with the gate electrodes 23 and the first low resistance layer 29 is not more than the sheet resistance of the gate electrodes 23 alone. The sheet resistance inside the gate trenches 21 is preferably not more than a sheet resistance of an n-type polysilicon doped with an n-type impurity. The sheet resistance inside the gate trenches 21 is approximated by the sheet resistance of the first low resistance layer 29. The sheet resistance inside the gate trenches 21 may be not less than 0.01Ω/□ and not more than 10Ω/□. The sheet resistance inside the gate trenches 21 is preferably less than 10 Ω/□.

The first low resistance layer 29 may include at least one type of material among TiSi, TiSi$_2$, NiSi, CoSi, CoSi$_2$, MoSi$_2$, and WSi$_2$. Among these types of materials, NiSi, CoSi$_2$, and TiSi$_2$ are especially suitable as the polycide layer forming the first low resistance layer 29 due to being comparatively low in specific resistance value and temperature dependence. The first low resistance layer 29 is most preferably constituted of CoSi$_2$ that has a property being low in diffusion to other regions.

The first low resistance layer 29 includes contact portions in contact with the gate insulating layers 22. Specifically, the contact portions of the first low resistance layer 29 contact the third regions 26 (bulging portions 27) of the gate insulating layers 22. A current path between the first low resistance layer 29 and the drift region 8 can thereby be suppressed. In particular, a design where the contact portions of the first low resistance layer 29 are connected to comparatively thick corner portions of the gate insulating layers 22 is effective for reducing a risk of a current path.

By embedding a p-type polysilicon having a work function differing from an n-type polysilicon in the gate trenches 21, a gate threshold voltage Vth can be increased by approximately 1 V. However, a p-type polysilicon has a sheet resistance of several tens of times (approximately 20 times) higher than a sheet resistance of an n-type polysilicon. Therefore, if a p-type polysilicon is adopted as a material of the gate electrodes 23, energy loss increases in accompaniment with increase in parasitic resistance inside the gate trenches 21 (referred to hereinafter simply as "gate resistance").

Thus, with the SiC semiconductor device 1, the first low resistance layer 29 (p-type polycide) is formed on the gate electrodes 23 (p-type polysilicon). By the first low resistance layer 29, the sheet resistance inside the gate trenches 21 can be reduced while allowing increase in the gate threshold voltage Vth. For example, with the structure having the first low resistance layer 29, the sheet resistance can be decreased to not more than 1/100th in comparison to a structure not having the first low resistance layer 29. Also, with the structure having the first low resistance layer 29, the sheet resistance can be decreased to not more than 1/5th in comparison to the gate electrodes 23 that include the n-type polysilicon.

The gate resistance can thereby be reduced and therefore, a current can be diffused efficiently along the trench gate structures 18. That is, the first low resistance layer 29 is formed as a current diffusion layer that diffuses the current inside the gate trenches 21. In particular, although time is required for transmission of current with the gate trenches 21 having a length of the millimeter order (a length not less than 1 mm), switching delay can be suppressed appropriately by the low resistance electrode layer 29. Also, with the structure having the first low resistance layer 29, the p-type impurity concentration inside the drift region 8 does not have to be increased for increasing the gate threshold voltage Vth. The gate threshold voltage Vth can thus be increased appropriately while suppressing increase in channel resistance.

The SiC semiconductor device 1 includes a plurality of trench source structures 30 respectively formed in regions between mutually adjacent ones of the plurality of trench gate structures 18. The plurality of trench source structures 30 are formed at intervals in the second direction Y in a mode of sandwiching a single trench gate structure 18. The plurality of trench source structures 30 are each formed as a band extending along the first direction X. The plurality of trench source structures 30 are formed in stripes as a whole in plan view.

A pitch PS in the second direction Y between central portions of mutually adjacent trench source structures 30 may be not less than 1 μm and not more than 5 μm. The pitch PS may be not less than 1 μm and not more than 2 μm, not less than 2 μm and not more than 3 μm, not less than 3 μm and not more than 4 μm, or not less than 4 μm and not more than 5 μm. The pitch PS is preferably not less than 1.5 μm and not more than 3 μm.

Each trench source structure 30 includes a source trench 31, a source insulating layer 32, and a source electrode 33. In FIG. 4, the source insulating layers 32 and the source electrodes 33 are shown with hatching. Each source trench 31 is formed in the drift region 8. The source trench 31 includes side walls and a bottom wall. The side walls that form long sides of the source trench 31 are formed by a-planes of the SiC monocrystal. The side walls that form short sides of the source trench 31 are formed by m-planes of the SiC monocrystal.

The bottom walls of the source trenches 31 are positioned in the high concentration region 10. The bottom walls of the source trenches 31 are arranged along a c-plane of the SiC monocrystal. The bottom walls of the source trench 31 have an off angle inclined in the [11-20] direction with respect to the (0001) plane of the SiC monocrystal. The bottom walls of the source trenches 31 may be formed parallel to the first main surface 3. The bottom walls of the source trenches 31 may each be formed to a shape curved toward the second main surface 4.

The bottom walls of the source trenches 31 are positioned in regions at the second main surface 4 side with respect to the bottom walls of the gate trenches 21. The bottom walls of the source trenches 31 are positioned in regions between the bottom walls of the gate trenches 21 and the low concentration region 11 in regard to the normal direction Z. That is, the source trenches 31 have a second depth D2 that exceeds the first depth D1 of the gate trenches 21. Under a condition that the source trenches 31 are positioned inside the high concentration region 10, a ratio DS/□G of the second depth D2 with respect to the first depth D1 may be not less than 1.5. The ratio DS/□G is preferably not less than 2.

The second depth D2 may be not less than 0.5 µm and not more than 10 µm. The second depth D2 may be not less than 0.5 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm. Obviously, the source trenches 31 having the second depth D2 substantially equal to the first depth D1 may be formed.

In this embodiment, each source trench 31 includes a first trench portion 34 and a second trench portion 35. The first trench portion 34 is formed at an opening side of the source trench 31. The first trench portion 34 has a first width W1 in the second direction Y. The first trench portion 34 may be formed to a tapered shape with which the first width W1 narrows from the first main surface 3 toward the bottom wall side. The first trench portion 34 may be formed as a first trench portion 34 that traverses the bottom walls of the gate trenches 21 in the normal direction Z. That is, a depth of the first trench portion 34 may exceed the first depth D1 of the gate trenches 21.

The first trench portion 34 is preferably formed in a region at the first main surface 3 side with respect to the bottom walls of the gate trenches 21. That is, the depth of the first trench portion 34 is preferably less than the first depth D1 of the gate trenches 21. The depth of the first trench portion 34 may be not less than 0.1 µm and not more than 2 µm. The depth of the first trench portion 34 may be not less than 0.1 µm and not more than 0.5 µm, not less than 0.5 µm and not more than 1 µm, not less than 1 µm and not more than 1.5 µm, or not less than 1.5 µm and not more than 2 µm.

The first width W1 of the first trench portion 34 may be not less than the width of the gate trenches 21 or may be less than the width of the gate trenches 21. The first width W1 preferably exceeds the width of the gate trenches 21. The first width W1 may be not less than 0.1 µm and not more than 2 µm. The first width W1 may be not less than 0.1 µm and not more than 0.5 µm, not less than 0.5 µm and not more than 1 µm, not less than 1 µm and not more than 1.5 µm, or not less than 1.5 µm and not more than 2 µm.

The second trench portion 35 is formed at the bottom wall side of the source trench 31. In the normal direction Z, the second trench portion 35 is formed in a region between the first trench portion 34 and a bottom portion of the drift region 8 and traverses the bottom walls of the gate trenches 21. In the normal direction Z, a depth of the second trench portion 35 on basis of the first trench portion 34 preferably exceeds the first depth D1 of the gate trenches 21.

The second trench portion 35 has a second width W2 that is less than the first width W1 in the second direction Y. Under a condition of being less than the first width W1, the second width W2 may be not less than the width of the gate trenches 21 or may be less than the width of the gate trenches 21. The second width W2 may be not less than 0.1 µm and less than 2 µm. The second width W2 may be not less than 0.1 µm and less than 2 µm. The second width W2 may be not less than 0.1 µm and not more than 0.5 µm, not less than 0.5 µm and not more than 1 µm, not less than 1 µm and not more than 1.5 µm, or not less than 1.5 µm and less than 2 µm. Obviously, the second trench portion 35 having the second width W2 that is substantially equal to the first width W1 may be formed.

An opening width of the source trench 31 that includes the first trench portion 34 and the second trench portion 35 is preferably formed to be approximately the same as the opening width of the gate trenches 21. The opening width of the source trench 31 being approximately the same as the opening width of the gate trenches 21 refers to the opening width of the source trench 31 falling within a range of ±20% of the opening width of the gate trenches 21.

Side walls of the second trench portion 35 may extend along the normal direction Z. Angles that the side walls of the second trench portion 35 form with respect to the first main surface 3 within the SiC semiconductor layer 2 may be not less than 90° and not more than 95° (for example, not less than 91° and not more than 93°). The side walls of the second trench portion 35 may be formed substantially perpendicular to the first main surface 3. The second trench portion 35 may be formed to a tapered shape with which the second width W2 narrows from the first trench portion 34 toward the bottom wall side.

Each source insulating layer 32 includes at least one type of material among silicon oxide, silicon nitride, aluminum oxide, zirconium oxide, or tantalum oxide. The source insulating layer 32 may have a laminated structure in which a silicon oxide layer and a silicon nitride layer are laminated in any order. The source insulating layer 32 may have a single layer structure constituted of a silicon oxide layer or a silicon nitride layer. In this embodiment, the source insulating layer 32 has a single layer structure constituted of a silicon oxide layer.

The source insulating layer 32 is formed as a film along the inner walls of the corresponding source trench 31 and demarcates a recess space within the source trench 31. Specifically, the source insulating layer 32 is formed as a film along the inner walls of the second trench portion 35 such as to expose the first trench portion 34. Thereby, the source insulating layer 32 has a side wall window portion 36 exposing the first trench portion 34 and demarcates the recess space within the second trench portion 35.

The source insulating layer 32 includes a first region 37 and a second region 38. The first region 37 is formed along the side walls of the source trench 31. The second region 38 is formed along the bottom wall of the source trench 31. A thickness of the first region 37 is less than a thickness of the second region 38. The thickness of the first region 37 may be not less than 0.01 µm and not more than 0.2 µm. The thickness of the second region 38 may be not less than 0.05 µm and not more than 0.5 µm. The thickness of the first region 37 may be substantially equal to the thickness of the first regions 37 of the gate insulating layers 22. The thickness of the second region 38 may be substantially equal to the thickness of the second regions 38 of the gate insulating layers 22. The source insulating layers 32 that each have a uniform thickness may be formed.

Each source electrode 33 is embedded in the corresponding source trench 31 across the source insulating layer 32. Specifically, the source electrode 33 is embedded in the first trench portion 34 and the second trench portion 35 of the source trench 31 across the source insulating layer 32. The source electrode 33 is embedded in the recess space demarcated by the second trench portion 35 at the bottom wall side of the source trench 31. The source electrode 33 has a side wall contact portion 39 in contact with side walls of the first trench portion 34 exposed from the side wall window portion 36 at the opening side of the source trench 31.

The source electrode 33 has an electrode surface exposed from the opening of the source trench 31. The electrode surface of the source electrode 33 is formed to a curved shape recessed toward the bottom wall of the source trench 31. The electrode surface of the source electrode 33 may be formed parallel to the first main surface 3.

A thickness of the source electrode 33 in the normal direction Z may be not less than 0.5 μm and not more than 10 μm. The thickness of the source electrode 33 may be not less than 0.5 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

The source electrode 33 is constituted of a conductive material other than a metal material. The source electrode 33 is preferably constituted of a conductive polysilicon. In this embodiment, the source electrode 33 includes a p-type polysilicon doped with a p-type impurity. The p-type impurity concentration of the source electrode 33 may be not less than $1 \times 10^{18}$ cm$^{-3}$ and not more than $1 \times 10^{22}$ cm$^{-3}$. The p-type impurity concentration of the source electrode 33 is preferably equal to the p-type impurity concentration of the gate electrode 23. That is, a sheet resistance of the source electrode 33 may be not less than 10Ω/□ and not more than 500Ω/□ (approximately 200Ω/□ in this embodiment). The p-type impurity of the source electrode 33 may include at least one type of material among boron, aluminum, indium, and gallium.

The SiC semiconductor device 1 includes second low resistance layers 40 each covering a source electrode 33. Each second low resistance layer 40 covers the source electrode 33 within the corresponding source trench 31. The second low resistance layer 40 forms a portion of the corresponding trench source structure 30. The second low resistance layer 40 includes a conductive material having a sheet resistance less than the sheet resistance of the source electrode 33. The sheet resistance of the second low resistance layer 40 may be not less than 0.01Ω/□ and not more than 10Ω/□. A thickness in the normal direction Z of the second low resistance layer 40 is preferably less than the thickness of the source electrode 33. The thickness of the second low resistance layer 40 may be not less than 0.01 μm and not more than 3 μm.

Specifically, the second low resistance layer 40 includes a polycide layer. The polycide layer is constituted of a layer with which surface layer portion of the source electrode 33 is silicided by a metal material. That is, the polycide layer is constituted of a p-type polycide layer that includes the p-type impurity doped in the source electrode 33. Also, the electrode surface of the source electrode 33 is formed by the second low resistance layer 40. The polycide layer preferably has a specific resistance of not less than 10 μΩ·cm and not more than 110 μΩ·cm.

A sheet resistance inside the source trench 31 embedded with the source electrode 33 and the second low resistance layer 40 is not more than the sheet resistance of the source electrode 33 alone. The sheet resistance inside the source trench 31 is preferably not more than a sheet resistance of an n-type polysilicon doped with an n-type impurity. The sheet resistance inside the source trench 31 is approximated by the sheet resistance of the second low resistance layer 40. The sheet resistance inside the source trench 31 may be not less than 0.01Ω/□ and not more than 10Ω/□. The sheet resistance inside the source trench 31 is preferably less than 10 Ω/□.

The second low resistance layer 40 may include at least one type of material among TiSi, TiSi$_2$, NiSi, CoSi, CoSi$_2$, MoSi$_2$, and WSi$_2$. Among these types of materials, NiSi, CoSi$_2$, and TiSi$_2$ are especially suitable as the polycide layer forming the second low resistance layer 40 due to being comparatively low in specific resistance value and temperature dependence. The second low resistance layer 40 is most preferably constituted of CoSi$_2$ that has a property being low in diffusion to other regions. The second low resistance layer 40 is preferably constituted of the same conductive material as the first low resistance layer 29.

The SiC semiconductor device 1 includes a p-type body region 41 formed in a surface layer portion of the first main surface 3 in the active region 12. The body region 41 defines the active region 12. A p-type impurity concentration of the body region 41 is less than the p-type impurity concentration of the gate electrodes 23. The p-type impurity concentration of the body region 41 is less than the p-type impurity concentration of the source electrodes 33. A peak value of the p-type impurity concentration of the body region 41 may be not less than $1.0 \times 10^{17}$ cm$^{-3}$ and not more than $1.0 \times 10^{19}$ cm$^{-3}$.

In the surface layer portion of the first main surface 3, the body region 41 covers the side walls of the gate trenches 21 and the side walls of the source trenches 31. The body region 41 is formed in a region at the first main surface 3 side with respect to the bottom walls of the gate trenches 21. The body region 41 opposes the gate electrodes 23 across the gate insulating layers 22.

The body region 41 is further formed in regions at the first trench portion 34 sides with respect to the second trench portions 35 of the source trenches 31. The body region 41 covers the first trench portions 34 of the source trenches 31. Specifically, the body region 41 is connected to the side wall contact portions 39 of the source electrodes 33 exposed from the first trench portions 34 of the source trenches 31. The body region 41 is source-grounded within the SiC semiconductor layer 2. The body region 41 may cover portions of the second trench portions 35. In this case, the body region 41 may oppose the source electrodes 33 across portions of the source insulating layers 32.

The SiC semiconductor device 1 includes n$^+$-type source regions 42 formed in surface layer portions of the body region 41. The source regions 42 are formed at intervals from the contact trench portions 20 of the gate trenches 21 and along the active trench portions 19 of the gate trenches 21. A peak value of an n-type impurity concentration of the source regions 42 exceeds the peak value of the n-type impurity concentration of the high concentration region 10. The peak value of the n-type impurity concentration of the source regions 42 may be not less than $1.0 \times 10^{18}$ cm$^{-3}$ and not more than $1.0 \times 10^{21}$ cm$^{-3}$.

In the surface layer portions of the body region 41, the source regions 42 cover the side walls of the gate trenches 21 and the side walls of the source trenches 31. The source regions 42 oppose the gate electrodes 23 across the gate insulating layers 22. The source regions 42 preferably oppose the first low resistance layer 29 across the gate insulating layers 22.

The source regions 42 are further formed in regions at the first trench portion 34 sides with respect to the second trench portions 35 of the source trenches 31. The source regions 42 cover the first trench portions 34 of the source trenches 31.

The source regions 42 are connected to the side wall contact portions 39 of the source electrodes 33 exposed from the first trench portions 34 of the source trenches 31. The source regions 42 are thereby source-grounded within the SiC semiconductor layer 2.

Portions of the source regions 42 that are oriented along the side walls of the gate trenches 21 define the channels of the MISFET with the high concentration region 10 within the body region 41. ON/OFF of the channels is controlled by the gate electrodes 23.

The SiC semiconductor device 1 includes a plurality of p$^+$-type contact regions 43 formed in surface layer portions of the first main surface 3 in the active region 12. A peak value of a p-type impurity concentration of each contact region 43 exceeds the p-type impurity concentration of the body region 41. The peak value of the p-type impurity concentration of each contact region 43 may be not less than $1.0 \times 10^{18}$ cm$^{-3}$ and not more than $1.0 \times 10^{21}$ cm$^{-3}$.

The plurality of the contact regions 43 are respectively formed in regions oriented along the plurality of source trenches 31. Specifically, a plurality of contact regions 43 are formed in a relationship of several-to-one correspondence with respect to a corresponding single source trench 31. The plurality of contact regions 43 are respectively formed at intervals along the corresponding single source trench 31. The plurality of contact regions 43 are respectively formed at intervals from the gate trenches 21.

Each contact region 43 covers the first trench portion 34 of the corresponding source trench 31. Each contact region 43 is interposed between the side wall contact portion 39 of the source electrode 33 and the source regions 42 at the first trench portion 34 of the corresponding source trench 31. Further, each contact region 43 is interposed between the side wall contact portion 39 of the source electrode 33 and the body region 41 at the first trench portion 34 of the corresponding source trench 31.

Each contact region 43 is thereby source-grounded within the SiC semiconductor layer 2. Also, each contact region 43 is electrically connected to the source electrode 33, the body region 41, and the source regions 42 within the SiC semiconductor layer 2.

Portions of each contact region 43 that cover the first trench portion 34 is led out toward the gate trenches 21. The portions of each contact region 43 that cover the first trench portion 34 of the source trench 31 are formed in regions at the first main surface 3 side with respect to a bottom portion of the body region 41. The portions of each contact region 43 that cover the first trench portion 34 may extend to intermediate regions between the gate trenches 21 and the source trench 31.

Each contact region 43 further covers the second trench portion 35 of the corresponding source trench 31. At the second trench portion 35 of the corresponding source trench 31, each contact region 43 opposes the source electrode 33 across the source insulating layer 32. Each contact region 43 further covers the bottom wall of the corresponding source trench 31. Each contact region 43 opposes the source electrode 33 across the bottom wall of the corresponding source trench 31. A bottom portion of each contact region 43 may be formed parallel to the bottom wall of the corresponding source trench 31.

The SiC semiconductor device 1 includes a plurality of p-type deep well regions 44 formed in surface layer portions of the first main surface 3 in the active region 12. A peak value of a p-type impurity concentration of each deep well region 44 is less than the peak value of the p-type impurity concentration of the contact regions 43. The peak value of the p-type impurity concentration of each deep well region 44 may be not less than the peak value of the p-type impurity concentration of the body region 41 or may be less than the peak value of the p-type impurity concentration of the body region 41. The peak value of the p-type impurity concentration of each deep well region 44 may be not less than $1.0 \times 10^{17}$ cm$^{-3}$ and not more than $1.0 \times 10^{19}$ cm$^{-3}$.

The plurality of deep well regions 44 are formed in a relationship of one-to-one correspondence with respect to the plurality of source trenches 31. Each deep well region 44 is formed as a band extending along the corresponding source trench 31 in plan view. Each deep well region 44 is formed in the high concentration region 10. Each deep well region 44 is formed in a region at the second main surface 4 side with respect to the body region 41. Each deep well region 44 is continuous to the body region 41.

Each deep well region 44 includes a portion that covers the second trench portion 35 of the corresponding source trench 31. Each deep well region 44 includes portions that cover the second trench portion 35 of the corresponding source trench 31 across the contact regions 43. Each deep well region 44 further includes a portion covering the bottom wall of the corresponding source trench 31. Each deep well region 44 includes portions covering the bottom wall of the corresponding source trench 31 across the contact regions 43.

Each deep well region 44 has a bottom portion positioned at the second main surface 4 side with respect to the bottom walls of the gate trenches 21. The bottom portion of each deep well region 44 may be formed parallel to the bottom wall of each source trench 31. The plurality of deep well regions 44 are preferably formed to be of constant depth. Each deep well region 44 forms a pn junction portion with the high concentration region 10. From the pn junction portions, depletion layers spread toward the gate trenches 21. The depletion layers may overlap with the bottom walls of the gate trenches 21.

The SiC semiconductor device 1 includes a plurality of p-type peripheral edge well regions 45 formed in surface layer portions of the first main surface 3 at peripheral edge portions of the active region 12. A peak value of a p-type impurity concentration of each peripheral edge well region 45 is less than the peak value of the p-type impurity concentration of the contact regions 43.

The peak value of the p-type impurity concentration of each peripheral edge well region 45 may be not less than the peak value of the p-type impurity concentration of the body region 41 or may be less than the peak value of the p-type impurity concentration of the body region 41. The peak value of the p-type impurity concentration of each peripheral edge well region 45 may be not less than $1.0 \times 10^{17}$ cm$^{-3}$ and not more than $1.0 \times 10^{19}$ cm$^{-3}$. The p-type impurity concentration of the peripheral edge well regions 45 is preferably substantially equal to the p-type impurity concentration of the deep well regions 44.

The peripheral edge well regions 45 are formed in plurality in a relationship of one-to-one correspondence with respect to the plurality of trench gate structures 18. The peripheral edge well regions 45 cover the contact trench portions 20 and expose the active trench portions 19 of the corresponding trench gate structures 18. The peripheral edge well regions 45 cover the side walls and the bottom walls of the gate trenches 21 at the corresponding contact trench portions 20. Bottom portions of the peripheral edge well regions 45 are positioned at the first main surface 3 side with respect to bottom walls of the deep well regions 44. The respective peripheral edge well regions 45 are electrically connected to the body region 41 and the deep well regions 44.

With an SiC semiconductor device that includes only a pn junction diode, due to the structure of not including trenches, a problem of concentration of electric field inside the SiC semiconductor layer 2 does not occur frequently. The respective deep well regions 44 make the trench gate type MISFET approach the structure of a pn junction diode. The electric field within the SiC semiconductor layer 2 can thereby be relaxed in the trench gate type MISFET.

Also, with the deep well regions 44 having the bottom portions at the second main surface 4 side with respect to the bottom walls of the gate trenches 21, concentration of electric field with respect to the gate trenches 21 can be relaxed appropriately by the depletion layers. Narrowing the pitch PS between mutually adjacent ones of the plurality of source trenches 31 (deep well regions 44) is effective in terms of relaxing the concentration of electric field and improving withstand voltage.

The plurality of deep well regions 44 are preferably formed to be of constant depth. The withstand voltage (for example, electrostatic breakdown strength) of the SiC semiconductor layer 2 can thereby be suppressed from being restricted by the respective deep well regions 44 and therefore, improvement of the withstand voltage can be achieved appropriately. The peripheral edge well regions 45 also exhibit the same effects as the deep well regions 44.

By using the source trenches 31, the deep well regions 44 can be formed appropriately in comparatively deep regions of the SiC semiconductor layer 2. Also, the deep well regions 44 can be formed along the source trenches 31 and therefore occurrence of variation in the depth of the plurality of deep well regions 44 can be suppressed appropriately Also, in this embodiment, portions of the high concentration region 10 are interposed in regions between the mutually adjacent ones of the plurality of deep well regions 44. A JFET (junction field effect transistor) resistance can thereby be reduced in the regions between the mutually adjacent ones of the plurality of deep well regions 44.

Also, in this embodiment, the bottom portions of the respective deep well regions 44 are positioned in the high concentration region 10. Current paths can thereby be formed in lateral directions parallel to the first main surface 3 in regions of the high concentration region 10 directly below the respective deep well regions 44. Consequently, current spreading resistance can be reduced. The low concentration region 11 increases the withstand voltage of the SiC semiconductor layer 2 in such a structure.

Referring to FIG. 10, the active region 12 has an active main surface 51 forming a portion of the first main surface 3. The active main surface 51 and an outer main surface are respectively arranged along c-planes of the SiC monocrystal. The active main surface 51 and the outer main surface 52 respectively have off angles inclined in the [11-20] direction with respect to the (0001) plane of the SiC monocrystal.

The outer region 13 has the outer main surface 52 forming a portion of the first main surface 3. The outer main surface 52 is connected to the side surfaces 5A to 5D. The outer region 13 is formed by digging into the drift region 8 (SiC epitaxial layer 9) toward the second main surface 4 side. The outer main surface 52 is thus formed in a region that is recessed toward the second main surface 4 side with respect to the active main surface 51. The outer main surface 52 is preferably positioned at the second main surface 4 side with respect to the bottom walls of the gate trenches 21.

In this embodiment, the outer main surface 52 is formed at a depth position substantially equal to the bottom walls of the respective source trenches 31. The outer main surface 52 is positioned on substantially the same plane as the bottom walls of the respective source trenches 31. The outer main surface 52 may be positioned in a range of not less than 0 μm and not more than 1 μm toward the second main surface 4 side with respect to the bottom walls of the respective source trenches 31. The outer main surface 52 exposes the high concentration region 10.

In this embodiment, the active region 12 is formed as an active mesa 53 that is demarcated in mesa shape by the outer region 13. The active mesa 53 projects upward from the outer main surface 52. The active mesa 53 includes active side walls 54 connecting the active main surface 51 and the outer main surface 52. The active side walls 54 demarcate a boundary region between the active region 12 and the outer region 13. The first main surface 3 is formed by the active main surface 51, the outer main surface 52, and the active side walls 54.

In this embodiment, the active side walls 54 extend along the normal direction Z to the active main surface 51 (outer main surface 52). The active side walls 54 are formed by m-planes and a-planes of the SiC monocrystal. The active side walls 54 may have inclined surfaces inclined downwardly from the active main surface 51 toward the outer main surface 52. The active side walls 54 expose the high concentration region 10. The active side walls 54 may expose the body region 41.

The SiC semiconductor device 1 includes a p$^+$-type diode region 55 formed in a surface layer portion of the outer main surface 52. A peak value of a p-type impurity concentration of the diode region 55 exceeds the peak value of the p-type impurity concentration of the body region 41. The peak value of the p-type impurity concentration of the diode region 55 may be not less than $1.0 \times 10^{18}$ cm$^{-3}$ and not more than $1.0 \times 10^{21}$ cm$^{-3}$. The peak value of the p-type impurity concentration of the diode region 55 may be substantially equal to the peak value of the p-type impurity concentration of the contact regions 43.

The diode region 55 is formed in the high concentration region 10. The diode region 55 is formed in a region between the active side walls 54 and the side surfaces 5A to 5D. The diode region 55 is formed at intervals from the active side walls 54 and the side surfaces 5A to 5D. The diode region 55 extends as a band along the active region 12 in plan view. In this embodiment, the diode region 55 is formed to an annular shape (more specifically, an endless shape) surrounding the active region 12 in plan view.

The diode region 55 is positioned at the second main surface 4 side with respect to the bottom walls of the gate trenches 21. A bottom portion of the diode region 55 is positioned at the second main surface 4 side with respect to the bottom walls of the respective source trenches 31. The bottom portion of the diode region 55 may be formed at a depth position substantially equal to the bottom portions of the contact regions 43.

The bottom portion of the diode region 55 may be positioned on substantially the same plane as the bottom portions of the contact regions 43. The bottom portion of the diode region 55 may be positioned at the second main surface 4 side with respect to the bottom portions of the contact regions 43. The bottom portion of the diode region 55 may be positioned in a range of not less than 0 μm and not more than 1 μm toward the second main surface 4 side with respect to the bottom portions of the contact regions 43.

The diode region 55 forms a pn junction portion with the high concentration region 10. A pn junction diode having the diode region 55 as an anode and the high concentration region 10 as a cathode is thereby formed.

The SiC semiconductor device 1 includes a p-type outer well region 56 formed in a surface layer portion of the outer main surface 52. A peak value of a p-type impurity concentration of the outer well region 56 may be not less than $1.0 \times 10^{17}$ cm$^{-3}$ and not more than $1.0 \times 10^{19}$ cm$^{-3}$. The peak value of the p-type impurity concentration of the outer well region 56 may be less than the peak value of the p-type impurity concentration of the diode region 55. The peak value of the p-type impurity concentration of the outer well region 56 may be substantially equal to the peak value of the p-type impurity concentration of the deep well regions 44.

The outer well region 56 is formed in a region between the active side walls 54 and the diode region 55 in plan view. The outer well region 56 extends as a band along the active region 12. In this embodiment, the outer well region 56 is formed to an annular shape (more specifically, an endless shape) surrounding the active region 12 in plan view.

The outer well region 56 is formed in the high concentration region 10. The outer well region 56 is positioned at the second main surface 4 side with respect to the bottom walls of the gate trenches 21. A bottom portion of the outer well region 56 is positioned at the second main surface 4 side with respect to the bottom walls of the respective source trenches 31. The bottom portion of the outer well region 56 is positioned at the second main surface 4 side with respect to the bottom portion of the diode region 55. The bottom portion of the outer well region 56 may be formed at a depth position substantially equal to the bottom portions of the deep well regions 44.

Inner peripheral edges of the outer well region 56 cover corner portions connecting the active side walls 54 and the outer main surface 52. The inner peripheral edges of the outer well region 56 further extend along the active side walls and are connected to the body region 41. The inner peripheral edges of the outer well region 56 may be formed at intervals toward the diode region 55 side from the active side walls 54.

Outer peripheral edges of the outer well region 56 cover the diode region 55 from the second main surface 4 side. The outer well region 56 is electrically connected to the diode region 55. The outer well region 56 may form a portion of the pn junction diode. The outer peripheral edges of the outer well region 56 may be formed at intervals to the active side wall 54 sides from the diode region 55.

The SiC semiconductor device 1 includes an FL structure 57 (field limit structure) formed in a surface layer portion of the outer main surface 52. The FL structure 57 is formed in a region between the diode region 55 and the side surfaces 5A to 5D in plan view. In this embodiment, the FL structure 57 is formed at intervals toward the diode region 55 side from the side surfaces 5A to 5D. The FL structure 57 is formed in the high concentration region 10.

The FL structure 57 includes one or a plurality of (for example, not less than two and not more than twenty) p-type FL regions 58 (field limit regions). In this embodiment, the FL structure 57 includes an FL region group having five FL regions 58A, 58B, 58C, 58D, and 58E. The FL regions 58A to 58E are formed in that order at intervals along a direction away from the diode region 55.

The FL regions 58A to 58E respectively extend as bands along the peripheral edges of the active region 12 in plan view. Specifically, the FL regions 58A to 58E are respectively formed to annular shapes (more specifically, endless shapes) surrounding the active region 12 in plan view. Each of the FL regions 58A to 58E is also referred to as an FLR region (field limiting ring region).

Entireties of the FL regions 58A to 58E are positioned at the second main surface 4 side with respect to the bottom walls of the gate trenches 21. Bottom portions of the FL regions 58A to 58E are positioned at the second main surface 4 side with respect to the bottom portion of the diode region 55. The bottom portions of the FL regions 58A to 58E are positioned at the second main surface 4 side with respect to the bottom walls of the source trenches 31. The FL region 58A at an innermost side among the FL regions 58A to 58E covers the diode region 55 from the second main surface 4 side. The FL region 58A is thereby electrically connected to the diode region 55. The FL region 58A may form a portion of the pn junction diode.

The FL structure 57 relaxes concentration of electric field in the outer region 13. The number, widths, depths, p-type impurity concentration, etc., of the FL regions 58 may take on any of various values in accordance with the electric field to be relaxed. The FL structure 57 may include one or a plurality of FL regions 58 formed in the region between the active side walls 54 and the diode region 55 in plan view.

The SiC semiconductor device 1 includes an outer insulating layer 61 covering the outer main surface 52. The outer insulating layer 61 may include silicon oxide. The outer insulating layer 61 may include another insulating film of silicon nitride, etc. In this embodiment, the outer insulating layer 61 is formed of the same insulating material type as the gate insulating layers 22.

The outer insulating layer 61 is formed as a film along the active side walls 54 and the outer main surface 52. On the active main surface 51, the outer insulating layer 61 is continuous to the gate insulating layers 22 (third regions 26). In the outer region 13, the outer insulating layer 61 covers the diode region 55, the outer well region 56, and the FL structure 57.

Peripheral edges of the outer insulating layer 61 are exposed from the side surfaces 5A to 5D. In this embodiment, the peripheral edges of the outer insulating layer 61 are continuous to the side surfaces 5A to 5D. The peripheral edges of the outer insulating layer 61 may be formed at intervals inward from the side surfaces 5A to 5D. In this case, the outer insulating layer 61 exposes the outer main surface 52.

The SiC semiconductor device 1 further includes a side wall structure 62 covering the active side walls 54. The side wall structure 62 protects and reinforces the active mesa 53 from the outer region 13 side. Also, the side wall structure 62 forms a level difference moderating structure that moderates a level difference formed between the active main surface 51 and the outer main surface 52.

If an upper layer structure (covering layer) that covers the boundary region between the active region 12 and the outer region 13 is formed, the upper layer structure covers the side wall structure 62. The side wall structure 62 improves flatness of the upper layer structure. The side wall structure 62 may have an inclined surface that inclines downwardly from the active main surface 51 toward the outer main surface 52. The level difference can be moderated appropriately by the inclined surface of the side wall structure 62.

The inclined surface of the side wall structure 62 may be formed to a curved shape recessed toward the SiC semiconductor layer 2 side. The inclined surface of the side wall structure 62 may be formed to a shape curved toward aside opposite to the SiC semiconductor layer 2. The inclined surface of the side wall structure 62 may extend as a-plane from the active main surface 51 side toward the outer main surface 52 side.

The side wall structure 62 is formed along the active side walls 54. In this embodiment, the side wall structure 62 is formed to an annular shape (more specifically, an endless shape) surrounding the active region 12 in plan view. The side wall structure 62 preferably includes a polysilicon (p-type polysilicon in this embodiment). In this case, the side wall structure 62 can be formed at the same time as the gate electrodes 23 and the source electrodes 33.

The SiC semiconductor device 1 includes an interlayer insulating layer 63 (insulating layer) formed on the first main surface 3. The interlayer insulating layer 63 may include silicon oxide or silicon nitride. The interlayer insulating layer 63 may include at least one among a USG (undoped silicate glass) layer, a PSG (phosphor silicate glass) layer, and a BPSG (boron phosphor silicate glass) layer as an example of silicon oxide. In this embodiment, the interlayer insulating layer 63 has a laminated structure that includes a first insulating layer 64 and a second insulating layer 65. The first insulating layer 64 is constituted of a USG layer. The second insulating layer 65 is constituted of a BPSG layer.

The interlayer insulating layer 63 covers the active region 12 and the outer region 13. The interlayer insulating layer 63 is formed as a film along the active main surface 51 and the outer main surface 52. In the boundary region between the active region 12 and the outer region 13, the interlayer insulating layer 63 is formed along the side wall structure 62. The interlayer insulating layer 63 forms a portion of the upper layer structure that covers the side wall structure 62.

Peripheral edges of the interlayer insulating layer 63 are exposed from the side surfaces 5A to 5D. The peripheral edges of the interlayer insulating layer 63 are continuous to the side surfaces 5A to 5D. The peripheral edges of the interlayer insulating layer 63 may be formed at intervals inward from the side surfaces 5A to 5D. In this case, the interlayer insulating layer 63 exposes the outer main surface 52 (outer insulating layer 61).

In the active region 12, the interlayer insulating layer 63 covers the source regions 42. Further, the interlayer insulating layer 63 covers the contact regions 43. Specifically, the interlayer insulating layer 63 covers entire areas of the source regions 42 in sectional view along the second direction Y. The interlayer insulating layer 63 covers entire areas of the source regions 42 in plan view. The interlayer insulating layer 63 covers entire areas of the contact regions 43 in sectional view. The interlayer insulating layer 63 covers entire areas of the contact regions 43 in plan view.

Even more specifically, in the active region 12, the interlayer insulating layer 63 crosses the first trench portions 34 of the source trenches 31 and covers the source electrodes 33. On the first main surface 3, the interlayer insulating layer 63 covers the side wall contact portions 39 of the source electrodes 33.

The interlayer insulating layer 63 includes a gate hole 66, source holes 67, and a diode hole 68. The gate hole 66 exposes the gate wiring 28 in the active region 12. The gate hole 66 may be formed as a band oriented along the gate wiring 28. An opening edge portion of the gate hole 66 is formed to a shape curved toward an interior of the gate hole 66.

The source holes 67 expose the source electrodes 33 in the active region 12. The source holes 67 may be formed as bands extending along the trench source structures 30. An opening edge portion of each source hole 67 is formed to a shape curved toward an interior of the source hole 67.

Specifically, the source holes 67 are formed inside regions surrounded by the side walls of the source trenches 31 (first trench portions 34) in plan view. The source holes 67 expose the source electrodes 33 at intervals toward inner sides of the source trenches 31 from the side walls of the source trenches 31 (first trench portions 34). The source holes 67 expose only the source electrodes 33.

Recesses 69 recessed toward bottom walls of the source trenches 31 are formed in the electrode surfaces of the source electrodes 33. The recesses 69 may be formed as bands extending along the trench source structures 30. The recesses 69 are formed inside the regions surrounded by the side walls of the source trenches 31 (first trench portions 34) in plan view.

The recesses 69 are formed at intervals toward inner sides of the source trenches 31 from the side walls of the source trenches 31 (first trench portions 34). The recesses 69 expose the second low resistance layers 40. The recesses 69 may penetrate through the second low resistance layers 40. The source holes 67 are in communication with the recesses 69 of the source electrodes 33.

The diode hole 68 exposes the diode region 55 in the outer region 13. The diode hole 68 may be formed as a band (specifically, an endless shape) extending along the diode region 55. The diode hole 68 may expose the outer well region 56 and/or the FL structure 57. An opening edge portion of the diode hole 68 is formed to a shape curved toward an interior of the diode hole 68.

The SiC semiconductor device 1 includes the gate main surface electrode 71 formed on the first main surface 3. Specifically, the gate main surface electrode 71 is formed on the interlayer insulating layer 63. A gate voltage is applied to the gate main surface electrode 71. The gate voltage may be not less than 10 V and not more than 50 V (for example, approximately 30 V).

The gate main surface electrode 71 is formed in the active region 12. The gate main surface electrode 71 includes a gate pad 72 and a gate finger 73. The gate pad 72 is formed in a region at the first side surface 5A side in plan view. Specifically, the gate pad 72 is formed along a region along a central portion of the first side surface 5A in plan view. The gate pad 72 may be formed in a region along a corner portion connecting any two of the side surfaces 5A to 5D in plan view. The gate pad 72 may be formed to a quadrilateral shape in plan view.

The gate finger 73 is led out from the gate pad 72 and extends as a band along the peripheral edges of the active region 12. In this embodiment, the gate finger 73 is formed along the first side surface 5A, the third side surface 5C, and the fourth side surface 5D and demarcates an inner side of the active region 12 from three directions.

The gate finger 73 has a pair of open ends 74 and 75. The pair of open ends 74 and 75 are formed in a region opposing the gate pad 72 across the inner side of the active region 12. In this embodiment, the pair of open ends 74 and 75 are formed in a region along the second side surface 5B in plan view.

The gate finger 73 enters into the gate hole 66 from above the interlayer insulating layer 63. The gate finger 73 is electrically connected to the gate wiring 28 within the gate hole 66. An electrical signal from the gate pad 72 is thereby transmitted to the gate electrodes 23 and the gate wiring 28 via the gate finger 73.

The gate main surface electrode 71 includes a conductive material differing from the gate electrodes 23 (gate wiring 28). Specifically, the gate main surface electrode 71 is constituted of a metal material. That is, in this embodiment, the gate main surface electrode 71 that is constituted of the metal material is electrically connected to the gate electrodes 23 (gate wiring 28) constituted of the conductive polysilicon.

The gate main surface electrode 71 has a laminated structure including a first barrier layer 76 and a first main body layer 77 that are laminated in that order from the SiC semiconductor layer 2 side. The first barrier layer 76 preferably includes at least one among a Ti layer and a TiN layer. The first barrier layer 76 preferably has a laminated structure including a Ti layer and a TiN layer that are laminated in that order from the SiC semiconductor layer 2 side. The first barrier layer 76 may have a single layer structure constituted of a Ti layer or a TiN layer.

A thickness of the first barrier layer 76 may be not less than 0.01 µm and not more than 6 µm. The thickness of the first barrier layer 76 may be not less than 0.01 µm and not more than 0.1 µm, not less than 0.1 µm and not more than 2 µm, not less than 2 µm and not more than 4 µm, or not less than 4 µm and not more than 6 µm.

The first main body layer 77 has a resistance value less than a resistance value of the first barrier layer 76. The first main body layer 77 includes at least one among a pure Al layer, an AlSi alloy layer, an AlCu alloy layer, and an AlSiCu alloy layer. A thickness of the first main body layer 77 exceeds the thickness of the first barrier layer 76. The thickness of the first main body layer 77 may be not less than 0.05 µm and not more than 10 µm. The thickness of the first main body layer 77 may be not less than 0.05 µm and not more than 0.1 µm, not less than 0.1 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm.

The SiC semiconductor device 1 includes the source main surface electrode 81 that is formed on the first main surface 3 at intervals from the gate main surface electrode 71. Specifically, the source main surface electrode 81 is formed on the interlayer insulating layer 63. A source voltage is applied to the source main surface electrode 81. The source voltage may be a reference voltage (for example, a GND voltage).

The source main surface electrode 81 is formed in the active region 12 and the outer region 13. The source main surface electrode 81 includes a source pad 82, a source wiring 83, and a source coupling portion 84. The source pad 82 is formed in the active region 12 at intervals from the gate main surface electrode 71. The source pad 82 is formed in a C shape in plan view such as to cover a region of C shape demarcated by the gate main surface electrode 71.

The source pad 82 includes source connection electrodes 85 and a source covering electrode 86. The source connection electrodes 85 are embedded in the source holes 67. The source connection electrodes 85 are connected to the source electrodes 33 within the source holes 67. The source connection electrodes 85 are connected to only the source electrodes 33 within the source holes 67.

The source covering electrode 86 covers the interlayer insulating layer 63 in a region outside the source holes 67. In this embodiment, the source covering electrode 86 is formed integral to the source connection electrodes 85. The source pad 82 is thereby electrically connected to the body region 41, the source regions 42, and the contact regions 43 via the source electrodes 33.

The source wiring 83 is formed in the outer region 13. The source wiring 83 extends as a band along the active region 12. The source wiring 83 is formed to an annular shape (more specifically, an endless shape) surrounding the active region 12 in plan view. The source wiring 83 enters into the diode hole 68 from above the interlayer insulating layer 63. The source wiring 83 is electrically connected to the diode region 55 within the diode hole 68.

The source coupling portion 84 connects the source pad 82 and the source wiring 83. The source coupling portion 84 crosses the open ends 74 and 75 of the gate finger 73 from the source pad 82 and is connected to the source wiring 83. The source coupling portion 84 crosses the side wall structure 62 from the active region 12 and is led out to the outer region 13. The source coupling portion 84 forms a portion of the upper layer structure that covers the side wall structure 62.

The source main surface electrode 81 includes a conductive material differing from the source electrodes 33. Specifically, the source main surface electrode 81 is constituted of a metal material. That is, in this embodiment, the source main surface electrode 81 that is constituted of the metal material is electrically connected to the source electrodes 33 constituted of the conductive polysilicon.

The source main surface electrode 81 has a laminated structure including a second barrier layer 87 and a second main body layer 88 that are laminated in that order from the SiC semiconductor layer 2 side. The second barrier layer 87 preferably includes at least one among a Ti layer and a TiN layer. The second barrier layer 87 preferably has a laminated structure including a Ti layer and a TiN layer that are laminated in that order from the SiC semiconductor layer 2 side. The second barrier layer 87 may have a single layer structure constituted of a Ti layer or a TiN layer.

A thickness of the second barrier layer 87 may be not less than 0.01 µm and not more than 6 µm. The thickness of the second barrier layer 87 may be not less than 0.01 µm and not more than 0.1 µm, not less than 0.1 µm and not more than 2 µm, not less than 2 µm and not more than 4 µm, or not less than 4 µm and not more than 6 µm.

The second main body layer 88 has a resistance value less than a resistance value of the second barrier layer 87. The second main body layer 88 includes at least one among a pure Al layer, an AlSi alloy layer, an AlCu alloy layer, and an AlSiCu alloy layer. A thickness of the second main body layer 88 exceeds the thickness of the second barrier layer 87. The thickness of the second main body layer 88 may be not less than 0.05 µm and not more than 10 µm. The thickness of the second main body layer 88 may be not less than 0.05 µm and not more than 0.1 µm, not less than 0.1 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm.

Due to its structure, the MISFET formed in the active region 12 includes an npn type parasitic transistor. When an avalanche current generated in the outer region 13 flows into the active region 12, the parasitic transistor is switched to an on state. In this case, operation of the MISFET becomes unstable due to latchup. Thus, with the SiC semiconductor device 1, the structure of the source main surface electrode 81 is used to form an avalanche current absorbing structure.

The avalanche current generated in the outer region 13 is absorbed by the source wiring 83 via the diode region 55. The avalanche current absorbed by the source wiring 83 reaches the source pad 82 via the source coupling portion 84. If a lead wire such as a bonding wire, etc., is electrically connected to the source pad 82, the avalanche current reaches the exterior via the lead wire. Driving of the parasitic transistor due to the avalanche current can thereby be suppressed. Latchup can thus be suppressed and therefore, stability of the MISFET can be improved.

The SiC semiconductor device 1 includes an insulating layer 91 formed on the interlayer insulating layer 63. In FIG. 2, the insulating layer 91 is shown with hatching. Peripheral edges of the insulating layer 91 are formed at intervals inward from the side surfaces 5A to 5D. The insulating layer 91 thereby exposes peripheral edges of the SiC semiconductor layer 2 (specifically, the interlayer insulating layer 63) in plan view.

The peripheral edges of the insulating layer 91 demarcate a dicing street DS with the side surfaces 5A to 5D. By the dicing street DS, it is made unnecessary to physically cut the insulating layer 91 when cutting out the SiC semiconductor device 1 from an SiC wafer. The SiC semiconductor device 1 can thereby be cut out smoothly from the SiC wafer and at the same time, peeling and degradation of the insulating layer 91 can be suppressed. Consequently, protection objects, such as the SiC semiconductor layer 2, the gate main surface electrode 71, the source main surface electrode 81, etc., can be protected appropriately by the insulating layer 91.

A width of the dicing street DS may be not less than 1 μm and not more than 25 μm. The width of the dicing street DS is a width in a direction orthogonal to direction in which the dicing street DS extends. The width of the dicing street DS may be not less than 1 μm and not more than 5 μm, not less than 5 μm and not more than 10 μm, not less than 10 μm and not more than 15 μm, not less than 15 μm and not more than 20 μm, or not less than 20 μm and not more than 25 μm.

The insulating layer 91 selectively covers the gate main surface electrode 71 and the source main surface electrode 81. The insulating layer 91 includes a gate pad opening 92 and a source pad opening 93. The gate pad opening 92 exposes the gate pad 72. The source pad opening 93 exposes the source pad 82. A planar shape of the gate pad opening 92 is arbitrary. A planar shape of the source pad opening 93 is arbitrary.

In this embodiment, the insulating layer 91 has a laminated structure including a passivation layer 94 and a resin layer 95 that are laminated in that order from the SiC semiconductor layer 2 side. The passivation layer 94 may include at least one among a silicon oxide layer and a silicon nitride layer. The passivation layer 94 may have a laminated structure in which a silicon oxide layer and a silicon nitride layer are laminated in any order. The passivation layer 94 may have a single layer structure constituted of a silicon oxide layer or a silicon nitride layer. The passivation layer 94 preferably includes an insulating material differing from the interlayer insulating layer 63. In this embodiment, the passivation layer 94 has a single layer structure constituted of a silicon nitride layer.

The passivation layer 94 is formed as a film along the interlayer insulating layer 63. The passivation layer 94 covers the active region 12 and the outer region 13 across the interlayer insulating layer 63. The passivation layer 94 crosses the side wall structure 62 from the active region 12 and is led out to the outer region 13. The passivation layer 94 forms a portion of the upper layer structure that covers the side wall structure 62.

The passivation layer 94 has a first gate opening 96 and a first source opening 97. The first gate opening 96 exposes the gate pad 72. The first source opening 97 exposes the source pad 82. A planar shape of the first gate opening 96 is arbitrary. A planar shape of the first source opening 97 is arbitrary.

A thickness of the passivation layer 94 may be not less than 0.1 μm and not more than 20 μm. The thickness of the passivation layer 94 may be not less than 0.1 μm and not more than 1 μm, not less than 1 μm and not more than 5 μm, not less than 5 μm and not more than 10 μm, not less than 10 μm and not more than 15 μm, or not less than 15 μm and not more than 20 μm.

The resin layer 95 may include a photosensitive resin. The photosensitive resin may be of a negative type or a positive type. The resin layer 95 may include at least one among a polyimide, a polyamide, and a polybenzoxazole. In this embodiment, the resin layer 95 includes polybenzoxazole.

The resin layer 95 is formed as a film along a main surface of the passivation layer 94. The resin layer 95 crosses the side wall structure 62 from the active region 12 and is led out to the outer region 13. The resin layer 95 forms a portion of the upper layer structure that covers the side wall structure 62. In this embodiment, peripheral edges of the resin layer 95 expose peripheral edges of the passivation layer 94. The peripheral edges of the insulating layer 91 are formed by the peripheral edges of the resin layer 95 and the peripheral edges of the passivation layer 94. The resin layer 95 may cover the peripheral edges of the passivation layer 94.

The resin layer 95 has a second gate opening 98 and a second source opening 99. The second gate opening 98 is in communication with the first gate opening 96 of the passivation layer 94 and forms the gate pad opening 92 with the first gate opening 96. The second source opening 99 is in communication with the first source opening 97 of the passivation layer 94 and forms the source pad opening 93 with the first source opening 97.

Inner walls of the second gate opening 98 may be formed flush with inner walls of the first gate opening 96. The inner walls of the second gate opening 98 may be positioned outside the first gate opening 96 in plan view. The inner walls of the second gate opening 98 may be positioned inside the first gate opening 96 in plan view. That is, the resin layer 95 may cover the inner walls of the first gate opening 96.

Inner walls of the second source opening 99 may be formed flush with inner walls of the first source opening 97. The inner walls of the second source opening 99 may be positioned outside the first source opening 97 in plan view. The inner walls of the second source opening 99 may be positioned inside the first source opening 97 in plan view. That is, the resin layer 95 may cover the inner walls of the first source opening 97.

A thickness of the resin layer 95 may be not less than 1 μm and not more than 50 μm. The thickness of the resin layer 95 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 1 includes an uneven structure 101 formed in the outer main surface 52. Specifically, the uneven structure 101 includes unevenness formed using the interlayer insulating layer 63 covering the outer main surface 52. Even more specifically, the uneven structure 101 includes an anchor hole 102 formed in the interlayer insulating layer 63.

The anchor hole 102 is formed by digging into a portion of the interlayer insulating layer 63 that covers the outer region 13. The anchor hole 102 may be formed in the region between the diode region 55 and the side surfaces 5A to 5D in plan view. In this embodiment, the anchor hole 102 is formed in a region between the FL structure 57 and the side surfaces 5A to 5D in plan view.

The anchor hole 102 may be demarcated by the interlayer insulating layer 63. In this embodiment, the anchor hole 102 exposes the outer main surface 52. The anchor hole 102 may be dug toward the second main surface 4 in the outer main surface 52. An opening edge portion of the anchor hole 102 is formed to a shape curved toward an interior of the anchor hole 102.

The anchor hole 102 extends as a band along the active region 12 in plan view. In this embodiment, the anchor hole 102 is formed to an annular shape (more specifically, an endless shape) surrounding the active region 12 in plan view. The number of anchor holes 102 is arbitrary. A single anchor hole 102 may be formed in the interlayer insulating layer 63 or a plurality of anchor holes 102 may be formed in the interlayer insulating layer 63.

The resin layer 95 has an anchor portion 103 that is engaged with the anchor hole 102. In this embodiment, the resin layer 95 is engaged with the anchor hole 102 via the passivation layer 94. Specifically, the passivation layer 94 enters into the anchor hole 102 from above the interlayer insulating layer 63. The passivation layer 94 contacts the outer main surface 52 within the anchor hole 102. A recess 104 recessed toward the anchor hole 102 is formed in a portion of the main surface of the passivation layer 94 that covers the anchor hole 102.

A portion of the resin layer 95 forms the anchor portion 103 within the recess 104 of the passivation layer 94. Connection strength of the resin layer 95 with respect to the first main surface 3 can thereby be improved and therefore, peeling of the resin layer 95 can thus be suppressed appropriately.

The SiC semiconductor device 1 includes a drain electrode 105 formed on the second main surface 4 of the SiC semiconductor layer 2. The drain electrode 105 is electrically connected to the drain region 6. The drain electrode 105 includes at least one among a Ti layer, an Ni layer, a Pd layer, an Au layer, an Ag layer, and an Al layer. The drain electrode 105 preferably includes a Ti layer that forms an ohmic contact with the second main surface 4.

The drain electrode 105 preferably has a laminated structure including at least a Ti layer, an Ni layer, and an Au layer that are laminated in that order from the second main surface 4 side. Even more preferably, the drain electrode 105 has a laminated structure including a Ti layer, an Ni layer, an Au layer, and an Ag layer that are laminated in that order from the second main surface 4 side. Preferably, a Pd layer is interposed between the Ni layer and the Au layer. An Al layer may be disposed at any layer in the laminated structure.

As described above, with the SiC semiconductor device 1, the source electrodes 33 have the side wall contact portions 39 exposed from the side wall window portions 36. The source regions 42 are electrically connected to the side wall contact portions 39 of the source electrodes 33 exposed from the side walls of the source trenches 31 within the SiC semiconductor layer 2. The source regions 42 can thereby be source-grounded appropriately within the SiC semiconductor layer 2.

Also, with the SiC semiconductor device 1, the body region 41 is electrically connected to the side wall contact portions 39 of the source electrodes 33 exposed from the side walls of the source trenches 31 within the SiC semiconductor layer 2. The body region 41 can thereby be source-grounded appropriately within the SiC semiconductor layer 2.

Also, with the SiC semiconductor device 1, the contact regions 43 are interposed between the body region 41 and the side wall contact portions 39 in surface layer portions of the first main surface 3. The contact regions 43 are electrically connected to the side wall contact portions 39 of the source electrodes 33 exposed from the side walls of the source trenches 31 within the SiC semiconductor layer 2. The contact regions 43 can thereby be source-grounded appropriately within the SiC semiconductor layer 2.

Also, with the SiC semiconductor device 1, the source regions 42 are source-grounded within the SiC semiconductor layer 2 and therefore, the interlayer insulating layer 63 that, on the first main surface 3, covers the source regions 42 can be formed. Also, the interlayer insulating layer 63 that covers the entire areas of the source regions 42 in sectional view can be formed. Also, the interlayer insulating layer 63 that covers the entire areas of the source regions 42 in plan view can be formed. Further, the interlayer insulating layer 63 that, on the first main surface 3, covers the side wall contact portions 39 of the source electrodes 33 can be formed.

Also, with the SiC semiconductor device 1, the source regions 42 are source-grounded within the SiC semiconductor layer 2 and therefore, an opening width of the source holes 67 that expose the source electrodes 33 can be narrowed. An alignment margin of the source holes 67 can thereby be widened. That is, the SiC semiconductor device 1 that is robust to positional deviations of the source holes 67 can be provided.

Also, with the SiC semiconductor device 1, the source holes 67 that expose only the source electrodes 33 can be formed and, at the same time, the source connection electrodes 85 that are connected to only the source electrodes 33 can be formed. Consequently, the source regions 42 can be source-grounded appropriately and, at the same time, variation in electrical characteristics due to positional deviations of the source connection electrodes 85 (source holes 67) can be suppressed appropriately.

The source electrodes 33 are preferably constituted of a conductive material other than a metal material. The source electrodes 33 are especially preferably constituted of a conductive polysilicon. The source main surface electrode 81 is preferably constituted of a conductive material differing from the source electrodes 33. The source main surface electrode 81 is especially preferably constituted of a metal material.

With such a structure, the source electrodes 33 can be embedded appropriately in the source trenches 31 and, at the same time, the source main surface electrode 81 can be connected appropriately to the source electrodes 33. Such a structure is especially effective in a case where the opening width of the source trenches 31 is approximately the same as the opening width of the gate trenches 21 and the source trenches 31 have the second depth D2 that exceeds the first depth D1 of the gate trenches 21.

A metal material can also be embedded in the source trenches 31. However, in this case, a restriction is placed on the depth of the source trenches 31 and, at the same time, the source trenches 31 having an opening width that greatly exceeds the opening width of the gate trenches 21 must be formed. Attention must thus be paid to the point of being in conflict with the demand to make the SiC semiconductor device 1 high in withstand voltage and compact. With the SiC semiconductor device 1, such a problem can be solved.

Figure 11B:
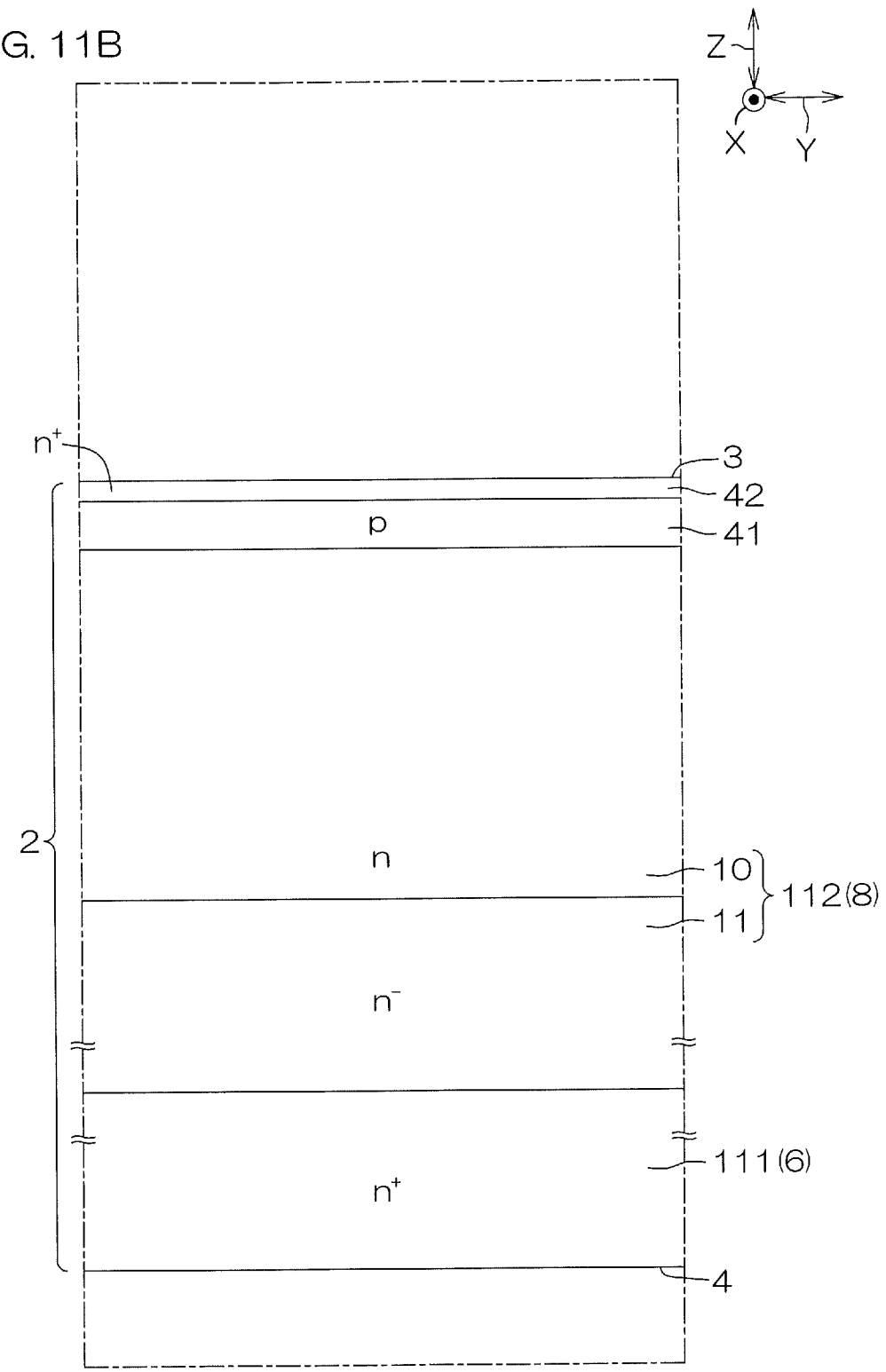
FIG. 11B is an enlarged sectional view of a step after FIG. 11A.
Figure 11C:
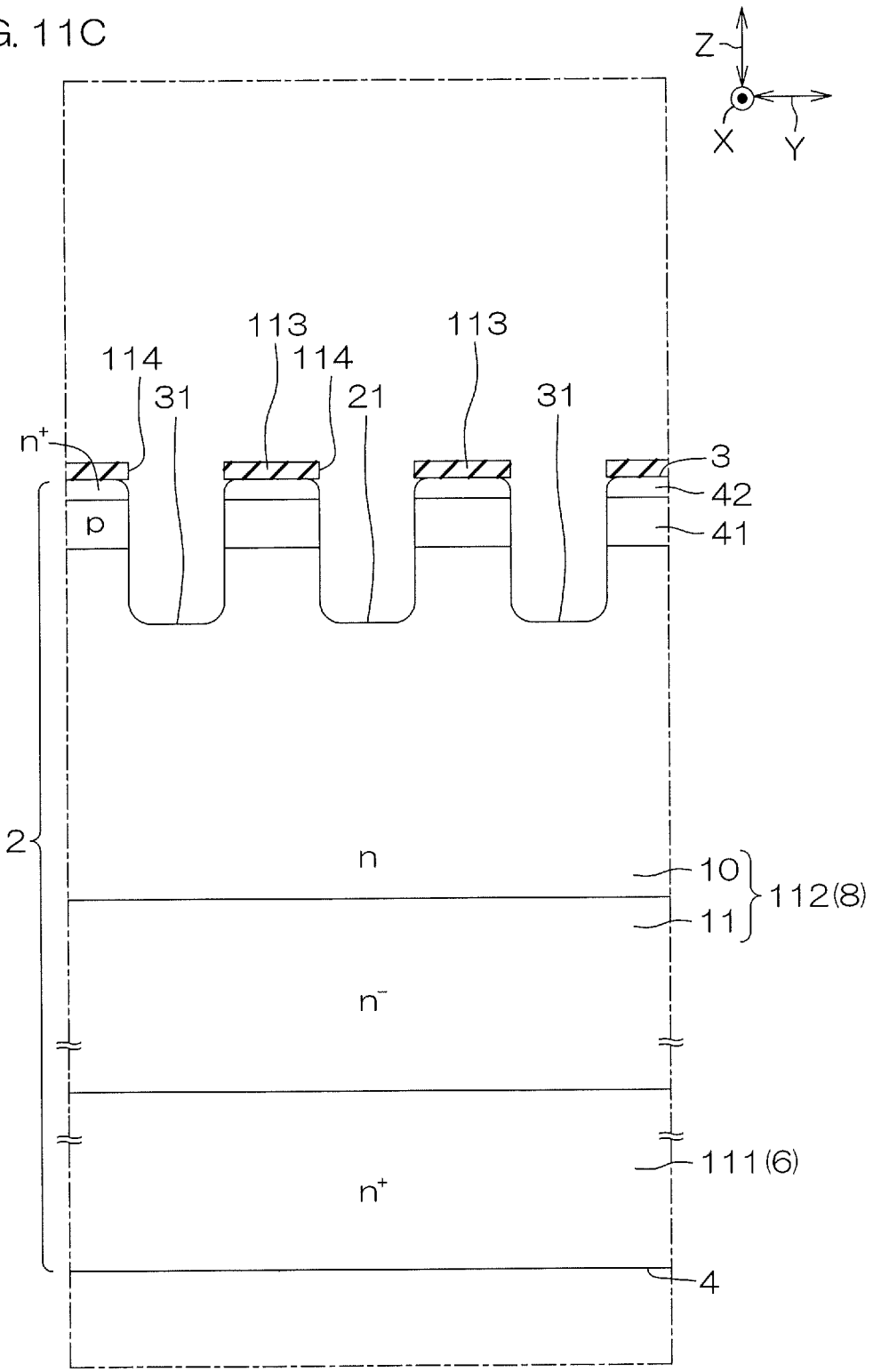
FIG. 11C is an enlarged sectional view of a step after FIG. 11B.
Figure 11D:
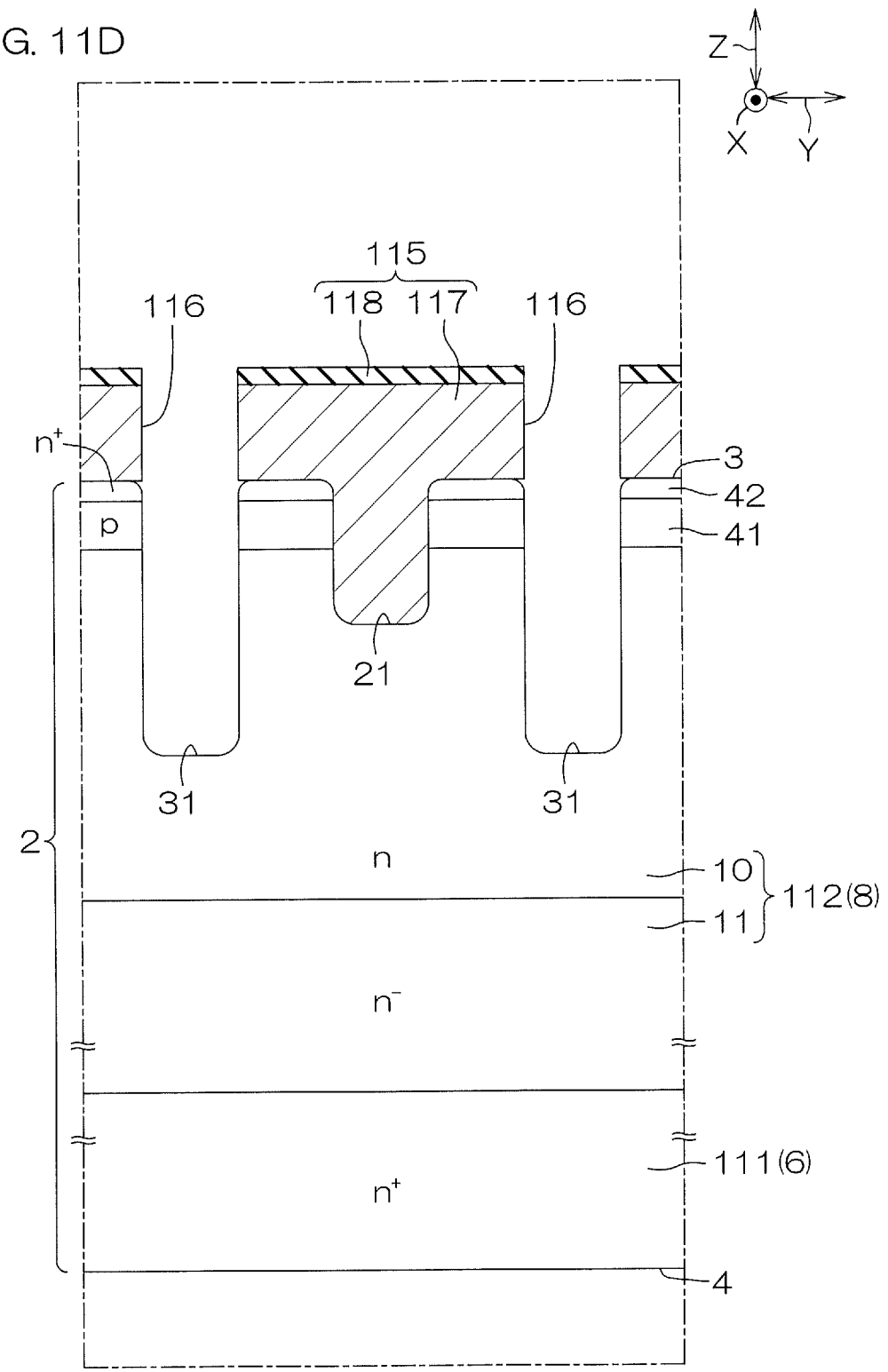
FIG. 11D is an enlarged sectional view of a step after FIG. 11C.
Figure 11E:
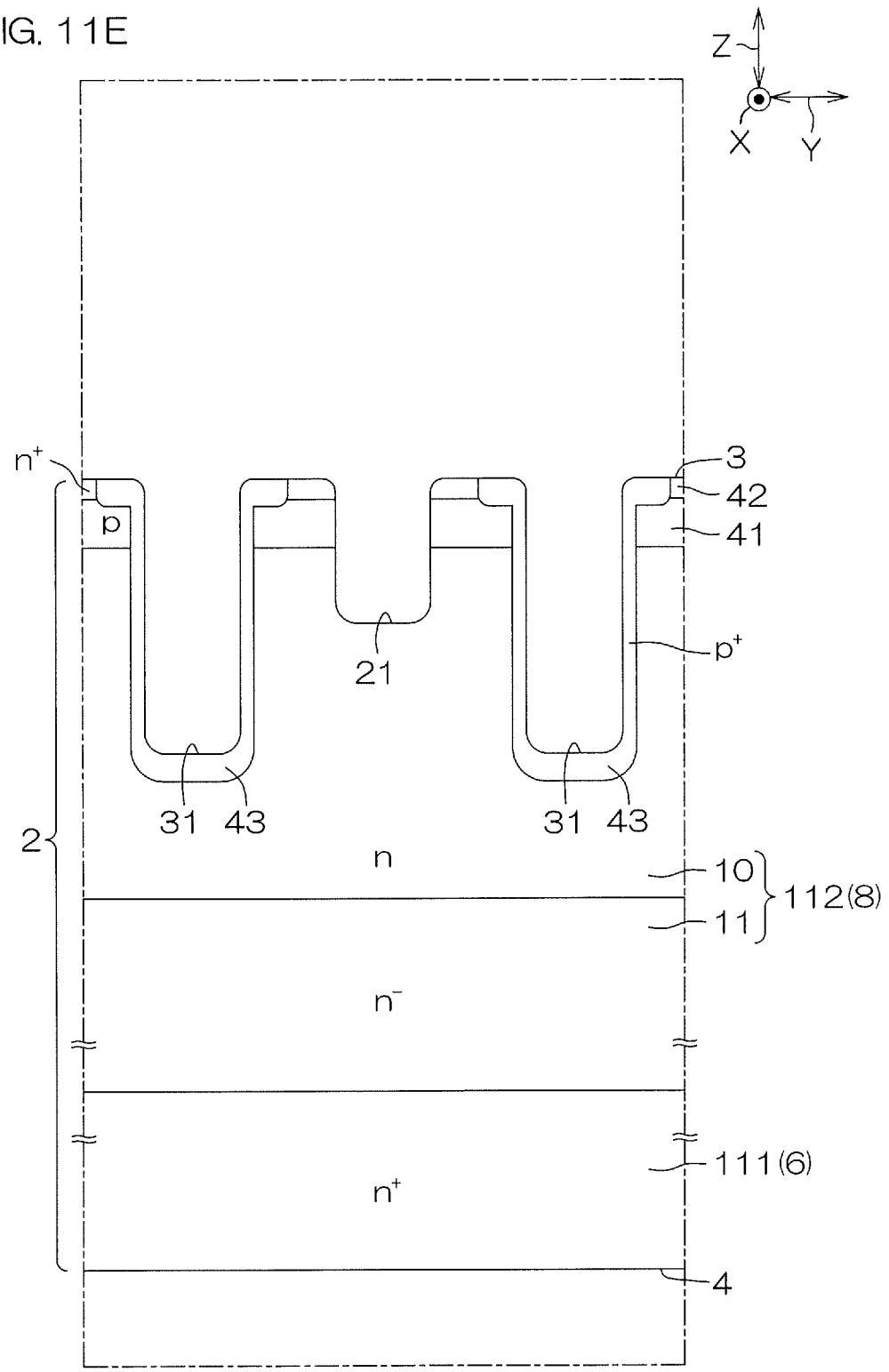
FIG. 11E is an enlarged sectional view of a step after FIG. 11D.
Figure 11F:
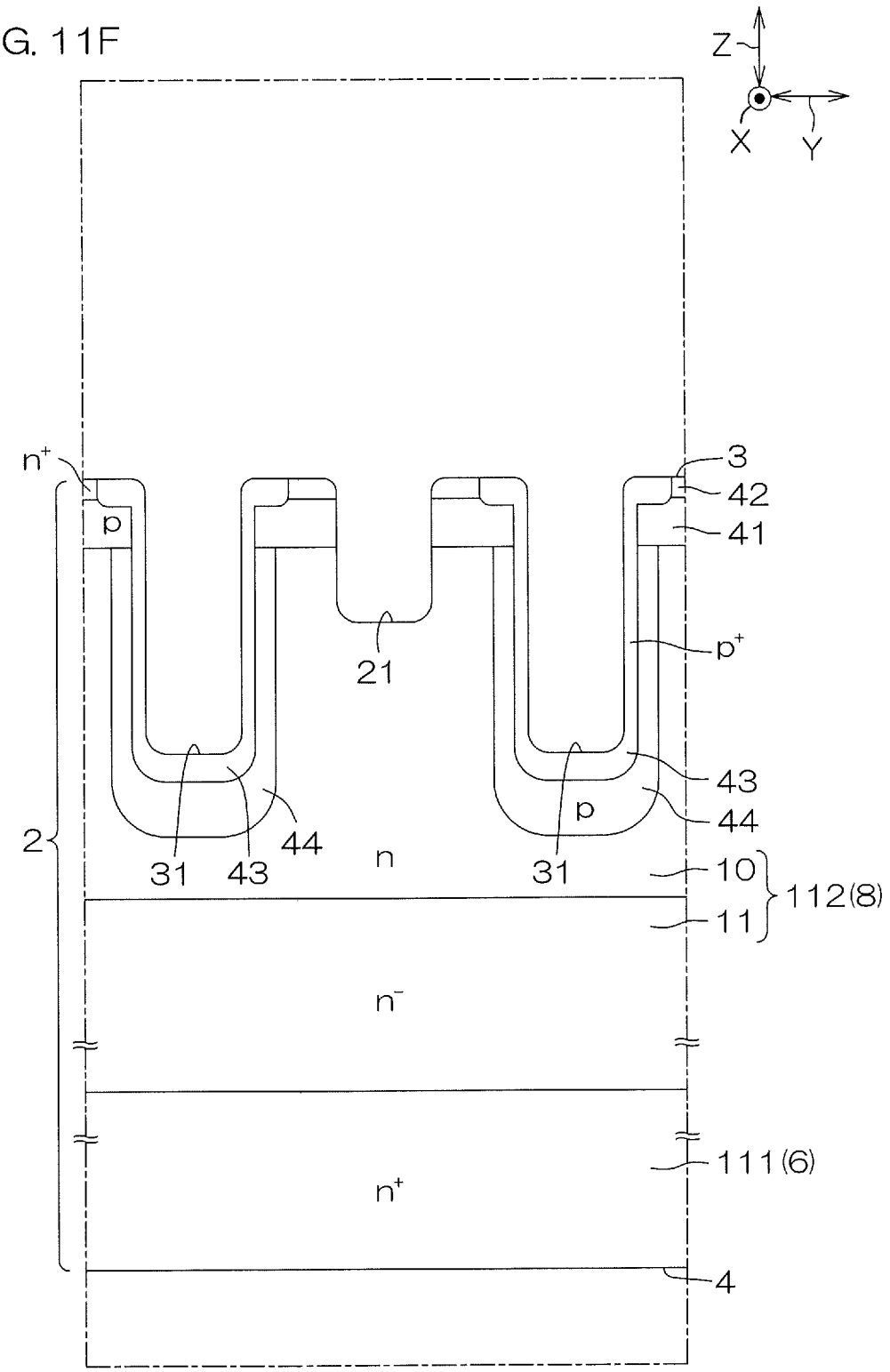
FIG. 11F is an enlarged sectional view of a step after FIG. 11E.
Figure 11G:
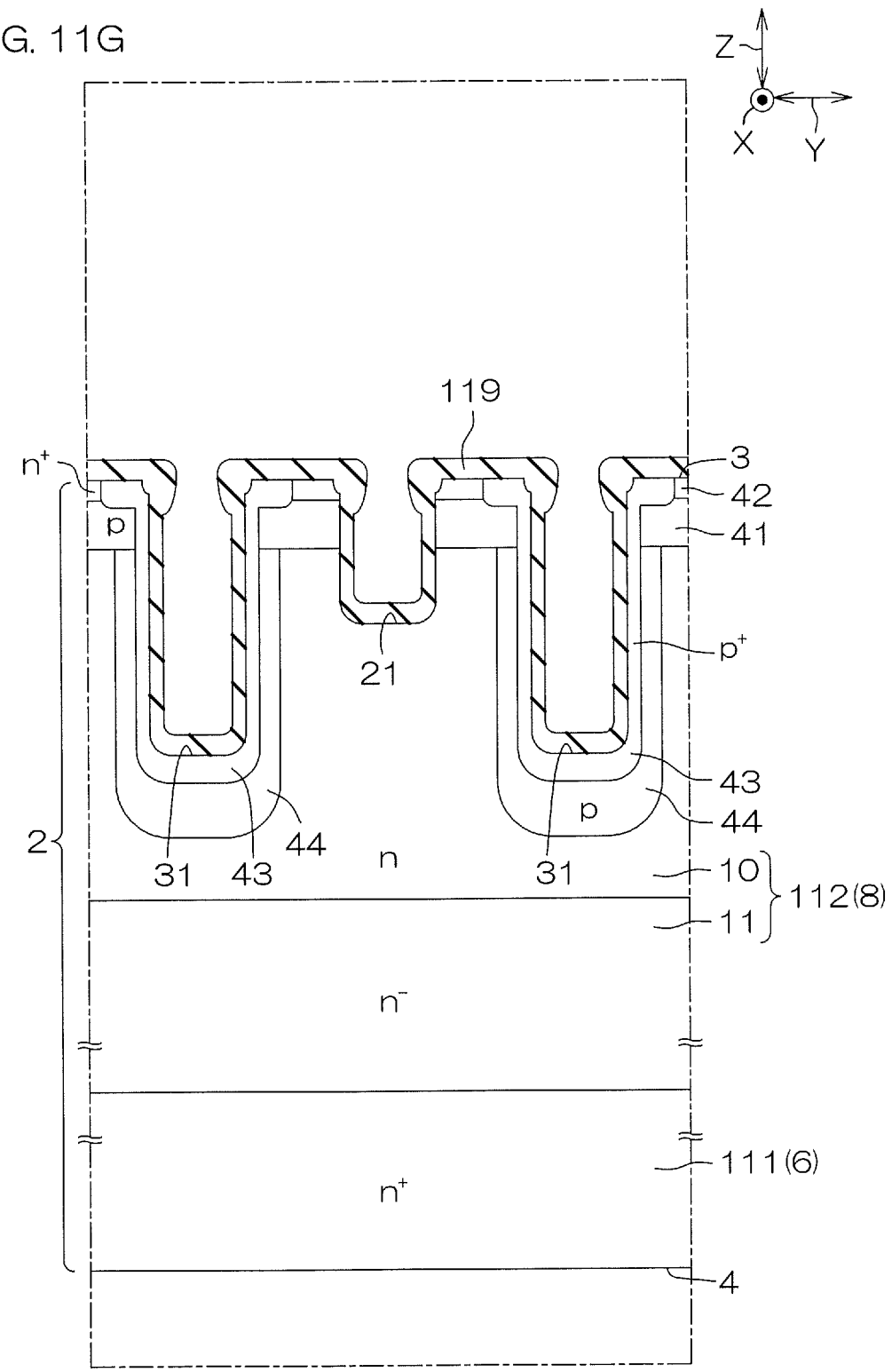
FIG. 11G is an enlarged sectional view of a step after FIG. 11F.
Figure 11H:
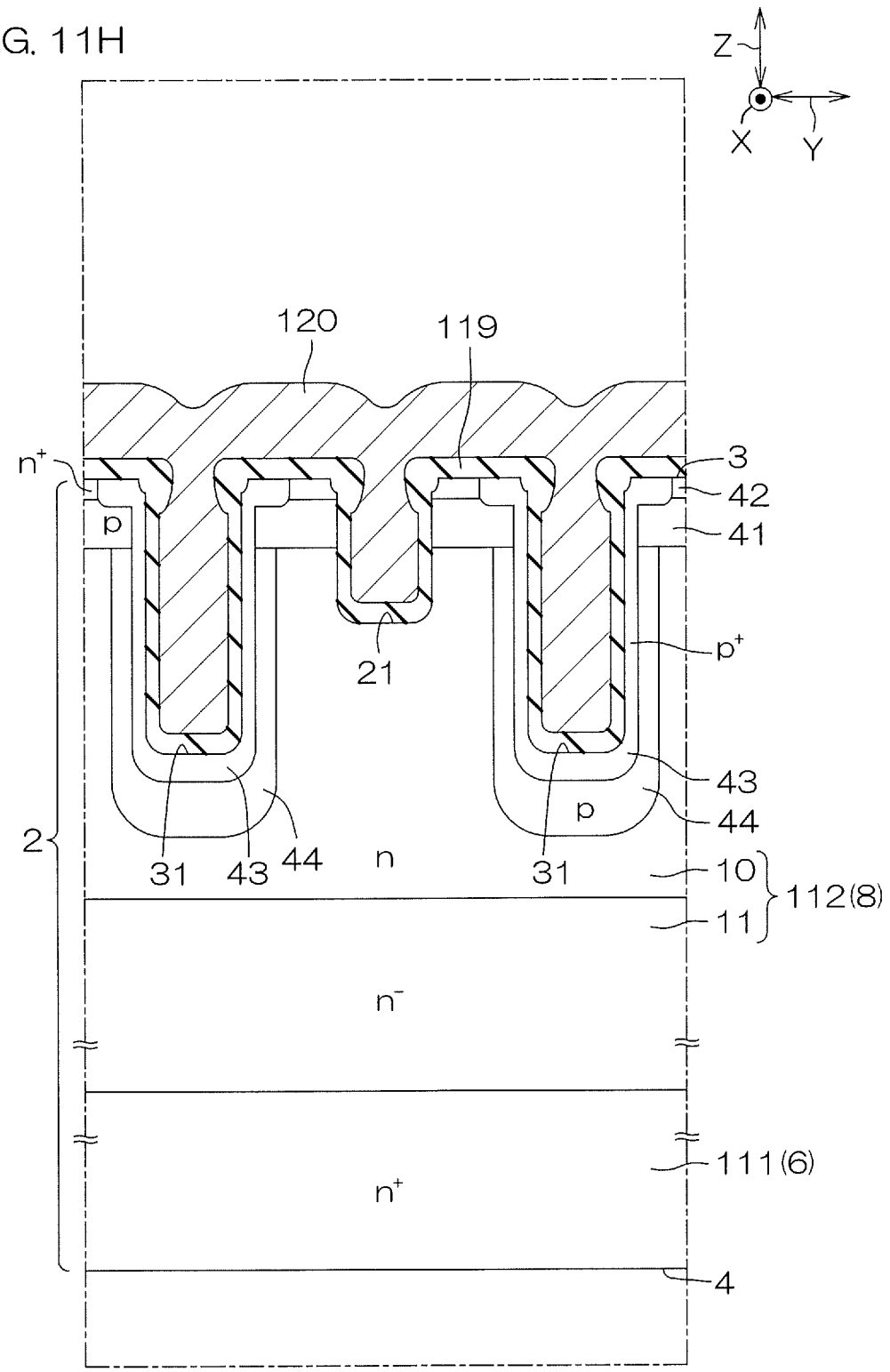
FIG. 11H is an enlarged sectional view of a step after FIG. 11G.
Figure 11J:
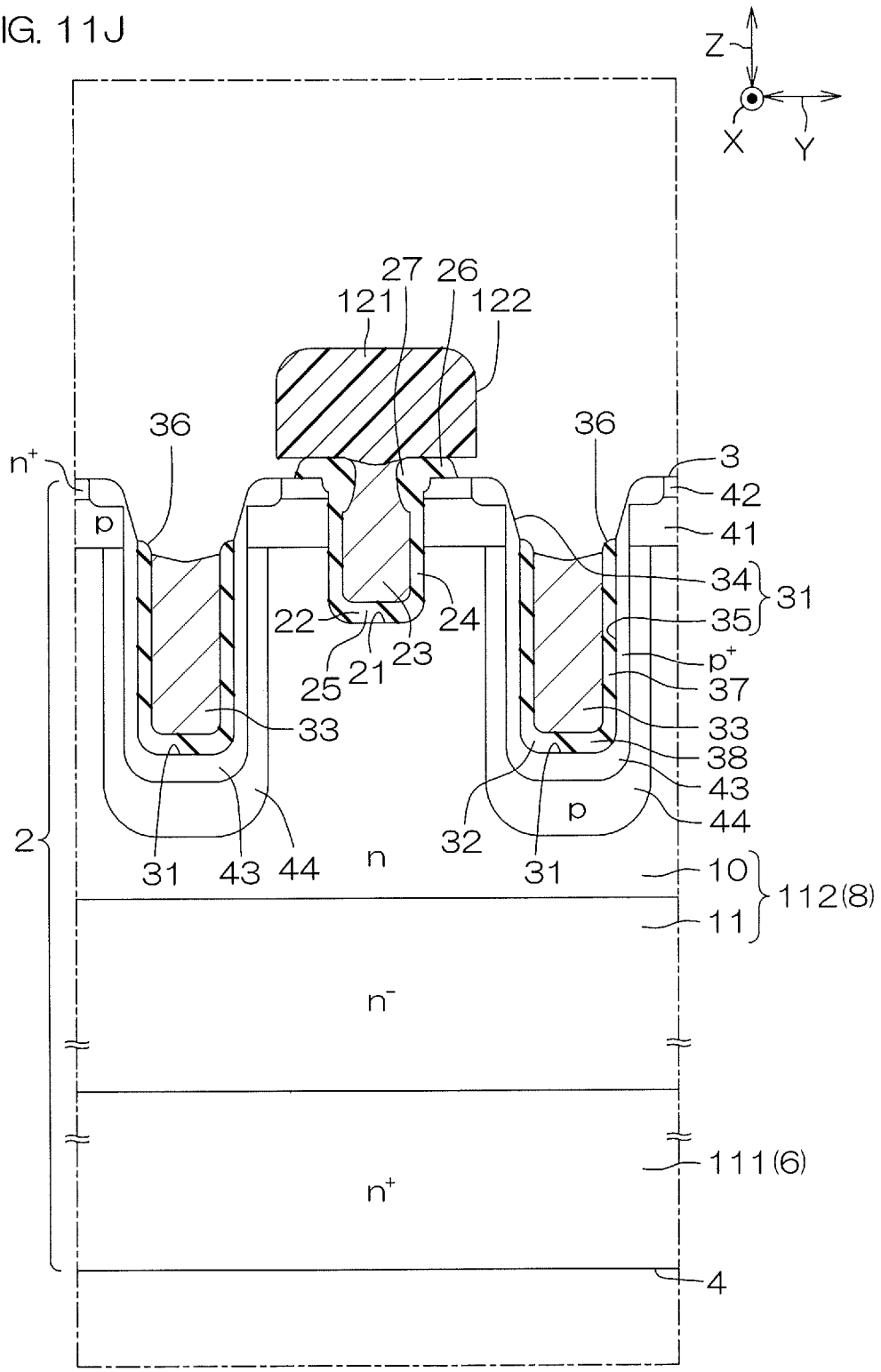
FIG. 11J is an enlarged sectional view of a step after FIG. 11I.
Figure 11K:
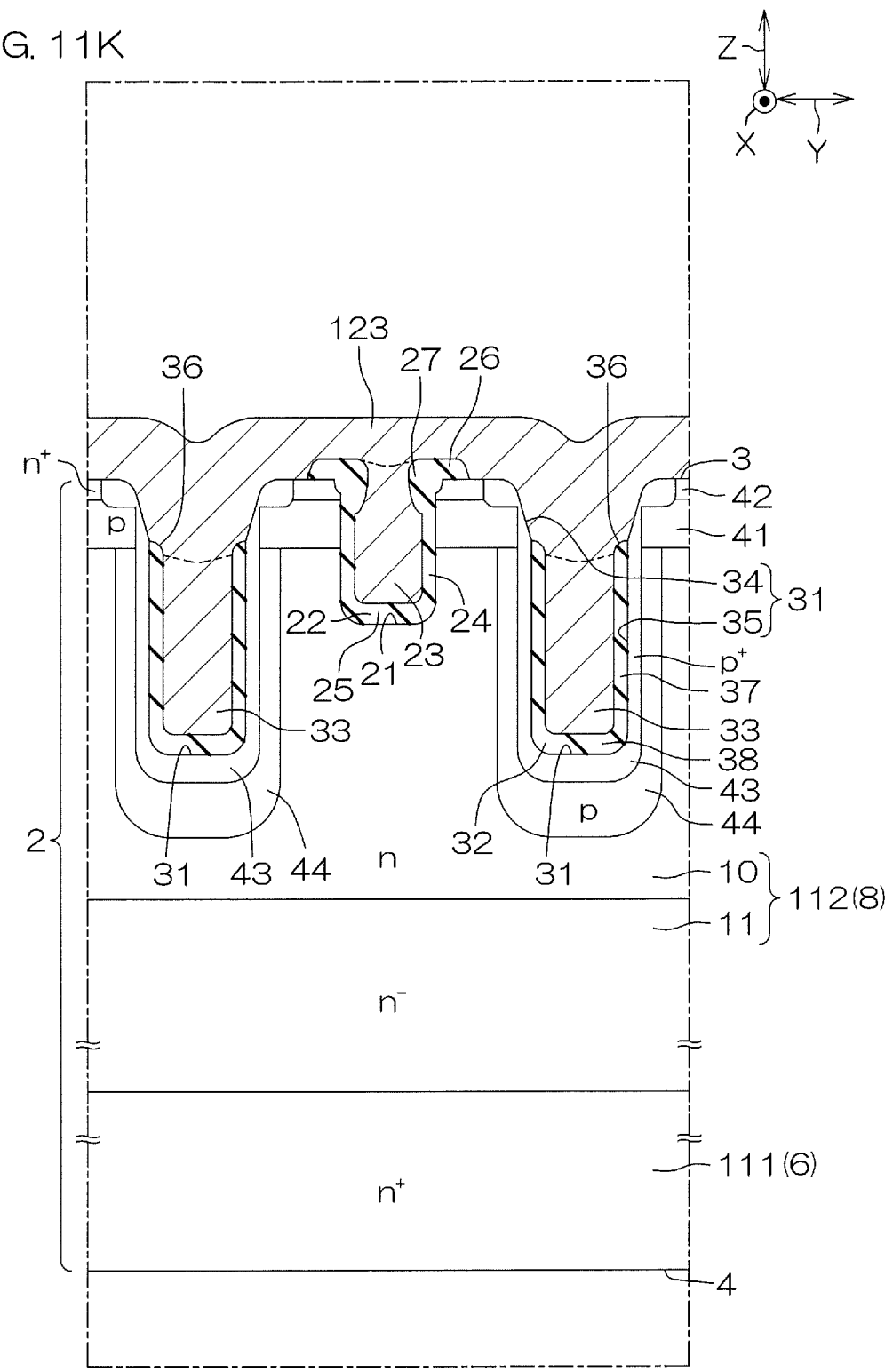
FIG. 11K is an enlarged sectional view of a step after FIG. 11J.
Figure 11L:
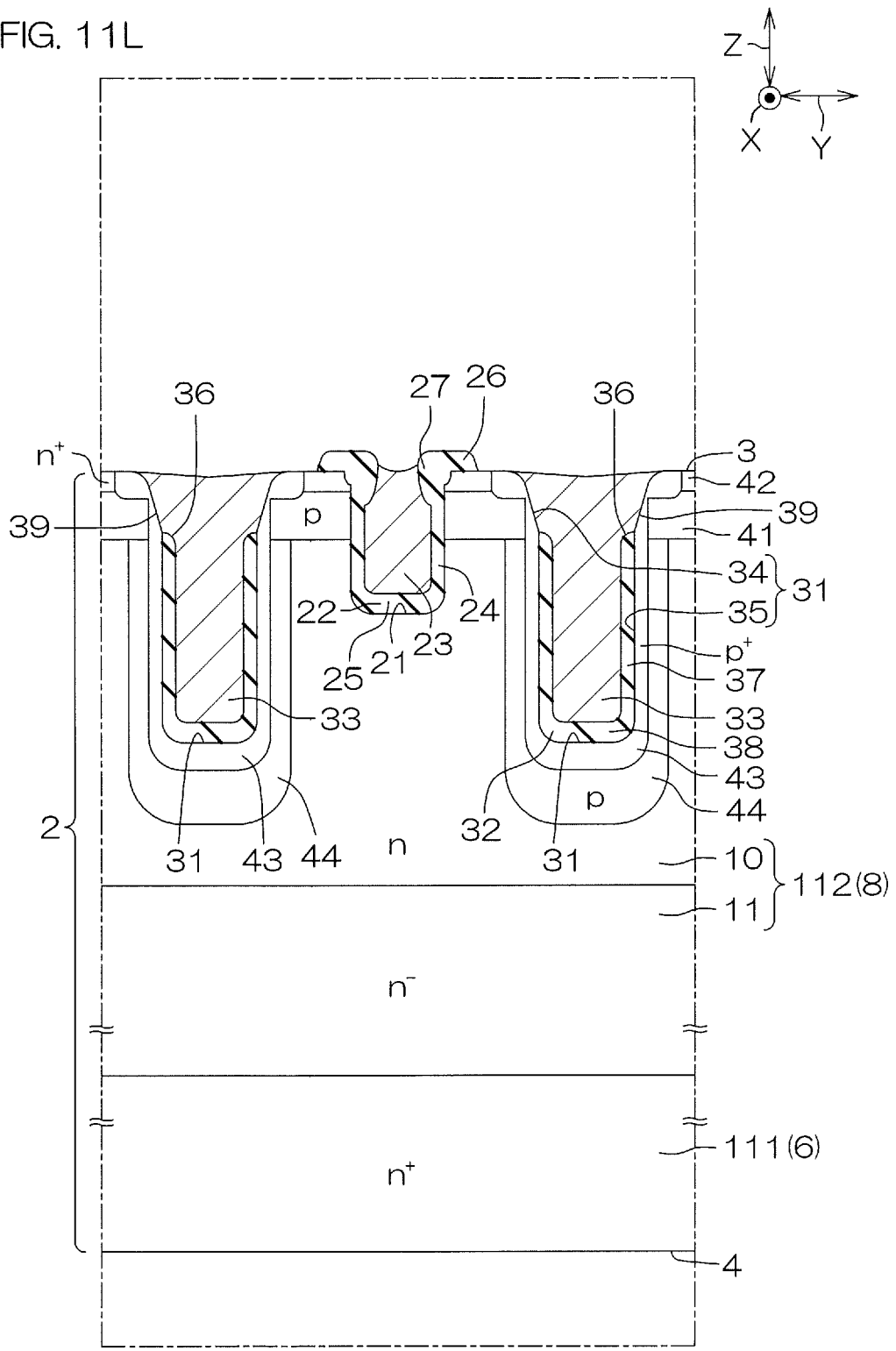
FIG. 11L is an enlarged sectional view of a step after FIG. 11K.
Figure 11M:
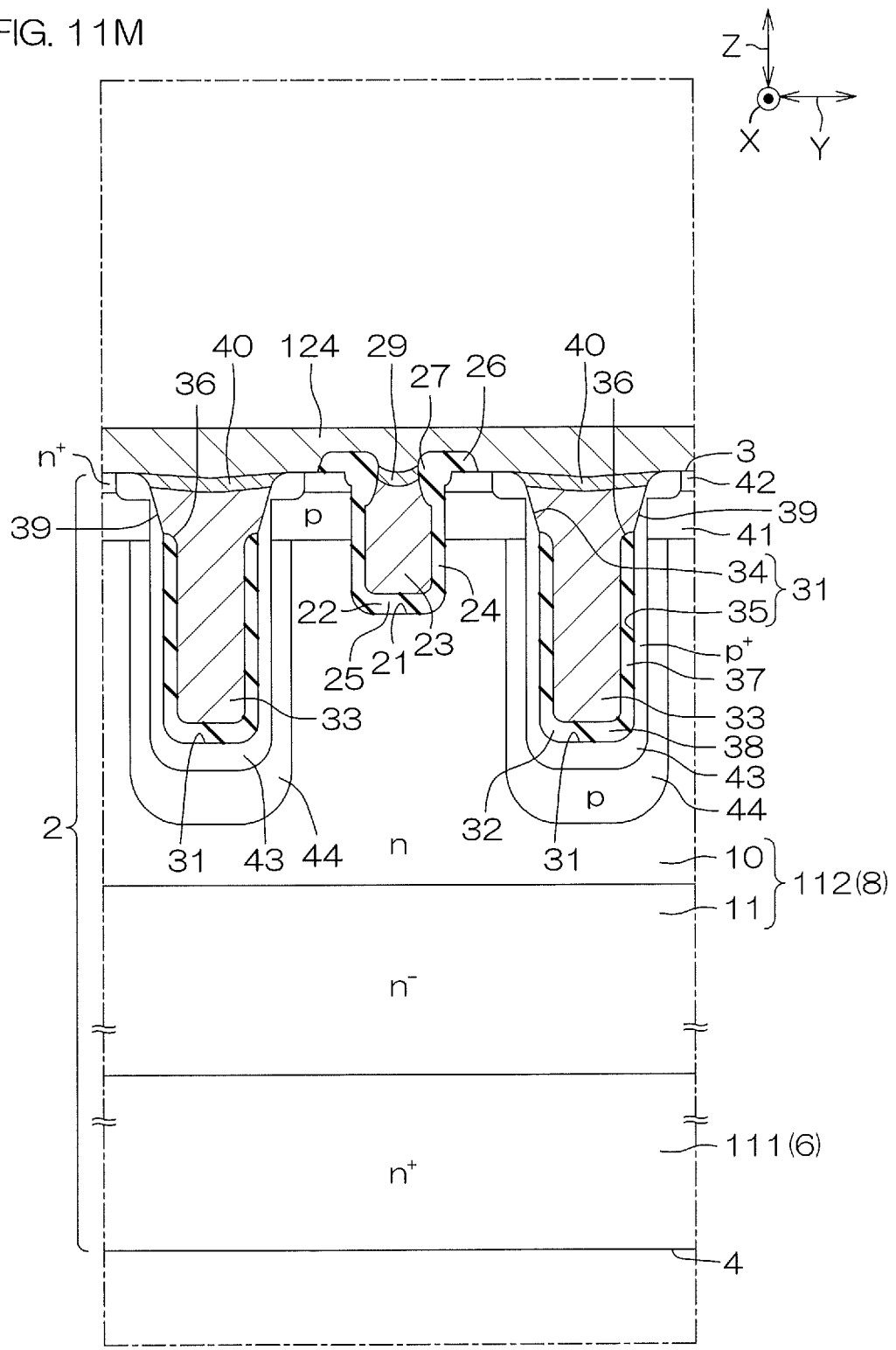
FIG. 11M is an enlarged sectional view of a step after FIG. 11L.
Figure 11N:
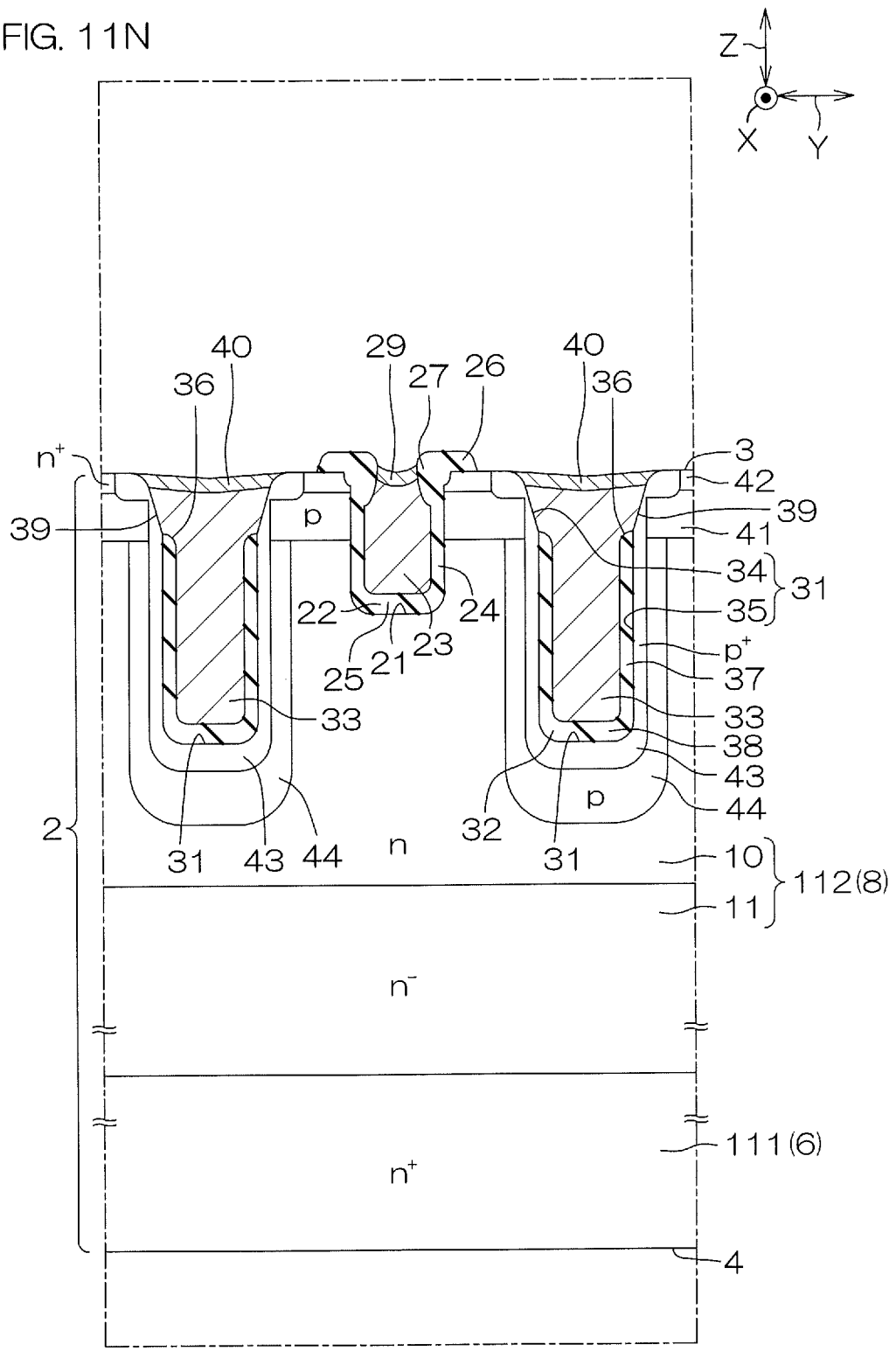
FIG. 11N is an enlarged sectional view of a step after FIG. 11M.
Figure 11O:
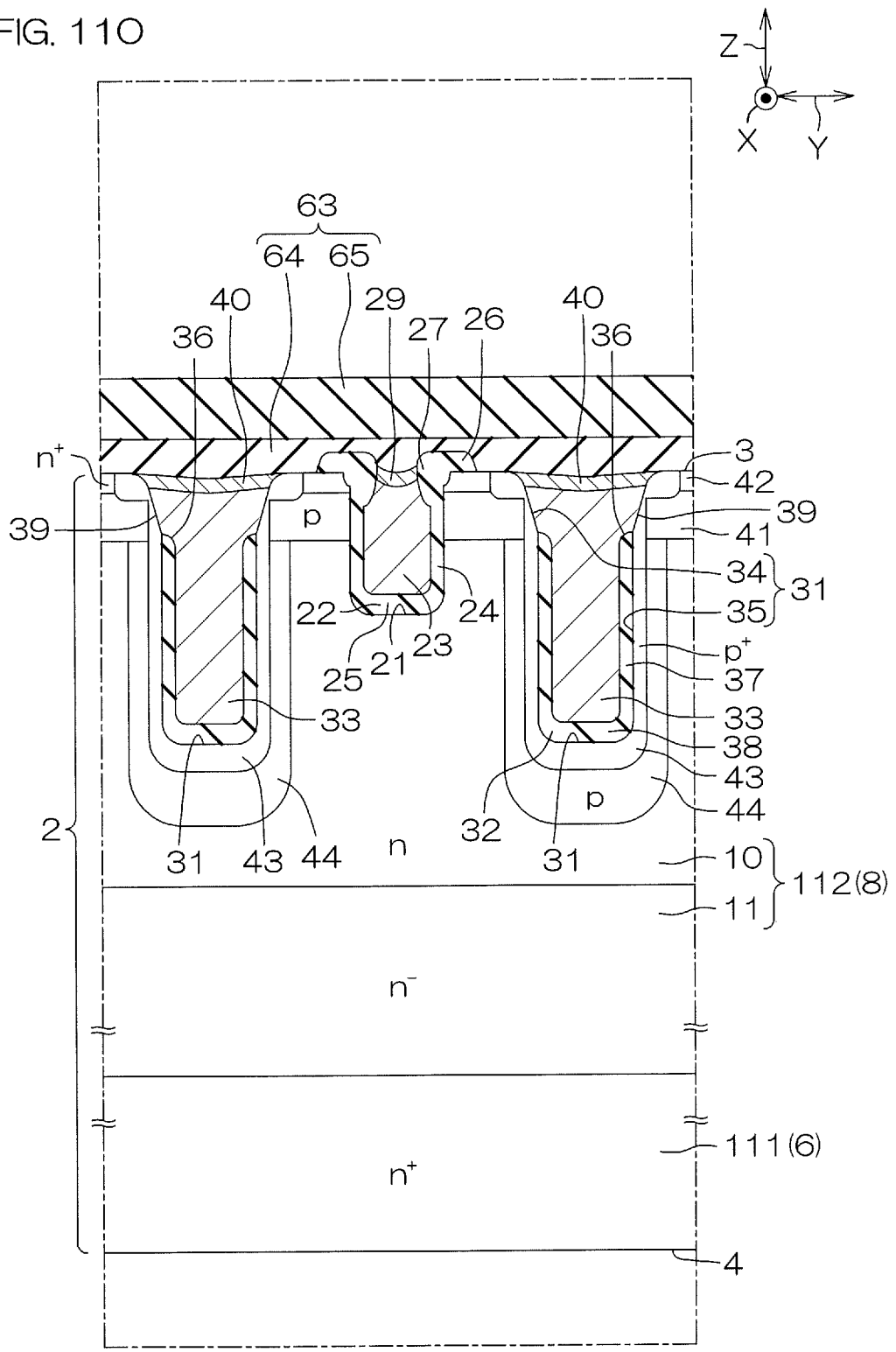
FIG. 11O is an enlarged sectional view of a step after FIG. 11N.
Figure 11P:
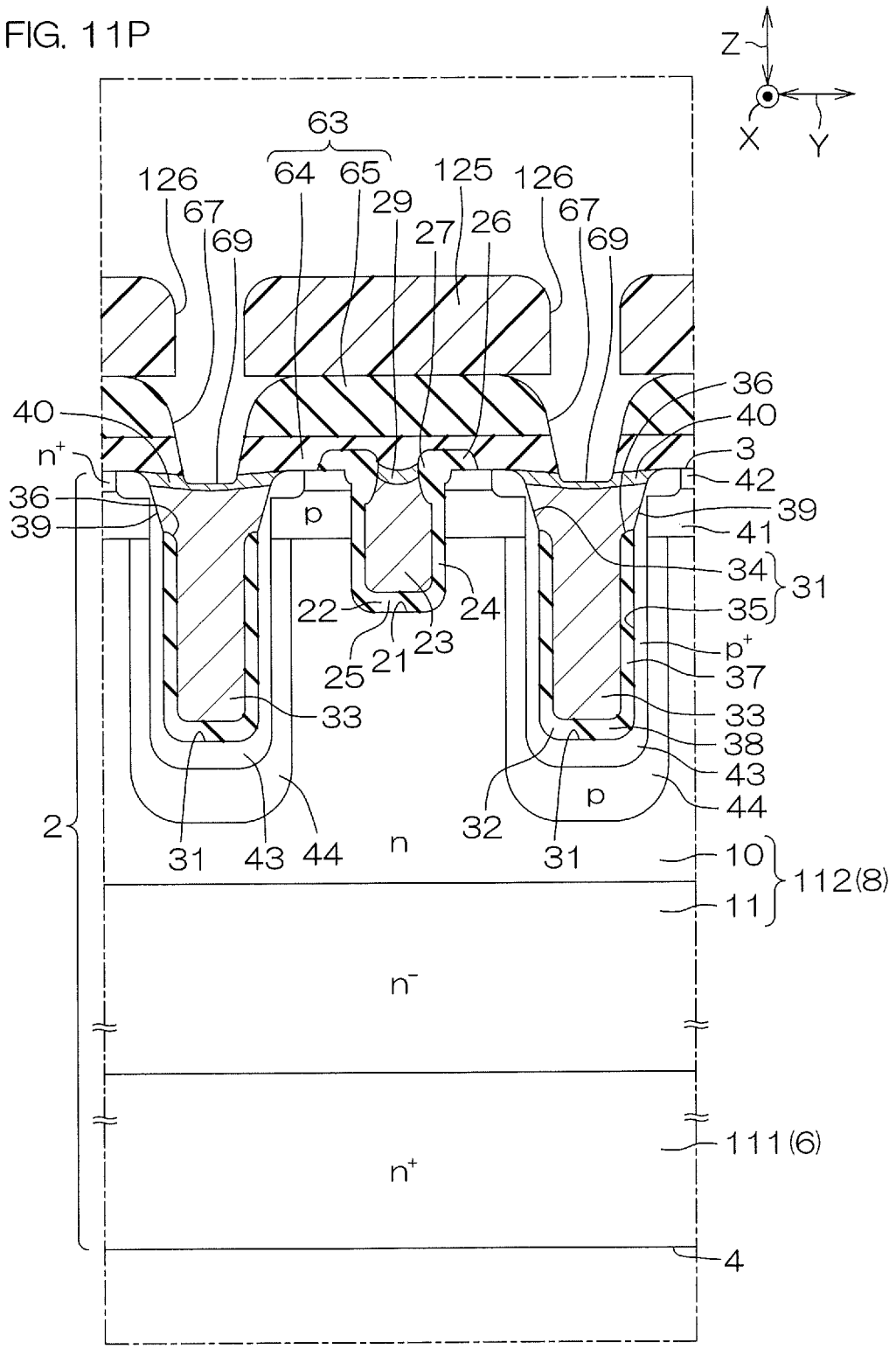
FIG. 11P is an enlarged sectional view of a step after FIG. 11O.
Figure 11S:
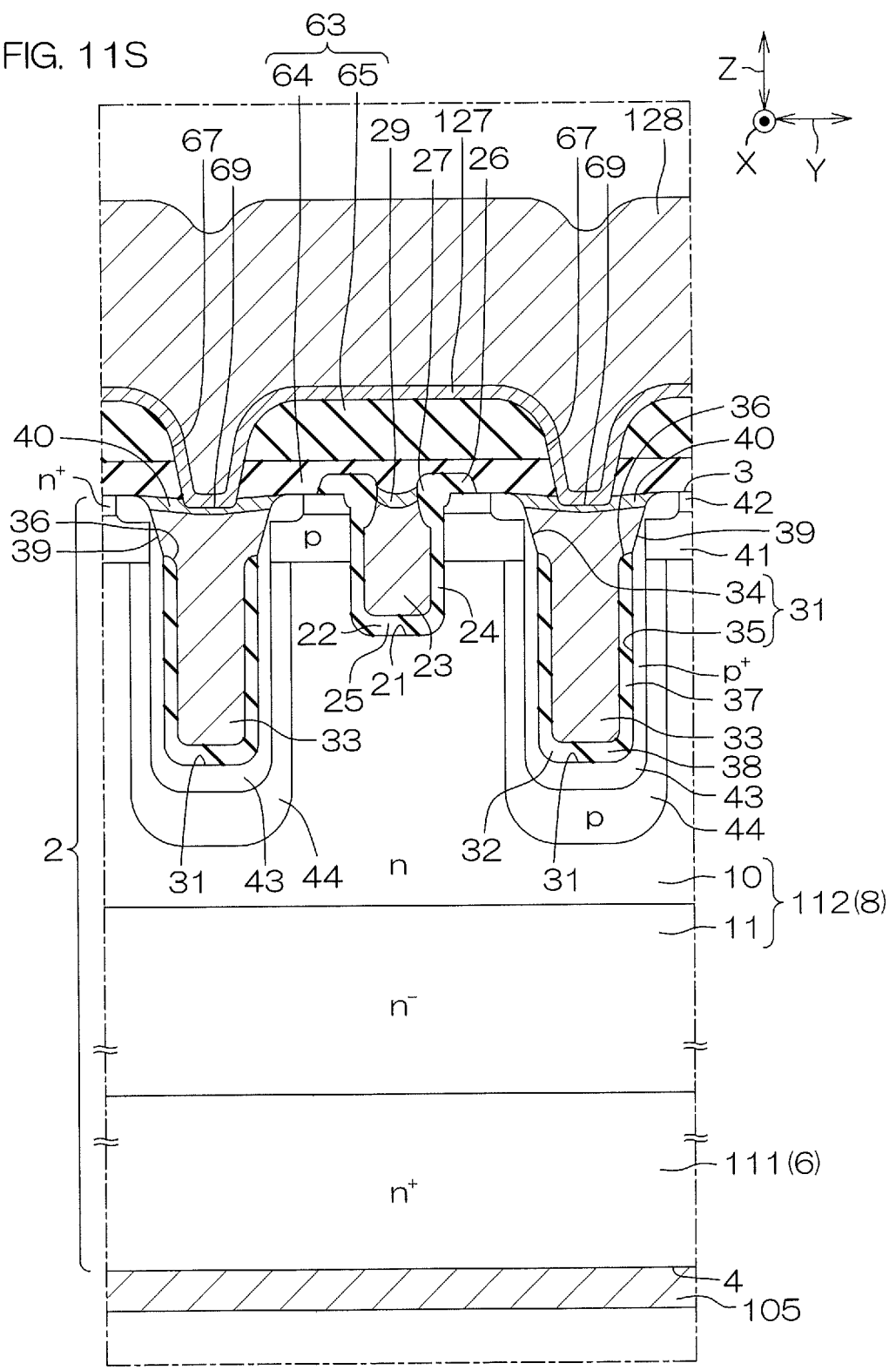
FIG. 11S is an enlarged sectional view of a step after FIG. 11S.

FIG. 11A to FIG. 11S are enlarged sectional views of an example of a method for manufacturing the SiC semiconductor device 1 shown in FIG. 1. FIG. 11A to FIG. 11S are enlarged views of the region corresponding to FIG. 8.

First, referring to FIG. 11A, an n⁺-type SiC wafer 111 that is to be a base of the drain region 6 (SiC semiconductor substrate 7) is prepared. Next, an SiC epitaxial layer 112 that is to be a base of the drift region 8 (SiC epitaxial layer 9) is formed on a main surface of the SiC wafer 111. The SiC epitaxial layer 112 is formed on the main surface of the SiC wafer 111 by an epitaxial growth method.

In this step, the SiC epitaxial layer 112 having the high concentration region 10 and the low concentration region 11 is formed by adjusting a doping amount of an n-type impurity. The SiC semiconductor layer 2 that includes the drain region 6 and the drift region 8 is thereby formed. In the following, a description shall be provided using the SiC semiconductor layer 2, the first main surface 3, and the second main surface 4.

Next, referring to FIG. 11B, the p-type body region 41 is formed in a surface layer portion of the first main surface 3. The body region 41 is formed in an entire area of the surface layer portion of the first main surface 3. The body region 41 is formed by introducing a p-type impurity into the first main surface 3. Next, an n⁺-type source region 42 is formed in a surface layer portion of the body region 41. The source region 42 is formed in a region of the surface layer portion of the body region 41 in which the channels of the MISFET are to be formed. The source region 42 is formed by introducing an n-type impurity into the surface layer portion of the body region 41.

Next, referring to FIG. 11C, a hard mask 113 having a predetermined pattern is formed on the first main surface 3. The hard mask 113 has a plurality of openings 114 exposing regions of the first main surface 3 in which the gate trenches 21, the source trenches 31, and the outer region 13 are to be formed. The hard mask 113 may include silicon oxide. The hard mask 113 may be formed by a CVD (chemical vapor deposition) method or a thermal oxidation treatment method. In this step, the hard mask 113 is formed by a thermal oxidation treatment method.

Next, unnecessary portions of the SiC epitaxial layer 112 are removed by an etching method via the hard mask 113. The etching method may be a wet etching method and/or a dry etching method. The etching method is preferably a dry etching method. The gate trenches 21 and the source trenches 31 are thereby formed in the active region 12. Also, the outer region 13 that is recessed toward the second main surface 4 side with respect to the active region 12 is formed. The hard mask 113 is thereafter removed.

Next, referring to FIG. 11D, a mask 115 having a predetermined pattern is formed on the first main surface 3. The mask 115 has a plurality of openings 116 exposing the source trenches 31 and the outer region 13. In this step, the mask 115 has a laminated structure including a polysilicon layer 117 and an insulating layer 118. The insulating layer 118 includes silicon oxide. The polysilicon layer 117 may be formed by a CVD method. The insulating layer 118 may be formed by a CVD method or a thermal oxidation treatment method. In this step, the insulating layer 118 is formed by a thermal oxidation treatment method performed on the polysilicon layer 117.

Next, unnecessary portions of the SiC epitaxial layer 112 are removed by an etching method via the mask 115. The etching method may be a wet etching method and/or a dry etching method. The etching method is preferably a dry etching method. The source trenches 31 and the outer region 13 are thereby dug in further toward the second main surface 4.

Next, referring to FIG. 11E, the deep well regions 44, the peripheral edge well regions 45, and the outer well region 56 are formed in surface layer portions of the first main surface 3. The deep well regions 44, the peripheral edge well regions 45, and the outer well region 56 are formed by introducing a p-type impurity into the first main surface 3. The p-type impurity is introduced into the outer main surface 52 via an ion implantation mask. The p-type impurity may be introduced into the outer main surface 52 via the mask 115 in addition to the ion implantation mask.

Next, the plurality of FL regions 58 are (the FL structure 57 is) formed in surface layer portions of the first main surface 3 (outer main surface 52). The plurality of FL structures 57 are formed by introducing a p-type impurity into the first main surface 3. The p-type impurity is introduced into the outer main surface 52 via an ion implantation mask.

Next, referring to FIG. 11F, the contact regions 43 and the diode region 55 are formed in surface layer portions of the first main surface 3. The contact regions 43 and the diode region 55 are formed by introducing a p-type impurity into the first main surface 3. The p-type impurity is introduced into the first main surface 3 via an ion implantation mask.

Next, referring to FIG. 11G, a base insulating layer 119 that is to be a base of the gate insulating layers 22, the source insulating layers 32, and the outer insulating layer 61 is formed on the first main surface 3. The base insulating layer 119 may include silicon oxide.

The base insulating layer 119 may be formed by a CVD method or a thermal oxidation treatment method. Of the base insulating layer 119, portions covering the side walls of the gate trenches 21 and portions covering the side walls of the source trenches 31 are formed thinner than other portions. Also, of the base insulating layer 119, portions covering the opening edge portions of the gate trenches 21 and portions covering the opening edge portions of the source trenches 31 are formed thicker than other portions.

The base insulating layer 119 having such a structure is formed by adjusting conditions of the CVD method or the thermal oxidation treatment method. For example, predetermined conditions such as a gas flow rate, gas type, gas ratio, gas supply time, temperature, etc., of the CVD method or the thermal oxidation treatment method should be adjusted.

Next, referring to FIG. 11H, a first polysilicon layer 120 that is to be a base of the gate electrodes 23, the gate wiring 28, and the source electrodes 33 is formed on the first main surface 3. The first polysilicon layer 120 fills the gate trenches 21 and the source trenches 31 and covers the first main surface 3.

The first polysilicon layer 120 may be formed by a CVD method. The CVD method may be an LP-CVD (low pressure-CVD) method. The first polysilicon layer 120 is constituted of a conductive polysilicon imparted with conductivity by a p-type impurity. The p-type impurity may be doped into the first polysilicon layer 120 at the same time as the CVD method or may be doped separately after the CVD method.

Next, referring to FIG. 11I, unnecessary portions of the first polysilicon layer 120 are removed. The unnecessary portions of the first polysilicon layer 120 are removed until the base insulating layer 119 is exposed. The unnecessary portions of the first polysilicon layer 120 may be removed by an etching method. The etching method may be a wet etching method and/or a dry etching method. The gate electrodes 23, the gate wiring 28, and the source electrodes 33 are thereby formed.

In this step, a portion of the first polysilicon layer 120 remains in a state of being attached to the active side walls 54. The side wall structure 62 that includes the portion of the first polysilicon layer 120 is thereby formed. The side wall structure 62 is formed self-aligningly with respect to the active main surface 51.

Next, referring to FIG. 11J, a resist mask 121 having a predetermined pattern is formed on the first main surface 3. The resist mask 121 has openings 122 that expose the source trenches 31, portions of the source regions 42, and the contact regions 43 and covers regions besides these.

Next, unnecessary portions of the source insulating layers 32 and unnecessary portions of the source electrodes 33 are removed by an etching method via the resist mask 121. In this step, portions of the SiC epitaxial layer 112 are also removed. The source trenches 31 each having the first trench portion 34 and the second trench portion 35 are thereby formed. Also, the side wall window portions 36 exposing the first trench portions 34 of the source trenches 31 are formed in the source insulating layer 32. The resist mask 121 is thereafter removed.

Next, referring to FIG. 11K, a second polysilicon layer 123 that is to be a base of the source electrodes 33 is formed on the first main surface 3. The second polysilicon layer 123 fills the first trench portions 34 of the source trenches 31 and covers the first main surface 3.

The second polysilicon layer 123 may be formed by a CVD method. The CVD method may be an LP-CVD (low pressure-CVD) method. The second polysilicon layer 123 is constituted of a conductive polysilicon imparted with conductivity by a p-type impurity. The p-type impurity may be doped into the second polysilicon layer 123 at the same time as the CVD method or may be doped separately after the CVD method.

Next, referring to FIG. 11L, unnecessary portions of the second polysilicon layer 123 are removed. The unnecessary portions of the second polysilicon layer 123 are removed until the first main surface 3 is exposed. The unnecessary portions of the second polysilicon layer 123 may be removed by an etching method. The etching method may be a wet etching method and/or a dry etching method. The source electrodes 33 are thereby formed again.

In this step, a portion of the second polysilicon layer 123 remains in a state of being attached to the active side walls 54. The side wall structure 62 that includes the portion of the second polysilicon layer 123 is thereby formed. The side wall structure 62 is formed self-aligningly with respect to the active main surface 51.

Next, referring to FIG. 11M, a metal layer 124 that covers the gate electrodes 23, the gate wiring 28, and the source electrodes 33 is formed on the first main surface 3. The metal layer 124 includes a metal material that is capable of polyciding with the p-type polysilicon. The metal layer 124 may include at least one among Mo, W, Ni, Co, and Ti. The metal layer 124 may be formed by a CVD method, a sputter method, and/or a vapor deposition method.

Next, p-type polycide layers are formed in surface layer portions of the gate electrodes 23, a surface layer portion of the gate wiring 28, and surface layer portions of the source electrode 33 by performing a heat treatment method on the metal layer 124. The heat treatment method may be an RTA (rapid thermal annealing) method. The p-type polycide layers including at least one among TiSi, $TiSi_2$, NiSi, CoSi, $CoSi_2$, $MoSi_2$, and $WSi_2$ are thereby formed. The first low resistance layer 29 and the second low resistance layers 40 are formed by the p-type polycide layers.

Next, referring to FIG. 11N, unreacted portions of the metal layer 124 are removed. The unreacted portions of the metal layer 124 may be removed by an etching method. The etching method may be a wet etching method and/or a dry etching method.

If the first low resistance layer 29 and the second low resistance layers 40 include TiSi or CoSi, a heat treatment method may be applied again to the first low resistance layer 29 and the second low resistance layers 40 after removal of the unreacted portions of the metal layer 124. The heat treatment method to be performed on the first low resistance layer 29 and the second low resistance layers 40 may be an RTA method. The TiSi can thereby be modified to $TiSi_2$ and the CoSi can be modified to $CoSi_2$.

Next, referring to FIG. 11O, the interlayer insulating layer 63 is formed on the first main surface 3. The interlayer insulating layer 63 covers the active region 12 and the outer region 13 altogether. The interlayer insulating layer 63 includes the first insulating layer 64 and the second insulating layer 65. The first insulating layer 64 is constituted of a USG layer. The second insulating layer 65 is constituted of a BPSG layer. The first insulating layer 64 and the second insulating layer 65 may be formed by a CVD method.

Next, referring to FIG. 11P, a resist mask 125 having a predetermined pattern is formed on the interlayer insulating layer 63. The resist mask 125 has a plurality of openings 126 exposing regions at which the gate hole 66, the source holes 67, the diode hole 68, and the anchor hole 102 are to be formed.

Next, unnecessary portions of the interlayer insulating layer 63 are removed by an etching method via the resist mask 125. The etching method may be a wet etching method and/or a dry etching method. The etching method is preferably a dry etching method. The gate hole 66, the source holes 67, the diode hole 68, and the anchor hole 102 are thereby formed.

Thereafter, a heat treatment method may be performed on the interlayer insulating layer 63. The opening edge portion of the gate hole 66, the opening edge portions of the source holes 67, the opening edge portion of the diode hole 68, and the opening edge portion of the anchor hole 102 are thereby rounded to curved shapes.

Next, referring to FIG. 11Q, a base barrier layer 127 that is to be a base of the first barrier layer 76 and the second barrier layer 87 is formed on the interlayer insulating layer 63. The base barrier layer 127 has a laminated structure including a Ti layer and a TiN layer that are laminated in that order from the interlayer insulating layer 63 side. The Ti layer and the TiN layer may be formed respectively by a sputter method.

Next, referring to FIG. 11R, a base main body layer 128 that is to be a base of the first main body layer 77 and the second main body layer 88 is formed on the base barrier layer 127. The base main body layer 128 includes at least one among a pure Al layer, an AlSi alloy layer, an AlCu alloy layer, and an AlSiCu alloy layer. The base main body layer 128 may be formed by a sputter method.

Next, unnecessary portions of the laminated structure that includes the base barrier layer 127 and the base main body layer 128 are removed by an etching method via a resist mask (not shown). The etching method may be a wet etching method and/or a dry etching method. The etching method is preferably a dry etching method. The gate main surface electrode 71 and the source main surface electrode 81 are thereby formed.

Next, the insulating layer 91 is formed on the interlayer insulating layer 63. The insulating layer 91 has the laminated structure that includes the passivation layer 94 and the resin layer 95. The passivation layer 94 may be formed by a CVD method. The resin layer 95 may be formed by coating a photosensitive resin on the passivation layer 94. Next, the resin layer 95 is exposed selectively and thereafter developed. The second gate opening 98, the second source opening 99, and the dicing street DS are thereby formed in the resin layer 95.

Next, portions of the passivation layer 94 exposed from the second gate opening 98, the second source opening 99, and the dicing street DS are removed. The unnecessary portions of the passivation layer 94 may be removed by an etching method via the resin layer 95. The etching method may be a wet etching method and/or a dry etching method.

The first gate opening 96, the first source opening 97, and the dicing street DS are thereby formed in the passivation layer 94. The first gate opening 96 demarcates the gate pad opening 92 with the second gate opening 98. The first source opening 97 demarcates the source pad opening 93 with the second source opening 99.

Next, referring to FIG. 11S, the drain electrode 105 is formed on the second main surface 4. The drain electrode 105 includes at least one among a Ti layer, an Ni layer, a Pd layer, an Au layer, an Ag layer, and an Al layer. The Ti layer, the Ni layer, the Pd layer, the Au layer, the Ag layer, and/or the Al layer may be formed by a sputter method, a vapor deposition method, a CVD method, and/or a plating method.

The second main surface 4 may be ground prior to the step of forming the drain electrode 105. The SiC semiconductor layer 2 may thereby be thinned to a desired thickness. Also, an annealing treatment by a laser irradiation method may be performed on the ground second main surface 4.

Thereafter, the SiC semiconductor layer 2 is cut along the dicing street DS. A plurality of SiC semiconductor devices 1 are thereby cut out from a single SiC wafer 111. The SiC semiconductor device 1 is formed by steps including the above.

FIG. 12 is an enlarged view of a region corresponding to FIG. 8 and is a diagram partially showing an SiC semiconductor device 131 according to a second preferred embodiment of the present invention. In the following, structures corresponding to the structures described with respect to the SiC semiconductor device 1 shall be provided with the same reference signs and description thereof shall be omitted.

Referring to FIG. 12, in this embodiment, the source insulating layers 32 each have a bottom wall window portion 132 that exposes the bottom wall of the corresponding source trench 31. In this embodiment, the bottom wall window portion 132 exposes a central portion of the bottom wall at intervals from the side walls of the source trench 31. The bottom wall window portion 132 may expose the side walls and the bottom wall of the source trench 31 at the bottom wall side of the source trench 31.

In this embodiment, the bottom wall of the source trench 31 has a recess 133 recessed toward the second main surface 4 side. The recess 133 exposes the central portion of the bottom wall at intervals from the side walls of the source trench 31. The bottom wall window portion 132 is in communication with the recess 133.

The source electrodes 33 each have a bottom wall contact portion 134 in contact with the bottom wall (recess 133) of the source trench 31 exposed from the bottom wall window portion 132. A portion of each contact region 43 that covers the bottom wall of the source trench 31 is electrically connected to the bottom wall contact portion 134 of the corresponding source electrode 33.

Each deep well region 44 includes portions that are electrically connected to the bottom wall contact portion 134 of the corresponding source electrode 33 via the contact regions 43 at the bottom wall of the corresponding source trench 31. Each deep well region 44 includes a portion that is electrically connected to the bottom wall contact portion 134 of the source electrode 33 at the bottom wall of the source trench 31.

With the SiC semiconductor device 131 described above, the same effects as the effects described for the SiC semiconductor device 1 can be exhibited. Also, with the SiC semiconductor device 131, the source electrodes 33 each have the side wall contact portion 39 exposed from the side wall window portion 36 and the bottom wall contact portion 134 exposed from the bottom wall window portion 132. The contact regions 43 are electrically connected to the side wall contact portions 39 of the source electrodes 33 at the opening sides of the source trenches 31 and are electrically connected to the bottom wall contact portions 134 of the source electrodes 33 at the bottom wall sides of the source trenches 31.

When a negative drain-source voltage VGS is applied across the source electrodes 33 and the drain electrode 105, the MISFET performs a third quadrant operation. In the third quadrant operation, a forward current flows through the pn junction diode formed by the body region 41 (deep well regions 44). The forward current flows from the source electrodes 33 toward the drain electrode 105 and is thus a reverse current with respect to the MISFET.

The forward current of the pn junction diode flows from the side wall contact portions 39 of the source electrodes 33 into the drift region 8 via the side wall window portions 36 and, at the same time, flows from the bottom wall contact portions 134 of the source electrodes 33 into the drift region 8 via the bottom wall window portions 132. Current paths of the forward current of the pn junction diode are thereby increased and an on resistance can thus be reduced. Consequently, forward characteristics of the pn junction diode can be improved.

With this embodiment, an example where the recesses 133 of the source trenches 31 are covered by the contact regions 43 was described. However, source trenches 31 not having the recesses 133 may be formed. Also, recesses 133 that penetrate through the contact regions 43 may be formed. In other words, contact regions 43 that cover side walls of the recesses 133 and expose bottom walls of the recesses 133 may be formed.

FIG. 13A to FIG. 13H are enlarged sectional views of an example of a method for manufacturing the SiC semiconductor device 131 shown in FIG. 12.

Figure 13A:
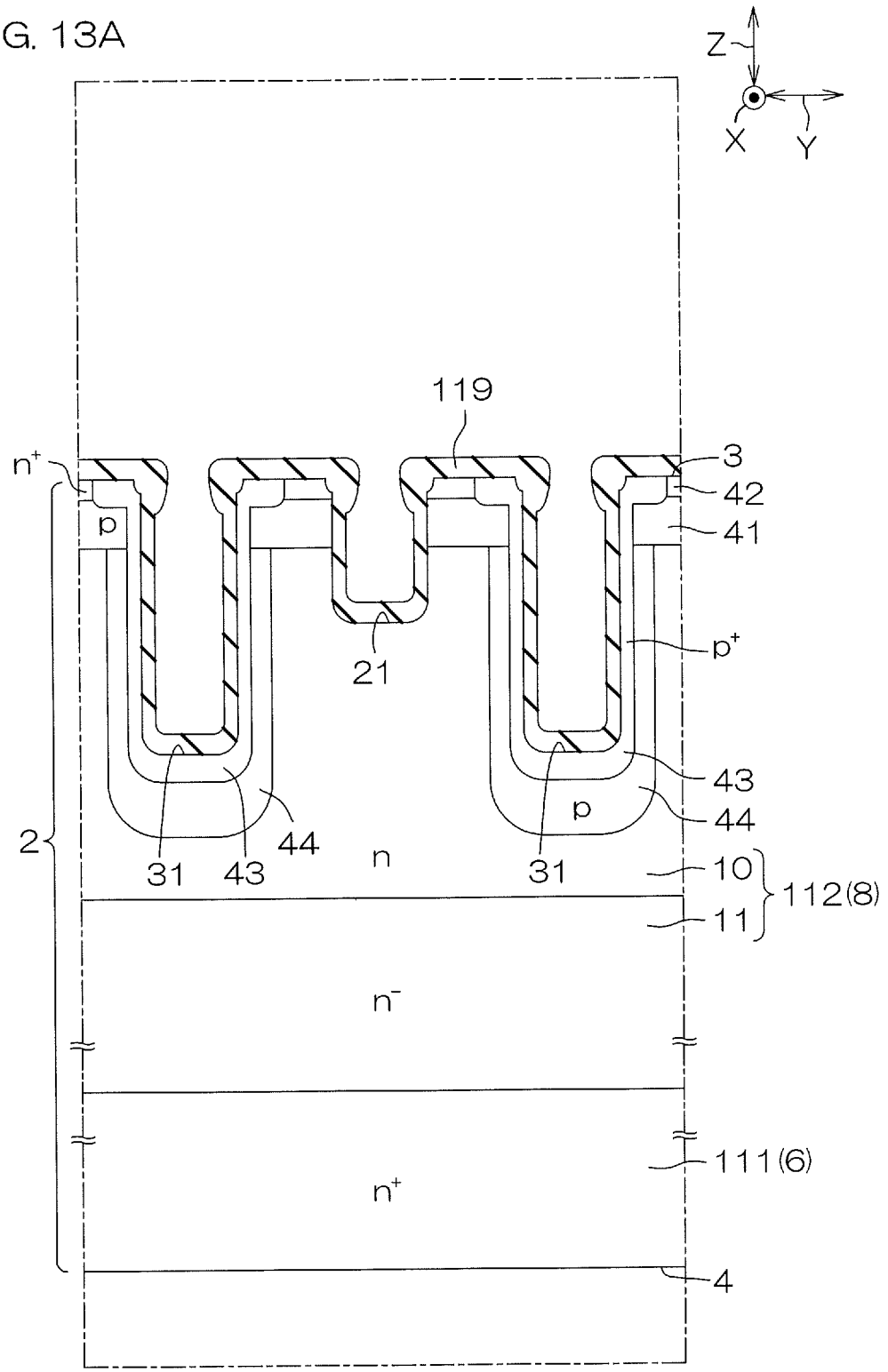
FIG. 13A is an enlarged sectional view of an example of a method for manufacturing the SiC semiconductor device shown in FIG. 12.

Referring to FIG. 13A, the SiC semiconductor layer 2 in the state where the base insulating layer 119 is formed is prepared through the steps of FIG. 11A to FIG. 11G.

Figure 13B:
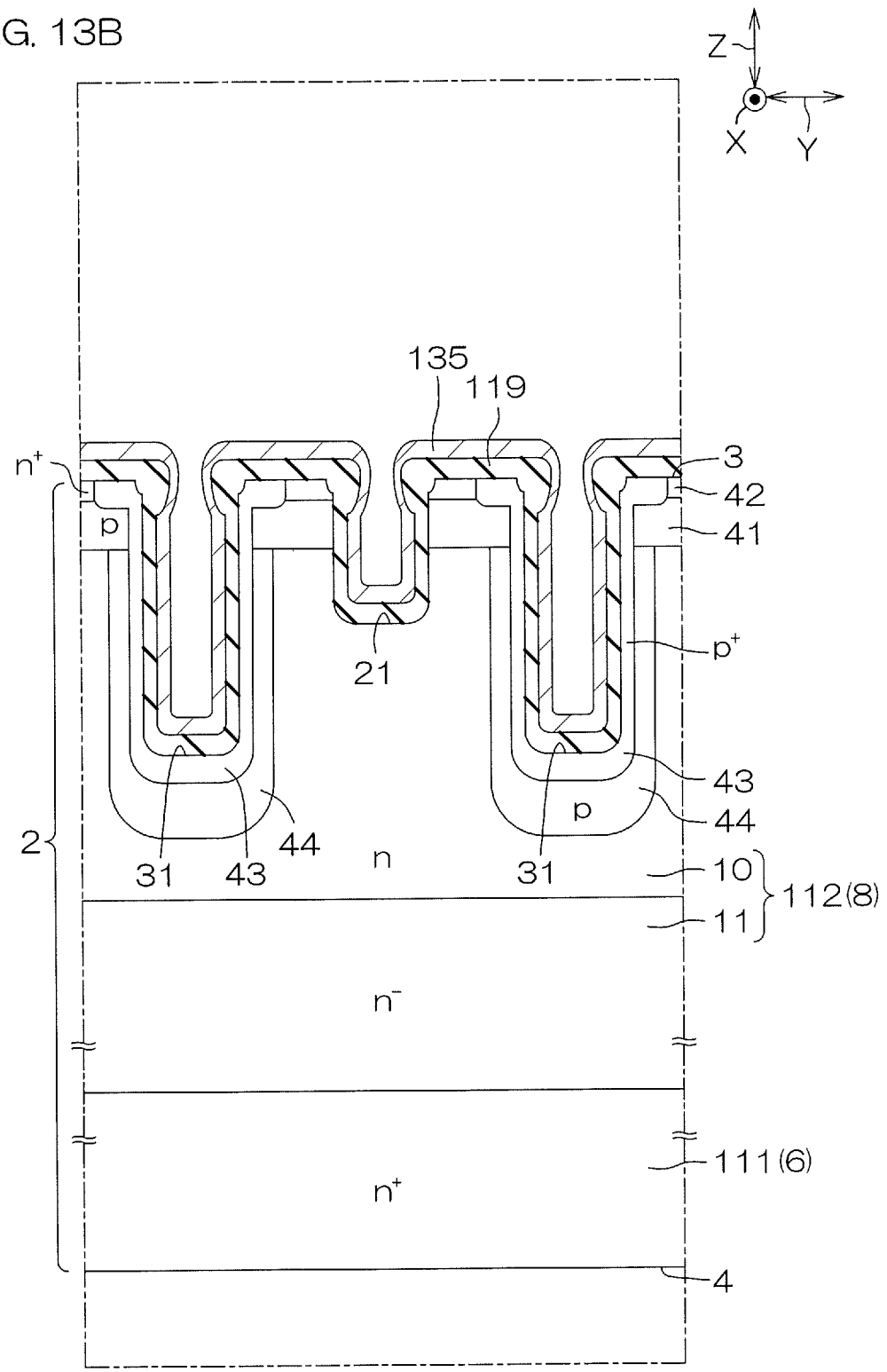
FIG. 13B is an enlarged sectional view of a step after FIG. 13A.

Next, referring to FIG. 13B, a base polysilicon layer 135 that is to be a base of the gate electrodes 23 and the source electrodes 33 is formed on the first main surface 3. The base polysilicon layer 135 is formed as a film along the inner walls of the gate trenches 21, the inner walls of the source trenches 31, and the first main surface 3.

The base polysilicon layer 135 may be formed by a CVD method. The CVD method may be an LP-CVD (low pressure-CVD) method. The base polysilicon layer 135 is constituted of a conductive polysilicon imparted with conductivity by a p-type impurity. The p-type impurity may be doped into the base polysilicon layer 135 at the same time as the CVD method or may be doped separately after the CVD method.

Next, referring to FIG. 13C, unnecessary portions of the base polysilicon layer 135 are removed. The unnecessary portions of the base polysilicon layer 135 are the portions extending in parallel to the first main surface 3. The unnecessary portions of the base polysilicon layer 135 may be removed by an etching method. The etching method is preferably an anisotropic dry etching method. The dry etching method may be an RIE (reactive ion etching) method.

Portions of the base polysilicon layer 135 thereby remain in a state of covering the side walls of the gate trenches 21 and exposing the bottom walls of the gate trenches 21. Also, portions of the base polysilicon layer 135 remain in a state of covering the side walls of the source trenches 31 and exposing the bottom walls of the source trenches 31.

Figure 13D:
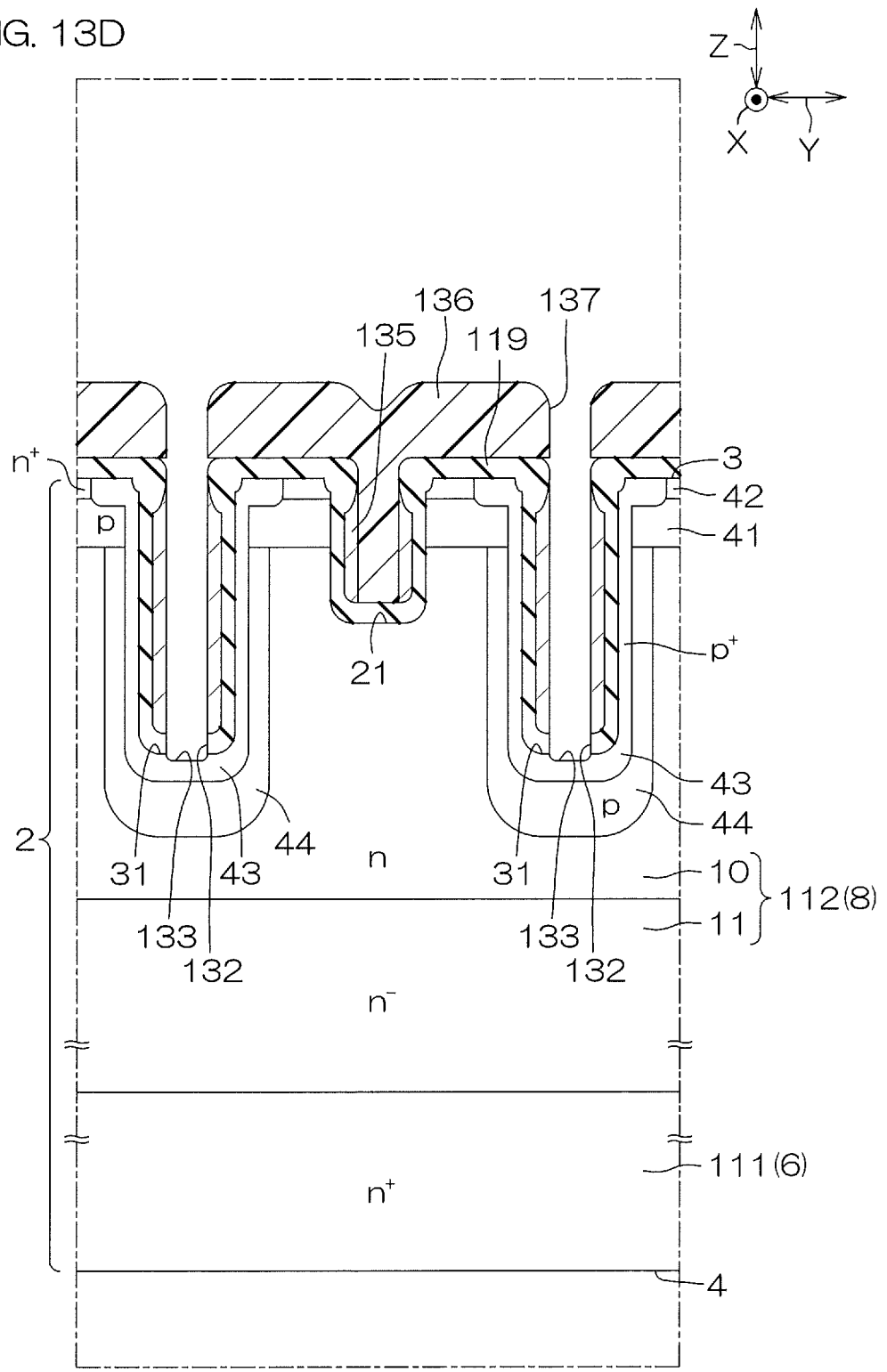
FIG. 13D is an enlarged sectional view of a step after FIG. 13C.

Next, referring to FIG. 13D, a resist mask 136 having a predetermined pattern is formed on the first main surface 3. The resist mask 136 has openings 137 that expose the source trenches 31 and covers regions besides these.

Next, portions of the base insulating layer 119 exposed from the base polysilicon layer 135 inside the source trenches 31 are removed by an etching method via the resist mask 136. The etching method is preferably an anisotropic dry etching method. The dry etching method may be an RIE method.

The bottom wall window portions 132 that expose the bottom walls of the source trenches 31 are thereby formed at portions of the base insulating layer 119 covering the bottom walls of the source trenches 31. In this step, portions of the SiC epitaxial layer 112 exposed from the bottom wall window portions 132 are also removed. The recesses 133 in communication with the bottom wall window portions 132 are thereby formed at the bottom walls of the source trenches 31. The resist mask 136 is thereafter removed.

Figure 13E:
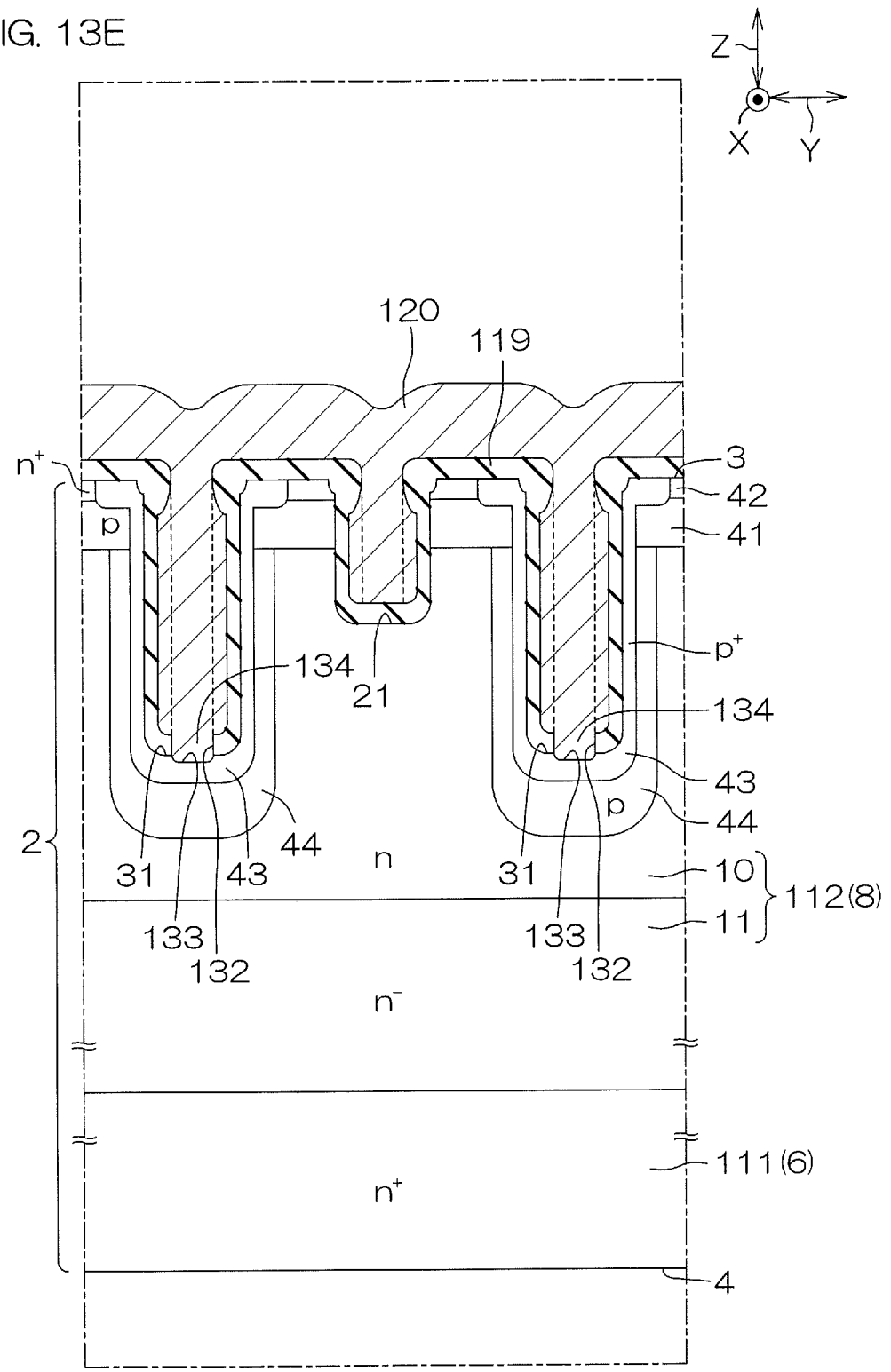
FIG. 13E is an enlarged sectional view of a step after FIG. 13D.

Next, referring to FIG. 13E, the first polysilicon layer 120 that is to be the base of the gate electrodes 23, the gate wiring 28, and the source electrodes 33 is formed on the first main surface 3. The first polysilicon layer 120 fills the gate trenches 21 and the source trenches 31 and covers the first main surface 3. The first polysilicon layer 120 is formed integral to the base polysilicon layer 135 inside the gate trenches 21 and the source trenches 31.

The first polysilicon layer 120 may be formed by a CVD method. The CVD method may be an LP-CVD (low pressure-CVD) method. The first polysilicon layer 120 is constituted of a conductive polysilicon imparted with conductivity by a p-type impurity. The p-type impurity may be doped into the first polysilicon layer 120 at the same time as the CVD method or may be doped separately after the CVD method.

Figure 13F:
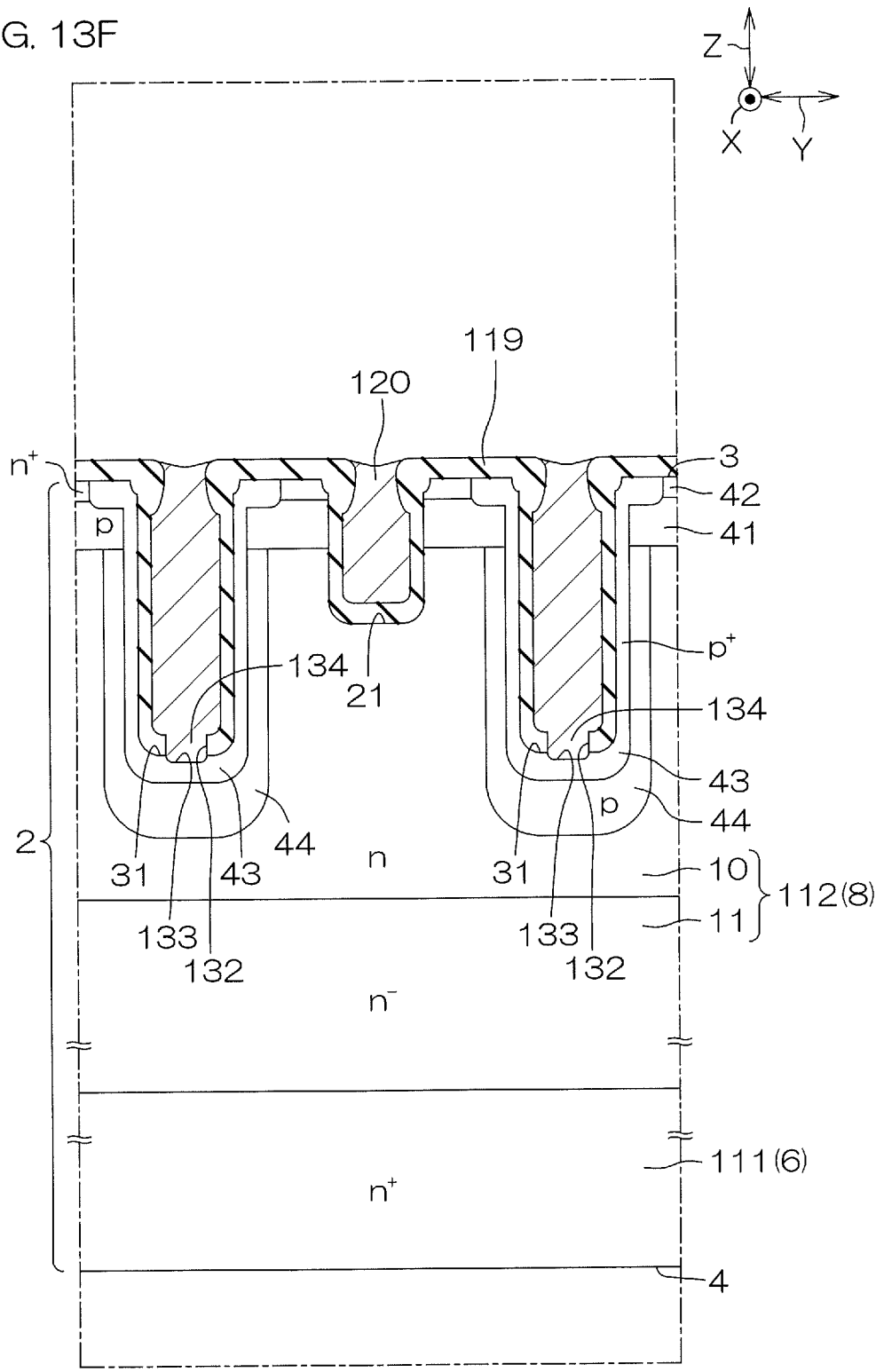
FIG. 13F is an enlarged sectional view of a step after FIG. 13E.

Next, referring to FIG. 13F, unnecessary portions of the first polysilicon layer 120 are removed. The unnecessary portions of the first polysilicon layer 120 are removed until the base insulating layer 119 is exposed. The unnecessary portions of the first polysilicon layer 120 may be removed by an etching method. The etching method may be a wet etching method and/or a dry etching method. The gate electrodes 23, the gate wiring 28, and the source electrodes 33 are thereby formed.

In this step, a portion of the first polysilicon layer 120 remains in a state of being attached to the active side walls 54. The side wall structure 62 that includes the portion of the first polysilicon layer 120 is thereby formed. The side wall structure 62 is formed self-aligningly with respect to the active main surface 51.

Thereafter, the same steps as those of FIG. 11J to FIG. 11S are performed to form the SiC semiconductor device 131.

Figure 14:
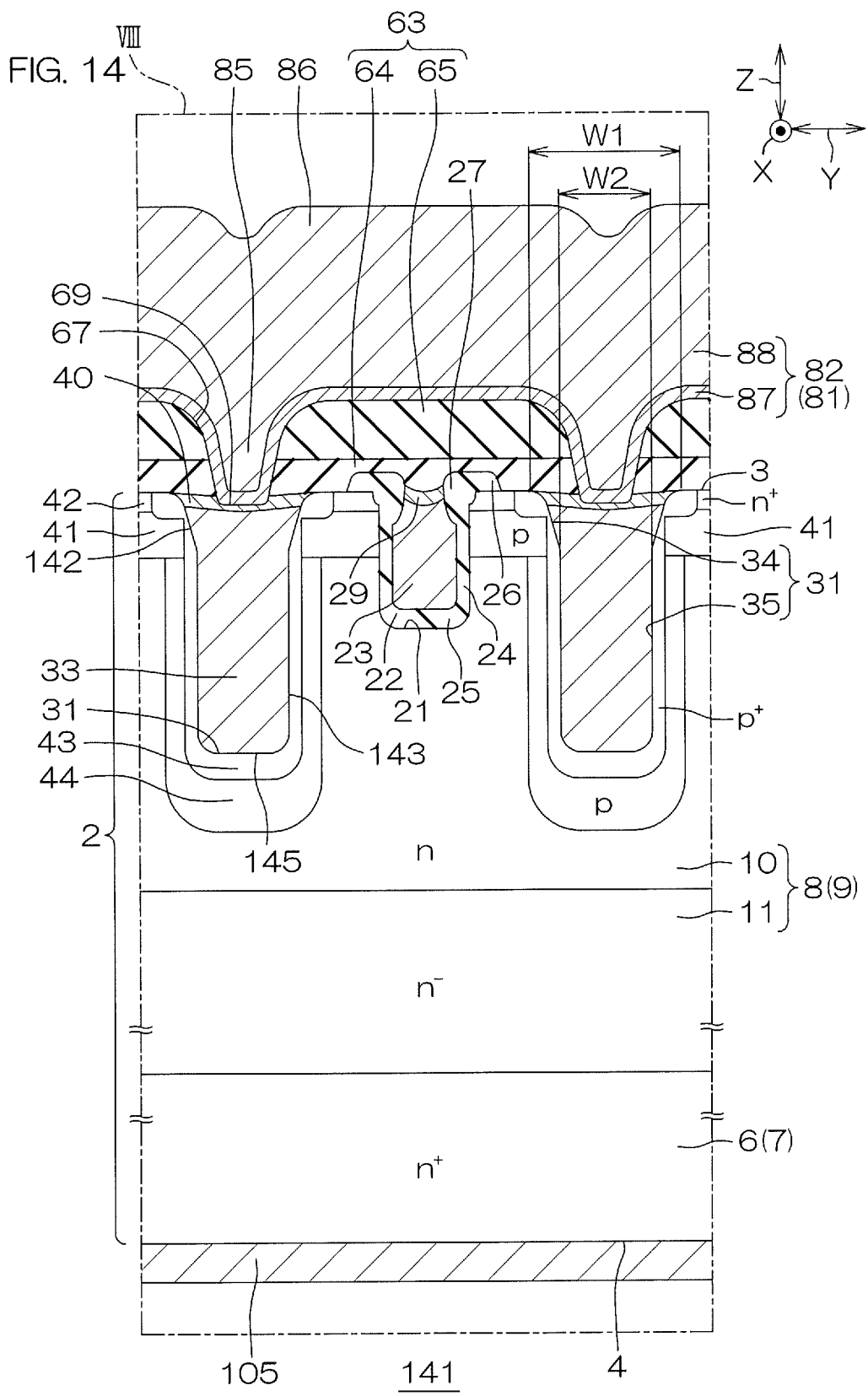
FIG. 14 is an enlarged view of a region corresponding to FIG. 8 and is a diagram partially showing an SiC semiconductor device according to a third preferred embodiment of the present invention.

FIG. 14 is an enlarged view of a region corresponding to FIG. 8 and is a diagram partially showing an SiC semiconductor device 141 according to a third preferred embodiment of the present invention. In the following, structures corresponding to the structures described with respect to the SiC semiconductor device 1 shall be provided with the same reference signs and description thereof shall be omitted.

Referring to FIG. 14, in this embodiment, the trench source structures 30 do not have the source insulating layers 32. The source electrodes 33 each include a first side wall contact portion 142, a second side wall contact portion 143, and a bottom wall contact portion 145 inside the corresponding source trench 31.

The first side wall contact portion 142 contacts the side walls of the first trench portion 34. The second side wall contact portion 143 contacts the side walls of the second trench portion 35. The bottom wall contact portion 145 contacts the bottom wall of the source trench 31. Each contact region 43 is electrically connected to the first side wall contact portion 142, the second side wall contact portion 143, and the bottom wall contact portion 145 of the corresponding source electrode 33.

Each deep well region 44 includes portions that are electrically connected to the first side wall contact portion 142, the second side wall contact portion 143, and the bottom wall contact portion 145 of the corresponding source electrode 33 via the contact regions 43. Each deep well region 44 includes a portion that is electrically connected to the first side wall contact portion 142, the second side wall contact portion 143, and the bottom wall contact portion 145 of the source electrode 33.

With the SiC semiconductor device 141 described above, the same effects as the effects described for the SiC semiconductor device 1 can be exhibited. Also, with the SiC semiconductor device 141, the source electrodes 33 each include the first side wall contact portion 142, the second side wall contact portion 143, and the bottom wall contact portion 145. The contact regions 43 are electrically connected to the first side wall contact portion 142, the second side wall contact portion 143, and the bottom wall contact portion 145 of the source electrode 33.

When a negative drain-source voltage VGS is applied across the source electrodes 33 and the drain electrode 105, the MISFET performs a third quadrant operation. In the third quadrant operation, a forward current flows through the pn junction diode formed by the body region 41 (deep well regions 44). The forward current flows from the source electrodes 33 toward the drain electrode 105 and is thus a reverse current with respect to the MISFET.

The forward current of the pn junction diode flows from the side wall contact portions 39 of the source electrodes 33 into the drift region 8 via the side wall window portions 36 and, at the same time, flows from the bottom wall contact portions 134 of the source electrodes 33 into the drift region 8 via the bottom wall window portions 132. The current paths of the forward current of the pn junction diode are thereby increased and the on resistance can thus be reduced. Consequently, the forward characteristics of the pn junction diode can be improved.

Figure 15A:
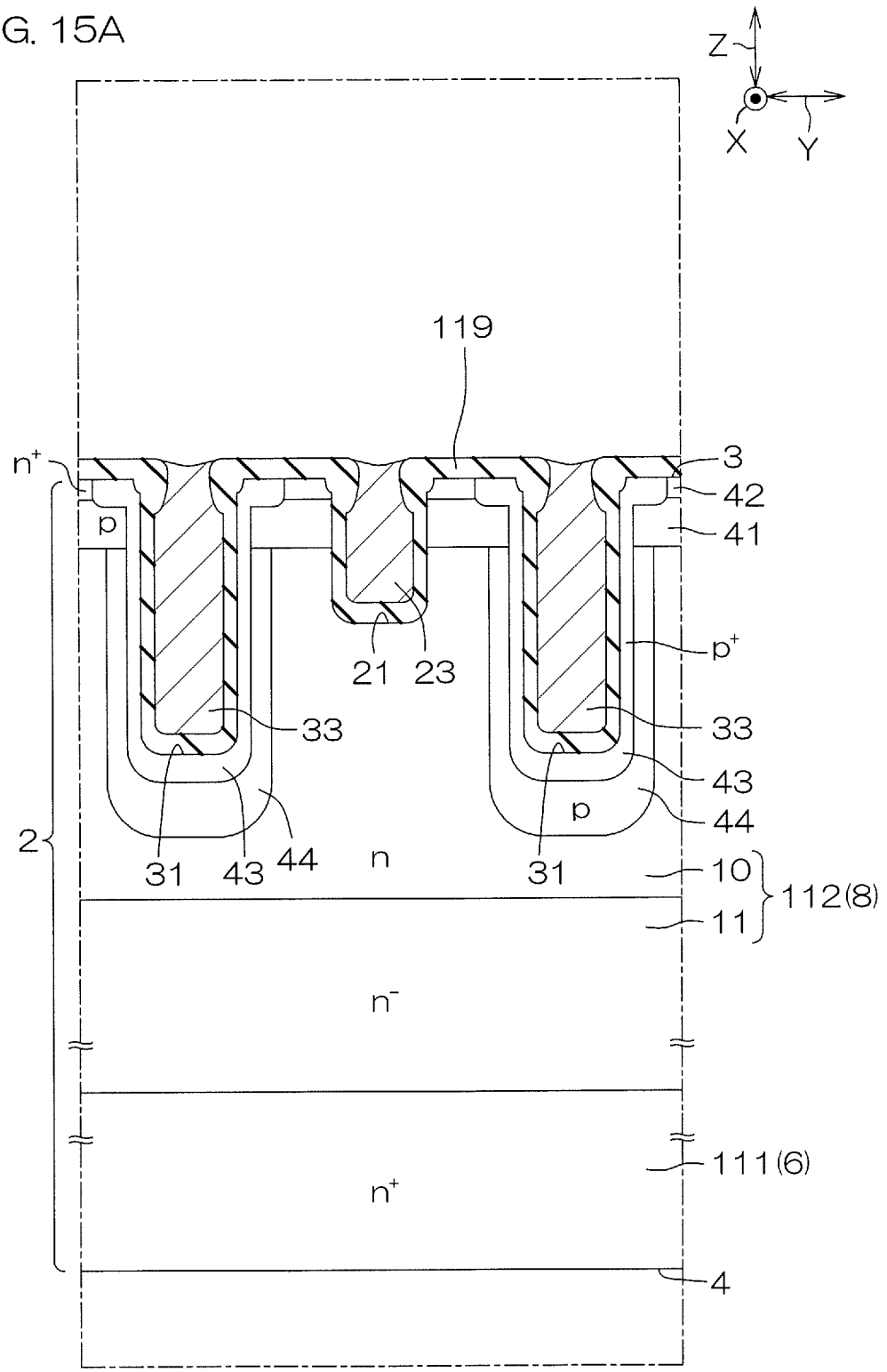
FIG. 15A is an enlarged sectional view of an example of a method for manufacturing the SiC semiconductor device shown in FIG. 14.
Figure 15B:
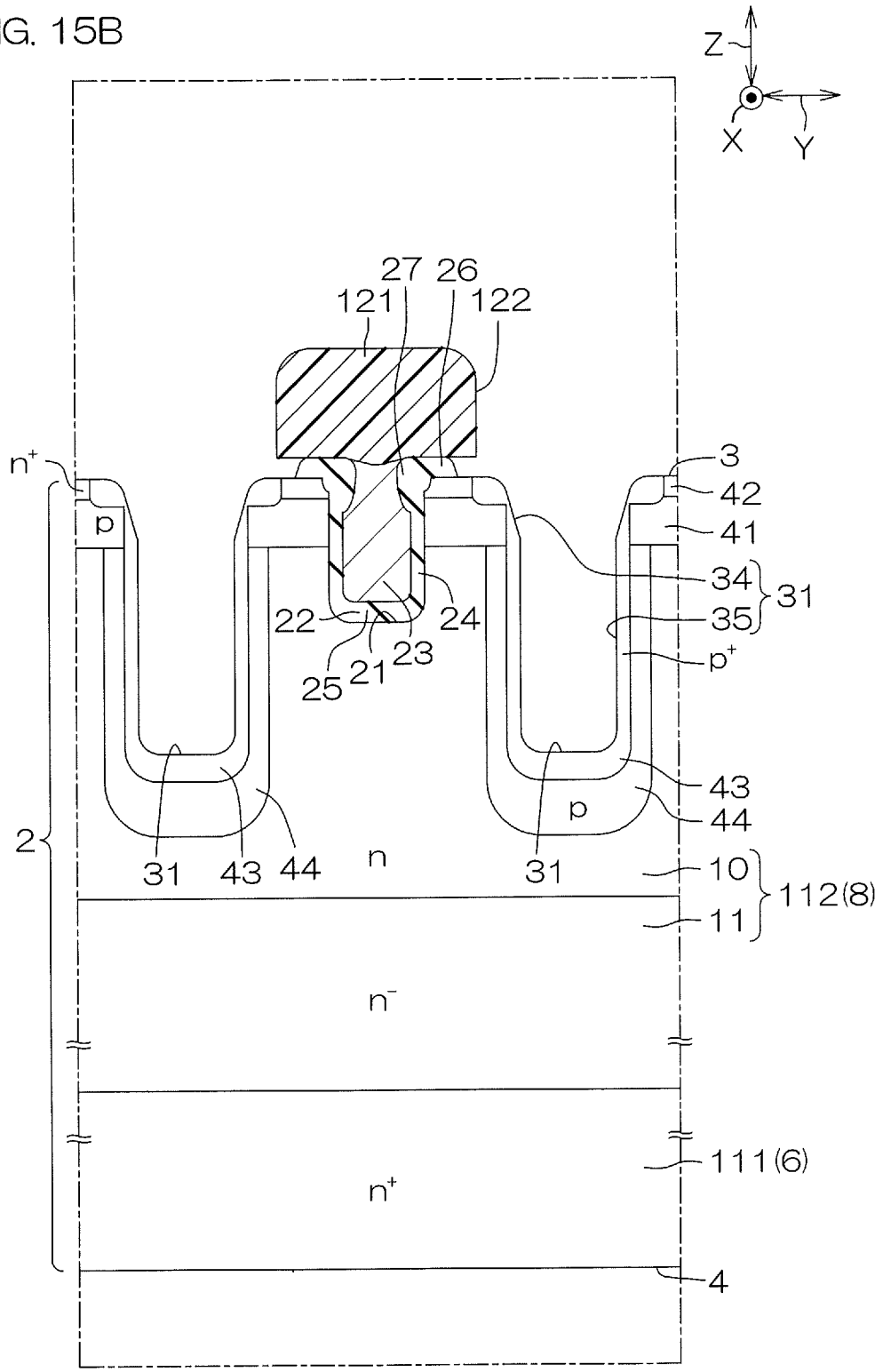
FIG. 15B is an enlarged sectional view of a step after FIG. 15A.

FIG. 15A and FIG. 15B are enlarged sectional views of an example of a method for manufacturing the SiC semiconductor device 141 shown in FIG. 14.

Referring to FIG. 15A, the SiC semiconductor layer 2 in the state where the first polysilicon layer 120 is embedded in the gate trenches 21 and the source trenches 31 is prepared through the steps of FIG. 11A to FIG. 11I.

Next, referring to FIG. 15B, the resist mask 121 having the predetermined pattern is formed on the first main surface 3. The resist mask 121 has openings 122 that expose the source trenches 31, portions of the source regions 42, and the contact regions 43 and covers regions besides these.

Next, entireties of portions of the first polysilicon layer 120 that are embedded in the source trenches 31 are removed by an etching method via the resist mask 121. In this step, entireties of the source insulating layers 32 are also removed. Also in this step, portions of the SiC epitaxial layer 112 are also removed. The source trenches 31 each having the first trench portion 34 and the second trench portion 35 are thereby formed.

Thereafter, the same steps as those of FIG. 11K to FIG. 11S are performed to form the SiC semiconductor device 141.

FIG. 16 is an enlarged view of a region corresponding to FIG. 8 and is a diagram partially showing an SiC semiconductor device 151 according to a fourth preferred embodiment of the present invention. In the following, structures corresponding to the structures described with respect to the SiC semiconductor device 1 shall be provided with the same reference signs and description thereof shall be omitted.

In this embodiment, the source pad 82 includes the source connection electrodes 85 and the source covering electrode 86 that are formed integrally of the same metal material. On the other hand, referring to FIG. 16, the source pad 82 according to the SiC semiconductor device 151 includes the source connection electrodes 85 and the source covering electrode 86 that are formed as separate bodies of mutually different metal materials.

Specifically, each source connection electrode 85 is constituted of a plug electrode 152. The plug electrode 152 is specifically constituted of a tungsten plug electrode that includes a barrier layer 153 and a tungsten layer 154 that are laminated in that order from the source hole 67 side.

The barrier layer 153 is formed as a film along an inner wall of the source hole 67 and an electrode surface of the corresponding source electrode 33. The barrier layer 153 demarcates a recess space inside the source hole 67. The barrier layer 153 preferably has a laminated structure including a Ti layer and a TiN layer that are laminated in that order from the inner wall side of the source hole 67. The barrier layer 153 may have a single layer structure constituted of a Ti layer or a TiN layer. The tungsten layer 154 is embedded in the source hole 67 across the barrier layer 153.

The source covering electrode 86 has a laminated structure including the second barrier layer 87 and the second main body layer 88. The source covering electrode 86 covers the interlayer insulating layer 63 and the source connection electrodes 85. The source covering electrode 86 is electrically connected to the source electrodes 33 via the source connection electrodes 85.

With the SiC semiconductor device 151 described above, the same effects as the effects described for the SiC semiconductor device 1 can be exhibited. Also, with the SiC semiconductor device 151, the source connection electrodes 85 that are constituted of the plug electrodes 152 are embedded in the source holes 67. Thereby, the opening width of the source holes 67 can be narrowed and, at the same time, the source connection electrodes 85 can be embedded appropriately in the source holes 67 of narrow width. The source connection electrodes 85 can thus be connected appropriately to the source electrodes 33. The structure of the SiC semiconductor device 151 can also be applied to the SiC semiconductor device 131 according to the second preferred embodiment and to the SiC semiconductor device 141 according to the third preferred embodiment.

The preferred embodiments of the present invention may be implemented in yet other embodiments.

With each of the preferred embodiments described above, an example where the first low resistance layer 29 and the second low resistance layers 40 are formed was described. However, a structure where one of either or both of the first low resistance layer 29 and the second low resistance layers 40 is or are not formed may be adopted.

With each of the preferred embodiments described above, an example where the gate electrodes 23 and the gate wiring 28 that include a p-type polysilicon doped with a p-type impurity are formed was described. However, if increase in the gate threshold voltage Vth is not emphasized, the gate electrodes 23 and the gate wiring 28 may include an n-type polysilicon doped with a n-type impurity in place of the p-type polysilicon.

In this case, the first low resistance layer 29 may be formed by siliciding, by a metal material, portions of the gate electrodes 23 (n-type polysilicon) that form surface layer portions. That is, the first low resistance layer 29 may include an n-type polycide. In case of such a structure, gate resistance can be reduced. Obviously, the first low resistance layer 29 does not have to be formed.

With each of the preferred embodiments described above, an example where the source electrodes 33 that include a p-type polysilicon doped with a p-type impurity are formed was described. However, an n-type polysilicon doped with a n-type impurity may be included in place of the p-type polysilicon.

In this case, the second low resistance layers 40 may be formed by siliciding, by a metal material, portions of the source electrodes 33 (n-type polysilicon) that form surface layer portions. That is, the second low resistance layers 40 may include an n-type polycide. Obviously, the second low resistance layers 40 do not have to be formed.

With each of the preferred embodiments described above, an example where the source electrodes 33 that include a p-type polysilicon doped with a p-type impurity are formed was described. However, the source electrodes 33 each constituted of a laminated structure of a p-type polysilicon and an n-type polysilicon may be formed by forming the first polysilicon layer 120 constituted of a p-type and forming the second polysilicon layer 123 constituted of an n-type.

In this case, the second low resistance layers 40 may be formed by siliciding, by a metal material, portions of the source electrodes 33 (n-type polysilicon) that form surface layer portions. That is, the second low resistance layers 40 may include an n-type polycide. Obviously, the second low resistance layers 40 do not have to be formed.

With each of the preferred embodiments described above, an example where the insulating layer 91 has the laminated structure that includes the passivation layer 94 and the resin layer 95 was described. However, the insulating layer 91 may have a single layer structure constituted of the passivation layer 94 or the resin layer 95.

With each of the preferred embodiments described above, an example where the first direction X is the m-axis direction ([1-100] direction) of the SiC monocrystal and the second direction Y is the a-axis direction ([11-20] direction) of the SiC monocrystal was described. However, an embodiment where the first direction X is the a-axis direction ([11-20]

direction) of the SiC monocrystal and the second direction Y is the m-axis direction ([1-100] direction) of the SiC monocrystal may be adopted.

With each of the preferred embodiments described above, an example where a MISFET is formed as an example of an insulated gate type transistor was described. However, an p+-type collector region may be adopted in place of the n+-type drain region 6. With this structure, an IGBT (insulated gate bipolar transistor) can be provided in place of a MISFET. In this case, in each of the preferred embodiments described above, the "source" of the MISFET is replaced by an "emitter" of the IGBT and the "drain" of the MISFET is replaced by a "collector" of the IGBT.

In each of the preferred embodiments described above, a structure with which the conductivity types of the respective semiconductor portions are inverted may be adopted. That is, a p-type portion may be made to be of an n-type and an n-type portion may be made to be of a p-type.

With each of the preferred embodiments described above, an example including the SiC semiconductor layer 2 constituted of an SiC monocrystal was described. However, in each of the preferred embodiments described above, an Si semiconductor layer constituted of an Si monocrystal may be adopted in place of the SiC semiconductor layer 2.

The present application corresponds to Japanese Patent Application No. 2019-096289 filed on May 22, 2019 in the Japan Patent Office, and the entire disclosure of this applications is incorporated herein by reference.

While preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST

1 SiC semiconductor device
2 SiC semiconductor layer
3 first main surface
21 gate trench
22 gate insulating layer
23 gate electrode
31 source trench
32 source insulating layer
33 source electrode
34 first trench portion
35 second trench portion
36 side wall window portion
39 side wall contact portion
41 body region
42 source region
43 contact region
44 deep well region
67 source hole
69 recess
85 source connection electrode
91 insulating layer
131 SiC semiconductor device
132 bottom wall window portion
134 bottom wall contact portion
151 SiC semiconductor device
D1 first depth of gate trench
D2 second depth of source trench
W1 first width of first trench portion
W2 second width of second trench portion

The invention claimed is:

1. A (silicon carbide) SiC semiconductor device comprising:
an SiC semiconductor layer of a first conductivity type having a main surface;
a source trench formed in the main surface and having a side wall and a bottom wall;
a source electrode embedded in the source trench and having a side wall contact portion in contact with a region of the side wall of the source trench at an opening side of the source trench;
a body region of a second conductivity type formed in a region of a surface layer portion of the main surface along the source trench;
a source region of the first conductivity type electrically connected to the side wall contact portion of the source electrode in a surface layer portion of the body region;
an insulating layer that covers the source region on the main surface;
a source hole formed in the insulating layer and exposing the source electrode; and
a source connection electrode embedded in the source hole and connected to the source electrode, wherein
the source hole exposes only the source electrode and
the source connection electrode is connected to only the source electrode within the source hole.

2. The SiC semiconductor device according to claim 1, wherein
the insulating layer covers the side wall contact portion of the source electrode on the main surface.

3. The SiC semiconductor device according to claim 1, wherein
the insulating layer covers an entire area of the source region in sectional view.

4. The SiC semiconductor device according to claim 1, wherein
the insulating layer covers an entire area of the source region in plan view.

5. The SiC semiconductor device according to claim 1, wherein
the source connection electrode includes a conductive material differing from the source electrode.

6. A (silicon carbide) SiC semiconductor device comprising:
an SiC semiconductor layer of a first conductivity type having a main surface;
a source trench formed in the main surface and having a side wall and a bottom wall;
a source electrode embedded in the source trench and having a side wall contact portion in contact with a region of the side wall of the source trench at an opening side of the source trench;
a body region of a second conductivity type formed in a region of a surface layer portion of the main surface along the source trench;
a source region of the first conductivity type electrically connected to the side wall contact portion of the source electrode in a surface layer portion of the body region;
an insulating layer that covers the source region on the main surface;
a source hole formed in the insulating layer and exposing the source electrode; and
a source connection electrode embedded in the source hole and connected to the source electrode, wherein
the source electrode includes an electrode surface having a recess recessed toward the bottom wall of the source trench and the source hole is in communication with the recess of the source electrode.

7. A (silicon carbide) SiC semiconductor device comprising:
   an SiC semiconductor layer of a first conductivity type having a main surface;
   a source trench formed in the main surface and having a side wall and a bottom wall;
   a source electrode embedded in the source trench and having a side wall contact portion in contact with a region of the side wall of the source trench at an opening side of the source trench;
   a body region of a second conductivity type formed in a region of a surface layer portion of the main surface along the source trench;
   a source region of the first conductivity type electrically connected to the side wall contact portion of the source electrode in a surface layer portion of the body region; and
   a contact region of the second conductivity type interposed between the source region and the side wall contact portion of the source electrode such as to be electrically connected to the side wall contact portion of the source electrode in the surface layer portion of the body region and having a second conductivity type impurity concentration exceeding a second conductivity type impurity concentration of the body region.

8. The SiC semiconductor device according to claim 7, wherein
   a plurality of the contact regions are formed at intervals along the source trench.

9. The SiC semiconductor device according to claim 7, wherein
   the contact region is interposed between the body region and the side wall contact portion of the source electrode.

10. The SiC semiconductor device according to claim 7, wherein
    the contact region covers the side wall and the bottom wall of the source trench.

11. The SiC semiconductor device according to claim 7, further comprising:
    a deep well region of the second conductivity type formed along the source trench in a region below the body region in a surface layer portion of the main surface and having a second conductivity type impurity concentration less than the second conductivity type impurity concentration of the contact region.

12. The SiC semiconductor device according to claim 11, wherein
    the deep well region covers the side wall and the bottom wall of the source trench.

13. A (silicon carbide) SiC semiconductor device comprising:
    an SiC semiconductor layer of a first conductivity type having a main surface;
    a source trench formed in the main surface and having a side wall and a bottom wall;
    a source electrode embedded in the source trench and having a side wall contact portion in contact with a region of the side wall of the source trench at an opening side of the source trench;
    a body region of a second conductivity type formed in a region of a surface layer portion of the main surface along the source trench;
    a source region of the first conductivity type electrically connected to the side wall contact portion of the source electrode in a surface layer portion of the body region; and
    a source insulating layer having a side wall window portion exposing the side wall of the source trench in a region at the opening side of the source trench and covering the side wall and the bottom wall of the source trench, and
    wherein the side wall contact portion of the source electrode contacts the side wall of the source trench exposed from the side wall window portion.

14. The SiC semiconductor device according to claim 13, wherein
    the body region is electrically connected to the side wall contact portion of the source electrode.

15. The SiC semiconductor device according to claim 13, wherein
    the source electrode is constituted of a conductive material other than a metal material.

16. The SiC semiconductor device according to claim 13, wherein
    the source electrode is constituted of a conductive polysilicon.

17. The SiC semiconductor device according to claim 13, wherein
    the source electrode is constituted of a p-type conductive polysilicon.

18. The SiC semiconductor device according to claim 13, wherein
    the source trench includes a first trench portion formed with a first width at the opening side, and a second trench formed with a second width less than the first width at the bottom wall side and
    the side wall contact portion of the source electrode is exposed from the first trench portion.

19. The SiC semiconductor device according to claim 13, further comprising:
    a gate trench formed in the main surface;
    a gate insulating layer formed on an inner wall of the gate trench; and
    a gate electrode embedded in the gate trench across the gate insulating layer.

20. The SiC semiconductor device according to claim 19, wherein
    the gate trench has a first depth and
    the source trench has a second depth exceeding the first depth.

21. A (silicon carbide) SiC semiconductor device comprising:
    an SiC semiconductor layer of a first conductivity type having a main surface;
    a source trench formed in the main surface and having a side wall and a bottom wall;
    a source electrode embedded in the source trench and having a side wall contact portion in contact with a region of the side wall of the source trench at an opening side of the source trench;
    a body region of a second conductivity type formed in a region of a surface layer portion of the main surface along the source trench;
    a source region of the first conductivity type electrically connected to the side wall contact portion of the source electrode in a surface layer portion of the body region; and
    a source insulating layer having a side wall window portion exposing a region at the opening side of the source trench at the side wall of the source trench and a bottom wall window portion exposing the bottom wall of the source trench and covering at least the side wall of the source trench, wherein
the source electrode is embedded in the source trench across the source insulating layer and has the side wall contact portion in contact with the side wall of the source trench exposed from the side wall window portion and a bottom wall contact portion in contact with the bottom wall of the source trench exposed from the bottom wall window portion.

* * * * *